(12) United States Patent
Kim et al.

(10) Patent No.: US 12,396,174 B2
(45) Date of Patent: Aug. 19, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Junhyoung Kim, Seoul (KR); Seungmin Lee, Seoul (KR); Sangbeom Han, Seoul (KR); Joonsung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 394 days.

(21) Appl. No.: 17/968,058

(22) Filed: Oct. 18, 2022

(65) Prior Publication Data
US 2023/0125995 A1   Apr. 27, 2023

(30) Foreign Application Priority Data
Oct. 22, 2021   (KR) .................. 10-2021-0141956

(51) Int. Cl.
| H10B 43/40 | (2023.01) |
| H01L 23/528 | (2006.01) |
| H10B 41/10 | (2023.01) |
| H10B 41/20 | (2023.01) |
| H10B 41/35 | (2023.01) |

(Continued)

(52) U.S. Cl.
CPC ......... *H10B 43/40* (2023.02); *H01L 23/5283* (2013.01); *H10B 41/10* (2023.02);
(Continued)

(58) Field of Classification Search
CPC ........ H10B 43/40; H10B 41/10; H10B 41/20; H10B 41/35; H10B 41/40; H10B 43/10;
(Continued)

(56) References Cited

U.S. PATENT DOCUMENTS

| 8,847,302 B2 | 9/2014 | Alsmeier et al. |
| 8,906,805 B2 | 12/2014 | Park et al. |

(Continued)

FOREIGN PATENT DOCUMENTS

| KR | 1020190092807 A | 8/2019 |
| KR | 1020190122372 A | 10/2019 |

(Continued)

*Primary Examiner* — Allison Bernstein
(74) *Attorney, Agent, or Firm* — Muir Patent Law, PLLC

(57) ABSTRACT

A semiconductor device includes a stack structure including a gate stack region and dummy stack region. The gate stack region includes interlayer insulating layers and gate electrodes alternately stacked. The dummy stack region includes dummy insulating layers and dummy horizontal layers alternately stacked. A separation structure penetrates the stack structure. A vertical memory structure penetrates the gate stack region in a first region. A plurality of gate contact structures electrically connect to the gate electrodes in a second region. The gate electrodes include a first gate electrode and a second gate electrode disposed on a level higher than the first gate electrode. Each of the gate contact structures includes a gate contact plug and a first insulating spacer. The gate contact plugs include a first gate contact plug penetrating the second gate electrode and contacting the first gate electrode, and a second gate contact plug contacting the second gate electrode.

20 Claims, 52 Drawing Sheets

(51) Int. Cl.
*H10B 41/40* (2023.01)
*H10B 43/10* (2023.01)
*H10B 43/20* (2023.01)
*H10B 43/35* (2023.01)

(52) U.S. Cl.
CPC ............. *H10B 41/20* (2023.02); *H10B 41/35* (2023.02); *H10B 41/40* (2023.02); *H10B 43/10* (2023.02); *H10B 43/20* (2023.02); *H10B 43/35* (2023.02)

(58) Field of Classification Search
CPC ........ H10B 43/20; H10B 43/35; H10B 43/50; H10B 43/27; H01L 23/5283
See application file for complete search history.

(56) References Cited

U.S. PATENT DOCUMENTS

| | | | |
|---|---|---|---|
| 9,337,207 | B2 | 5/2016 | Park et al. |
| 9,401,309 | B2 | 7/2016 | Izumi et al. |
| 9,412,753 | B2 | 8/2016 | Izumi et al. |
| 9,431,336 | B2 | 8/2016 | Lim |
| 9,577,085 | B2 | 2/2017 | Lee |
| 10,199,387 | B2 | 2/2019 | Hishida et al. |
| 10,608,013 | B1 | 3/2020 | Xiao |
| 11,342,286 | B2 * | 5/2022 | Kaminaga ............. H10B 43/10 |
| 11,437,396 | B2 | 9/2022 | Kim et al. |
| 11,610,905 | B2 * | 3/2023 | Inden .................... H10B 41/35 |
| 11,792,982 | B2 * | 10/2023 | Yang ..................... H10B 43/40 |
| 11,963,351 | B2 * | 4/2024 | Lee ........................ H10B 41/10 |
| 2016/0260731 | A1 | 9/2016 | Nagai et al. |
| 2024/0130122 | A1 * | 4/2024 | Lee ........................ H10B 43/50 |

FOREIGN PATENT DOCUMENTS

| | | |
|---|---|---|
| KR | 1020210032920 A | 3/2021 |
| KR | 1020210121335 A | 10/2021 |
| TW | 202205637 A | 2/2022 |

* cited by examiner

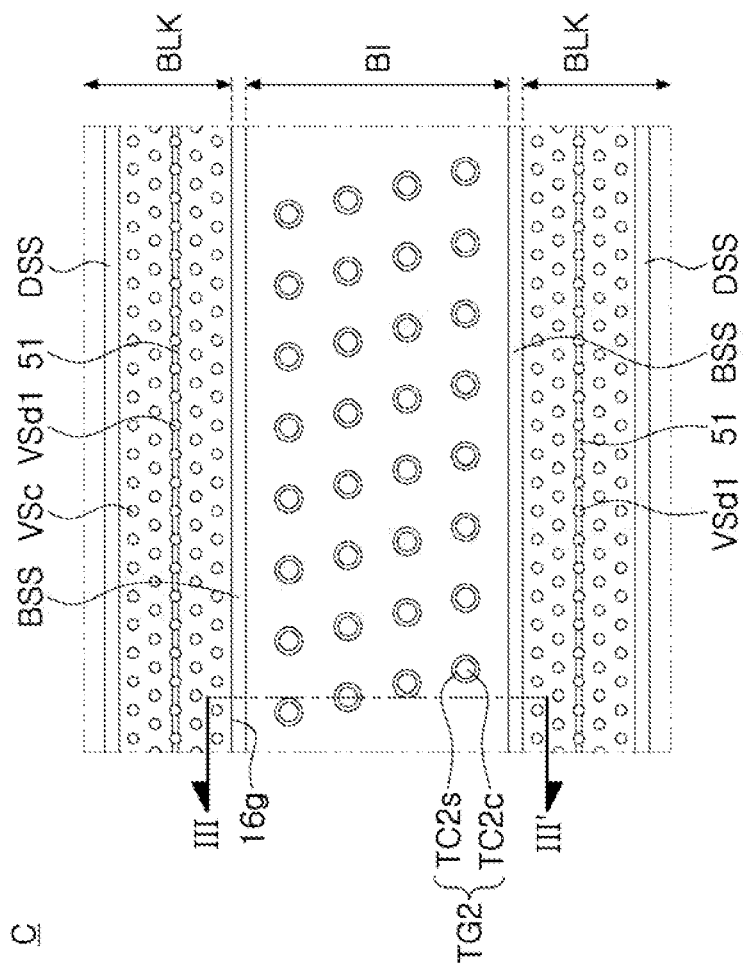

SEMICONDUCTOR DEVICE AND DATA STORAGE SYSTEM INCLUDING THE SAME

CROSS TO REFERENCE TO RELATED APPLICATION

This application claims benefit of priority to Korean Patent Application No. 10-2021-0141956 filed on Oct. 22, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

There has been demand for a semiconductor device which may store high-capacity data in a data storage system. As a method of increasing data storage capacity of a semiconductor device, a semiconductor device may include memory cells arranged three-dimensionally.

SUMMARY

According to an embodiment, a semiconductor device includes a stack structure including a gate stack region and dummy stack region, wherein the gate stack region includes a plurality of interlayer insulating layers and a plurality of gate electrodes alternately stacked, and the dummy stack region includes dummy insulating layers and dummy horizontal layers alternately stacked; a separation structure penetrating through the stack structure, surrounding an entire external side surface of the gate stack region, and having a shape of a closed loop; a vertical memory structure penetrating through the gate stack region in a first region; and a plurality of gate contact structures electrically connected to the plurality of gate electrodes in a second region adjacent to the first region. The plurality of gate electrodes include a first gate electrode and a second gate electrode disposed on a level higher than a level of the first gate electrode. Each of the plurality of gate contact structures includes a gate contact plug and a first insulating spacer surrounding a side surface of the gate contact plug. The plurality of gate contact plugs of the plurality of gate contact structures include a first gate contact plug penetrating through the second gate electrode and in contact with the first gate electrode, and a second gate contact plug in contact with the second gate electrode and on a level higher than a level of the first gate electrode.

According to an embodiment, a semiconductor device includes a plurality of memory mats, wherein each of the plurality of memory mats includes a plurality of memory blocks; a dummy stack region surrounding the plurality of memory mats; and a block separation structure including a shape of a closed loop surrounding a side surface of each of the plurality of memory blocks. Each of the plurality of memory blocks has a memory cell array region and a gate connection region disposed on at least one side of the memory cell array region. Each of the plurality of memory blocks includes a gate stack region including a plurality of gate electrodes stacked and spaced apart from each other in a vertical direction, vertical memory structures penetrating through the gate stack region in the memory cell array region, and a plurality of gate contact structures in contact with the plurality of gate electrodes in the gate connection region. The plurality of gate electrodes include a first word line and a second word line disposed on a level higher than a level of the first word line. Each of the plurality of gate contact structures includes a gate contact plug and a first insulating spacer surrounding a side surface of the gate contact plug. The plurality of gate contact plugs of the plurality of gate contact structures include a first gate contact plug penetrating through the second word line and in contact with the first word line, and a second gate contact plug disposed on a level higher than a level of the first word line and in contact with the second word line.

According to an embodiment, a data storage system includes a semiconductor device including an input/output pattern; and a controller electrically connected to the semiconductor device through the input/output pattern and controlling the semiconductor device. The semiconductor device includes a plurality of memory mats, wherein each of the plurality of memory mats includes a plurality of memory blocks; a dummy stack region surrounding the plurality of memory mats; and a block separation structure including a shape of a closed loop surrounding a side surface of each of the plurality of memory block. Each of the plurality of memory blocks has a memory cell array region and a gate connection region disposed on at least one side of the memory cell array region. Each of the plurality of memory blocks includes a gate stack region including a plurality of gate electrodes stacked and spaced apart from each other in a vertical direction, vertical memory structures penetrating through the gate stack region in the memory cell array region, and a plurality of gate contact structures in contact with the plurality of gate electrodes in the gate connection region. The plurality of gate electrodes include a first word line and a second word line disposed on a level higher than a level of the first word line. Each of the plurality of gate contact structures includes a gate contact plug and a first insulating spacer surrounding a side surface of the gate contact plug. The plurality of gate contact plugs of the plurality of gate contact structures include a first gate contact plug and a second gate contact plug. The first gate contact plug penetrates through the second word line and contacting the first word line. The second gate contact plug is at a higher level than the first word line and contacts the second word line.

BRIEF DESCRIPTION OF DRAWINGS

Features will become apparent to those of skill in the art by describing in detail example embodiments with reference to the attached drawings in which:

FIGS. 1 to 6B are diagrams illustrating a semiconductor device according to an example embodiment;

DETAILED DESCRIPTION

An example of a semiconductor device will now be described, referring to FIGS. 1 to 6B.

Figure 1:
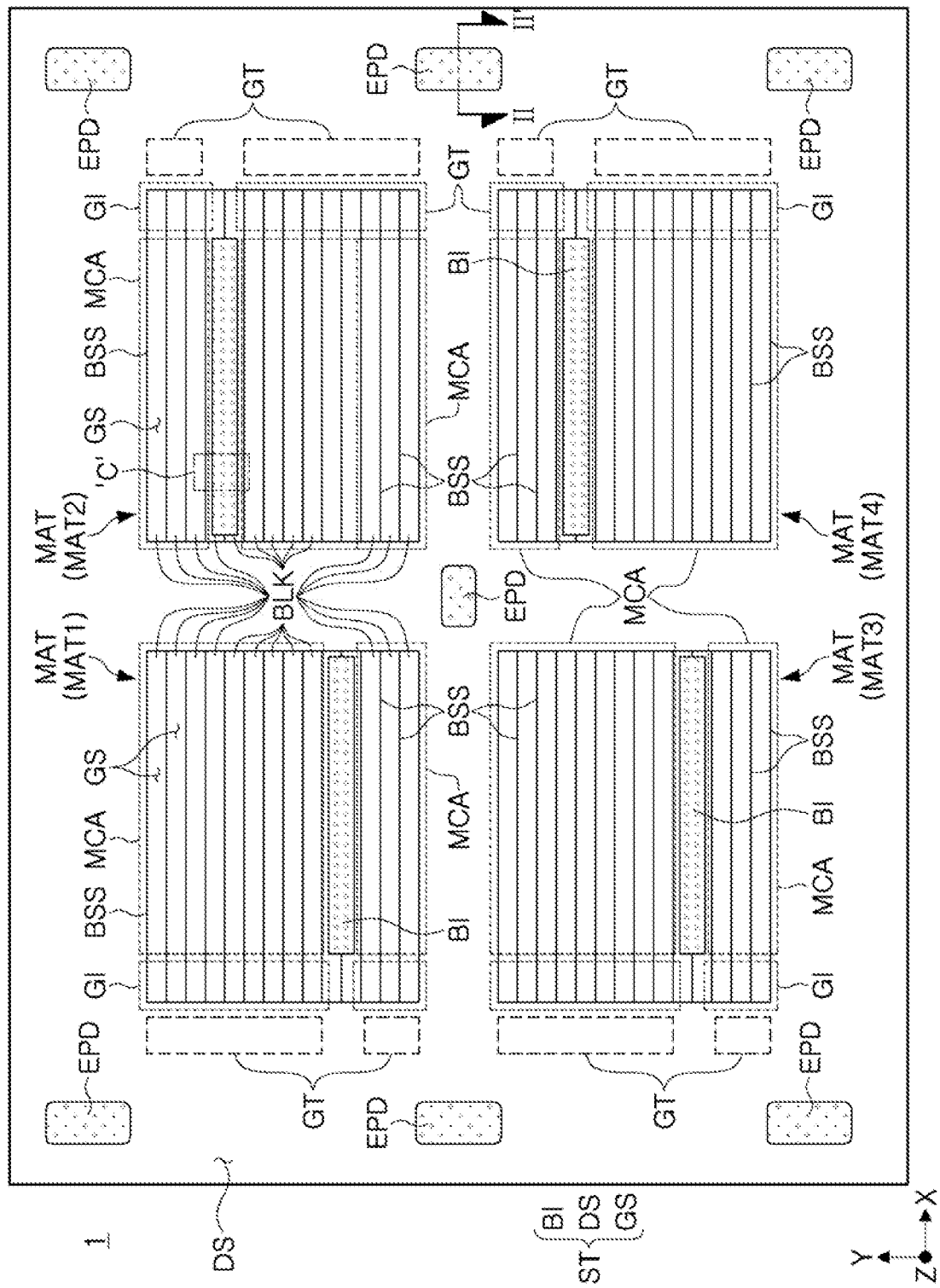
Figure 2A:
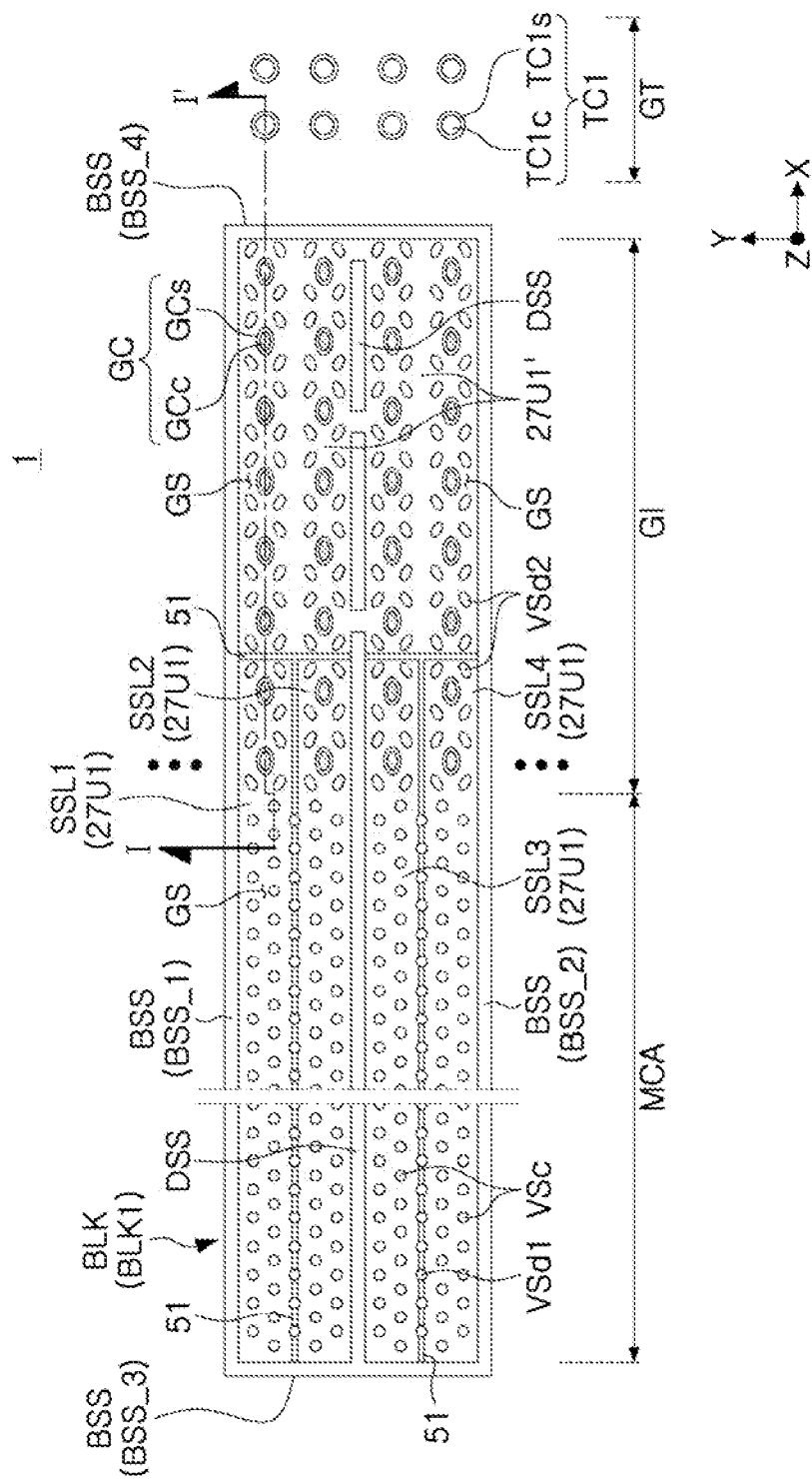
Figure 2B:
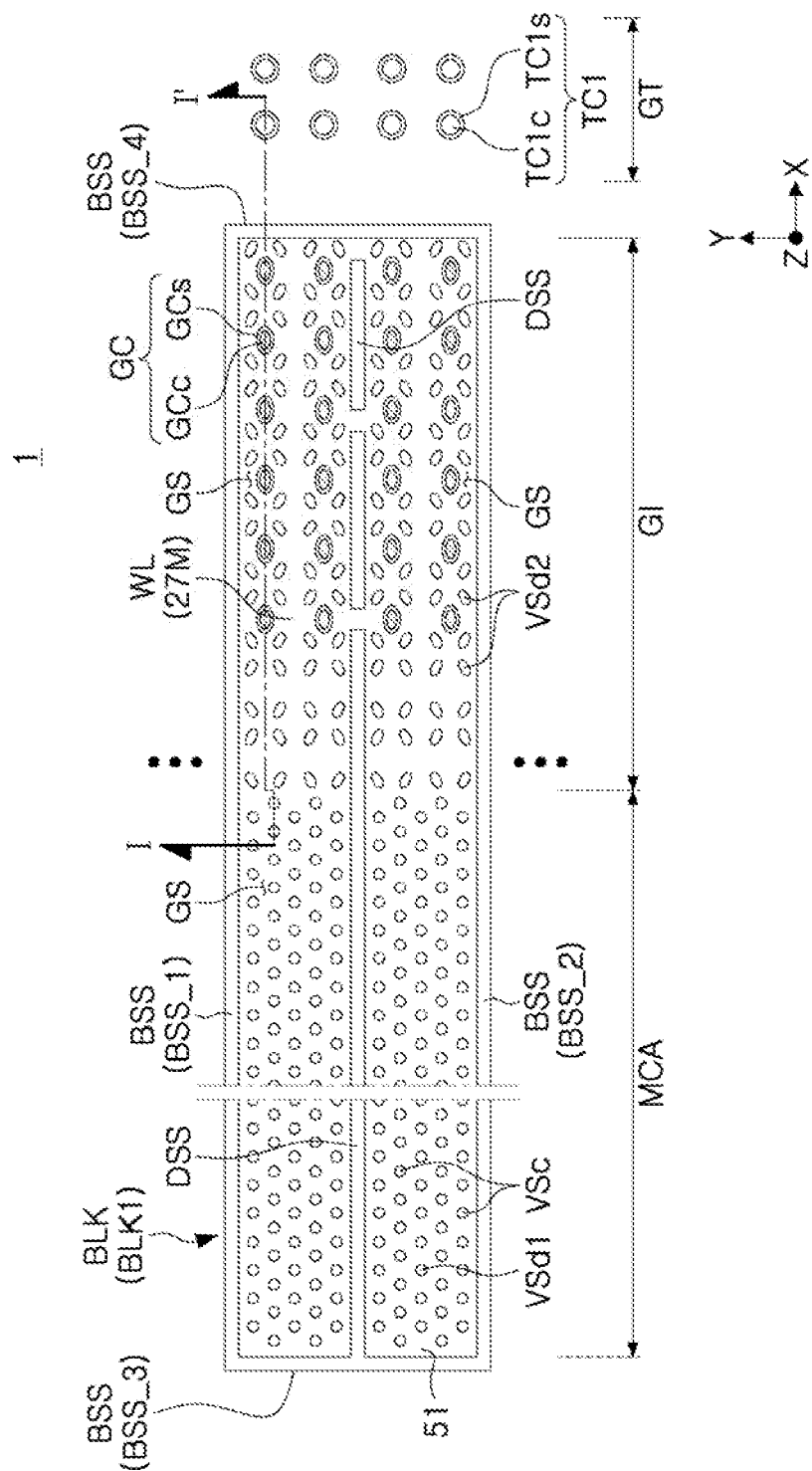
Figure 2C:
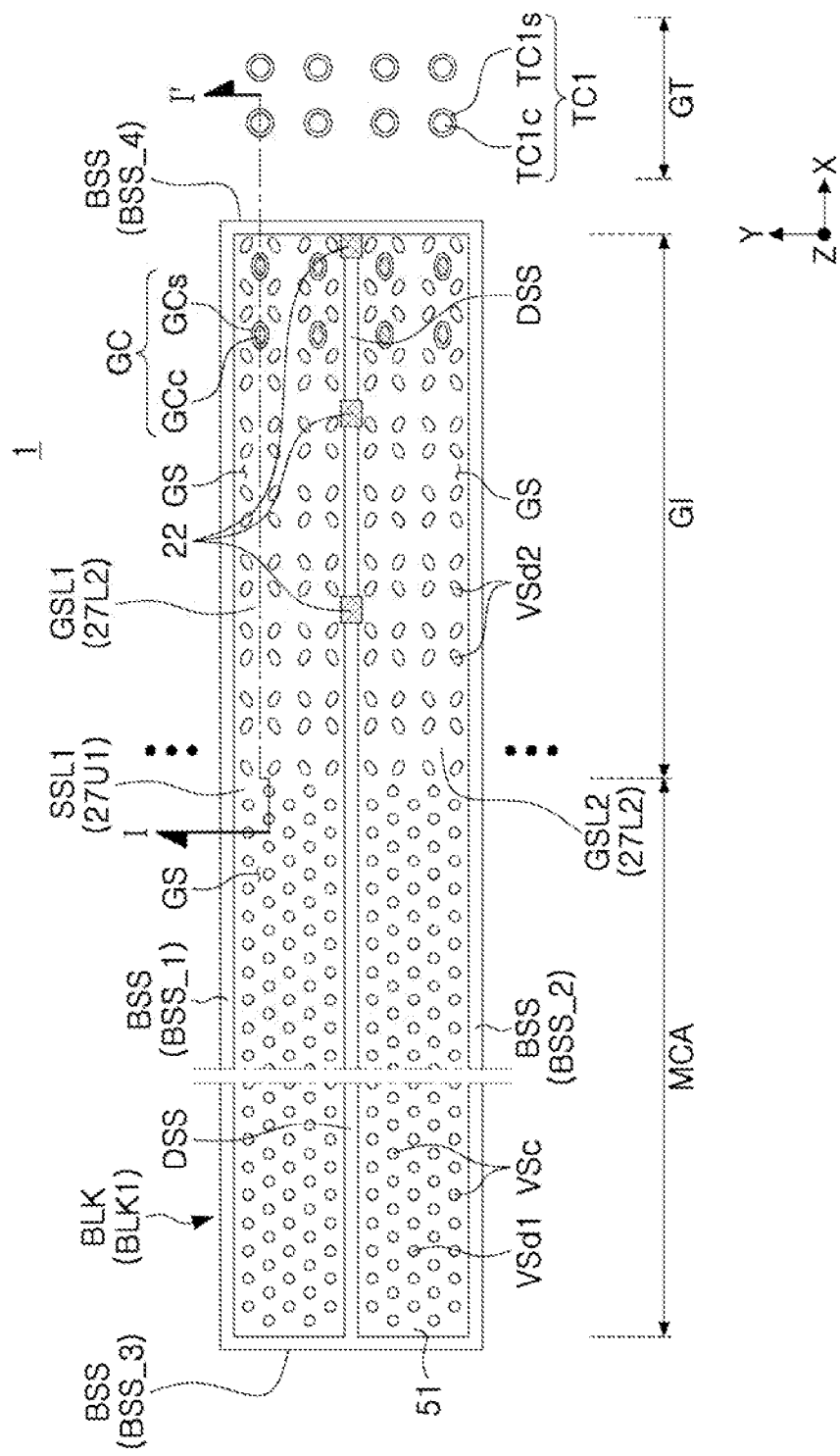
Figure 3:
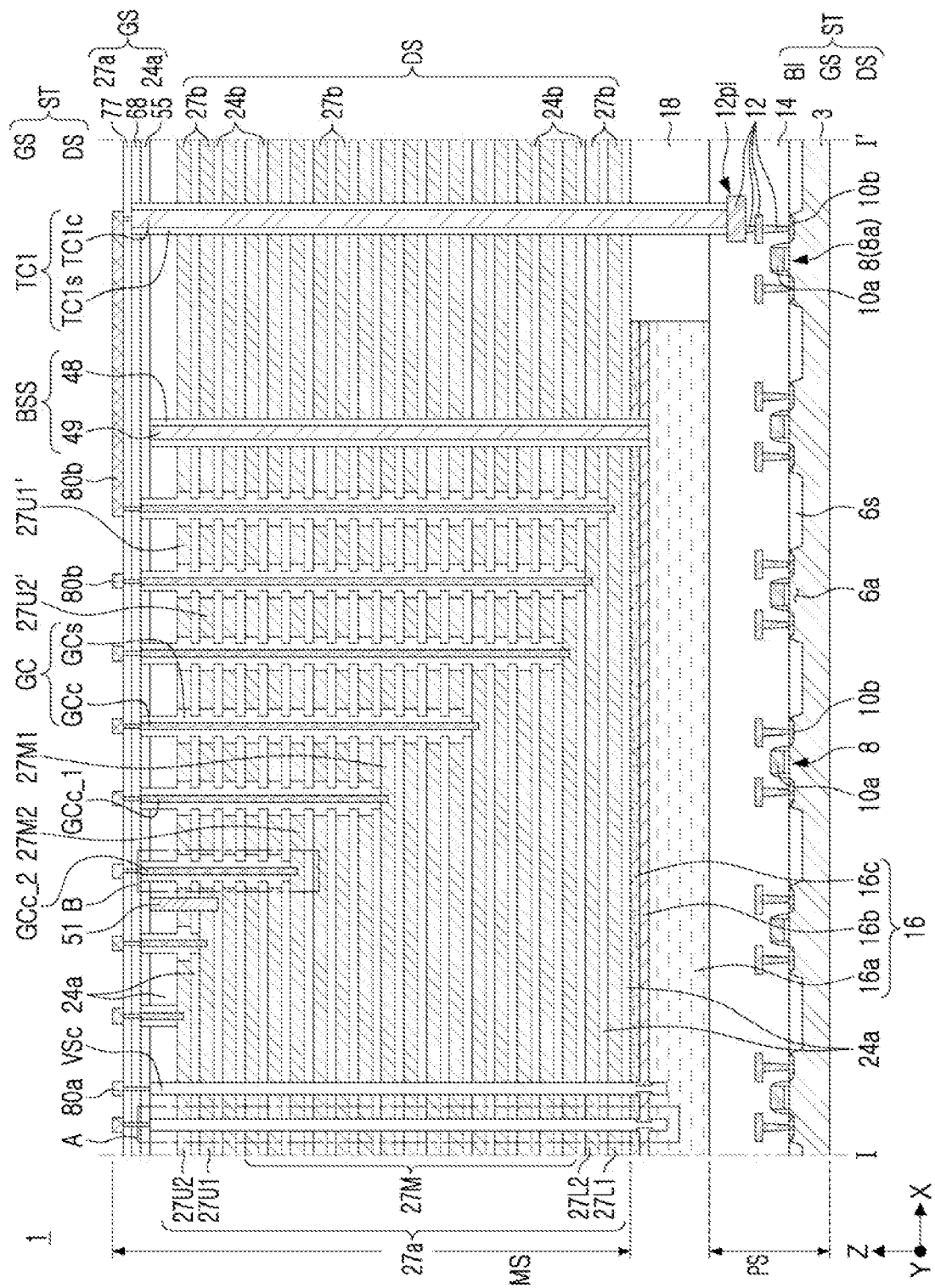
Figure 4:
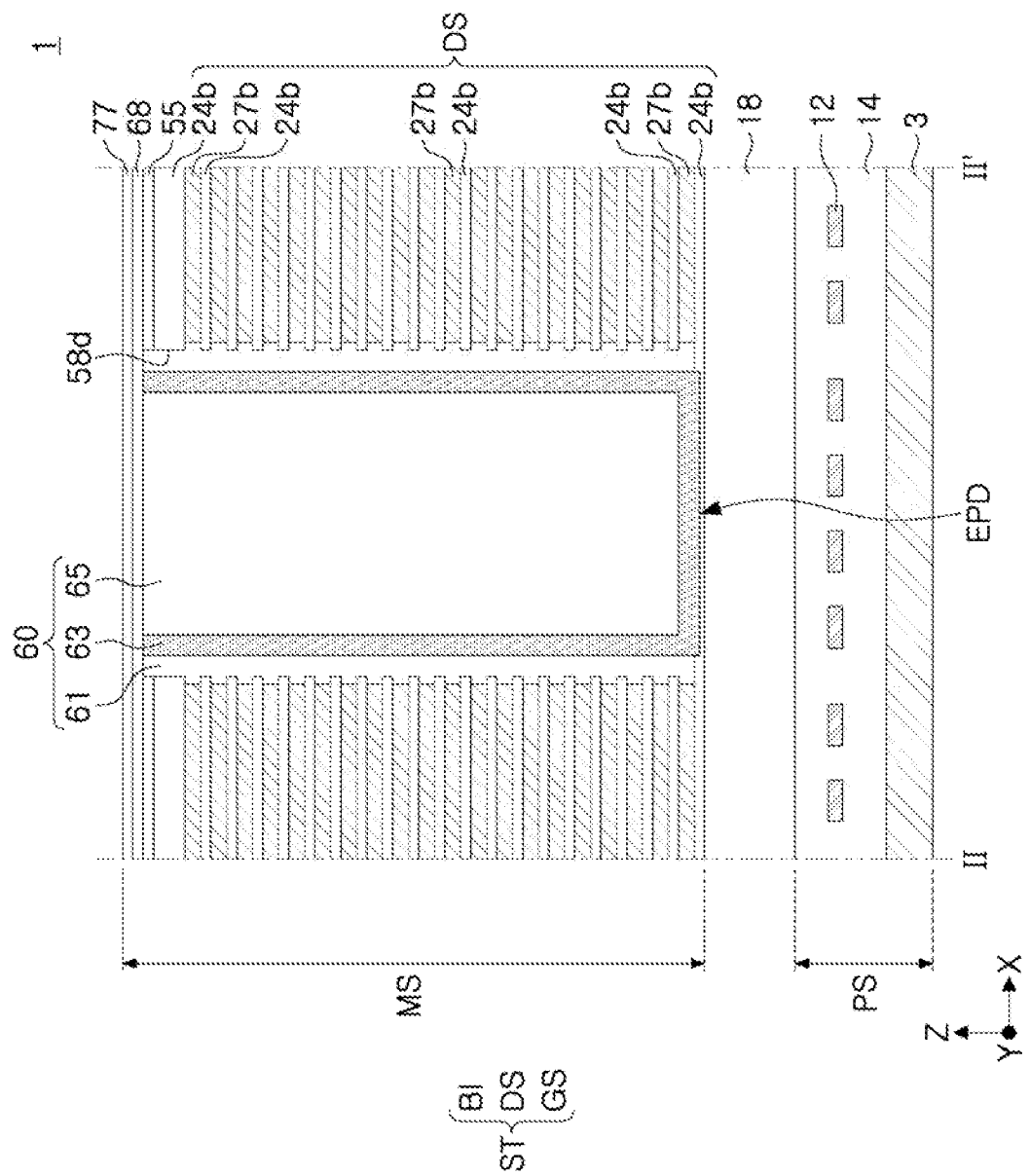
Figure 5A:
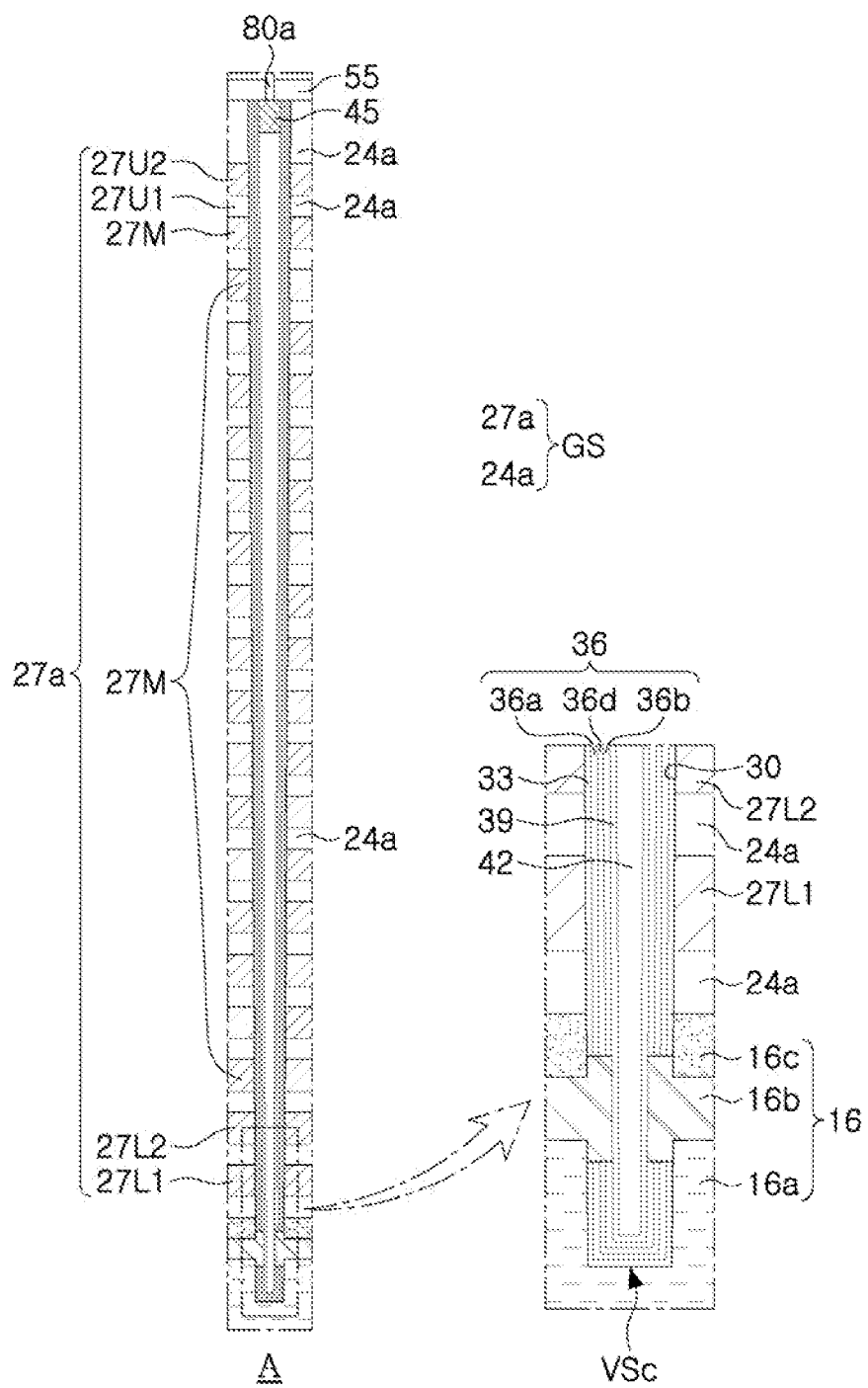
Figure 5B:
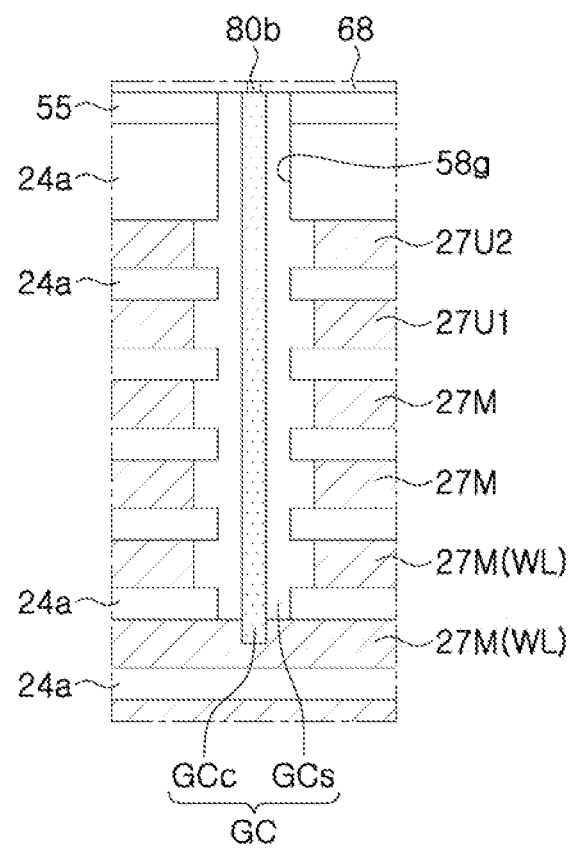
Figure 6B:
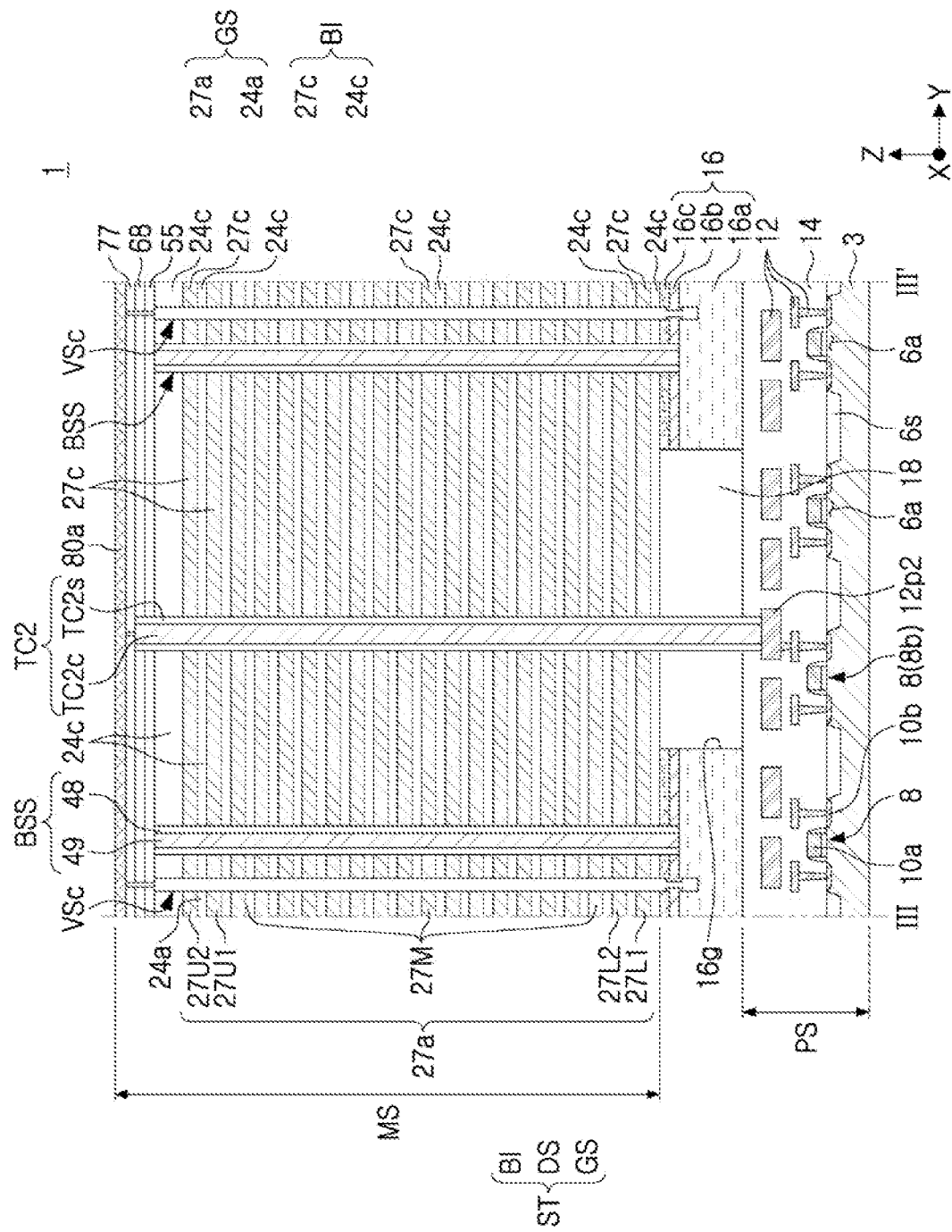

FIG. 1 is a top view of an example of a semiconductor device according to an example embodiment. FIG. 2A is a top view of a semiconductor device, viewed on a level on which string select lines are disposed in the semiconductor device. FIG. 2B is a top view of a semiconductor device, viewed on a level on which word lines are disposed in FIG. 2A. FIG. 2C is a top view of a semiconductor device, viewed on a level on which lower select lines are disposed in FIG. 2A. FIG. 3 is a cross-sectional view of a region taken along line I-I' of FIG. 2A. FIG. 4 is a cross-sectional view of a region taken along line II-II' of FIG. 1. FIG. 5A is an enlarged cross-sectional view of region "A" of FIG. 3. FIG. 5B is an enlarged cross-sectional diagram of region "B" of FIG. 3. FIG. 6A is a top view of region "C" of FIG. 1. FIG. 6B is a cross-sectional view of a region taken along line III-III' in FIG. 6A.

Referring to FIGS. 1 and 2A to 2C among FIGS. 1 to 6B, a semiconductor device 1 according to an example embodiment may include memory mats MAT.

Each of the memory mats MAT may include memory blocks BLK.

Each of the memory blocks BLK may include a memory cell array region MCA and a gate connection region GI disposed on at least one side of the memory cell array region MCA.

The plurality of memory mats MAT may include four memory mats, which may be a first memory mat MAT1, a second memory mat MAT2, a third memory mat MAT3, and a fourth memory mat MAT4. But an example embodiment thereof may be varied, e.g., the semiconductor device 1 may include two memory mats.

Each of the memory blocks BLK may have a linear shape or a bar shape extending in a first direction X.

In each of the plurality of memory mats MAT, the plurality of memory blocks BLK may be arranged in a second direction Y perpendicular to the first direction X.

The semiconductor device 1 may further include block separation structures BBS spaced apart from each other. In each of the plurality of memory mats MAT, the block separation structure BBS may include a shape of a closed loop surrounding a side surface of each of the plurality of memory blocks BLK.

The semiconductor device 1 may further include a stack structure ST. The stack structure ST may include gate stack regions GS, a dummy stack region DS, and a bit line connection region BI.

One or a plurality of the bit line connection regions BI may be disposed between the plurality of memory blocks BLK in each of the plurality of memory mats MAT.

The plurality of memory blocks BLK may include the gate stack regions GS. For example, one memory block BLK may include a single gate stack region GS.

The dummy stack region DS may surround the plurality of memory mats MAT. An external side of the dummy stack region DS may be an external side of the semiconductor device 1.

The dummy stack region DS of the stack structure ST may include through contact regions GT.

The semiconductor device 1 may further include etch stop detection regions EPD. At least one of the etch stop detection regions EPD may have a width greater than a width of each of the plurality of memory blocks BLK. At least one of the etch stop detection regions EPD may have a maximum width greater than a width in the second direction Y of each of the plurality of memory blocks BLK, in a plan view. At least one of the etch stop detection regions EPD may have a minimum width greater than the width in the second direction Y of each of the plurality of memory blocks BLK, in a plan view.

One or a plurality of the etch stop detection regions EPD may be disposed between the plurality of memory mats MAT. A plurality of the etch stop detection regions EPD may be disposed on an external side of the plurality of memory mats MAT.

Each of the memory blocks BLK may include vertical structures VSc, VSd1, and VSd2.

The vertical structures VSc, VSd1, and VSd2 may include vertical memory structures VSc, first vertical dummy structures VSd1, and second vertical dummy structures VSd2. The vertical memory structures VSc and the first vertical dummy structures VSd1 may be disposed in the memory cell array region MCA. The second vertical dummy structures VSd2 may be disposed in the gate connection region GI.

One of the plurality of memory blocks BLK, i.e., the first memory block BLK1 (in FIGS. 2A to 2C) will mainly be described below.

In the top view, the first memory block BLK1 may be entirely surrounded by the block separation structure BSS. For example, the block separation structure BSS surrounding the first memory block BLK1 may include first and second linear portions BSS1 and BSS2 parallel to each other and extending in the first direction X, and third and fourth linear portions BSS3 and BSS4 parallel to each other and extending in the second direction Y. The block separation structure BSS surrounding the first memory block BLK1 may have a rectangular closed ring shape.

The first memory block BLK1 may include upper select lines SSL1, SSL2, SSL3, and SSL4 (in FIG. 2A) on a first level, may include a word line WL (in FIG. 2B) on a second level lower than the first level, and may include lower select gate lines GSL1 and GSL2 (in FIG. 2C) on a third level lower than the second level. At least one of the etch stop detection regions EPD (in FIG. 1) may have a maximum width greater than a width in the second direction Y of a first word line WL (in FIG. 2B) among the gate electrodes 27, in a plan view. At least one of the etch stop detection regions EPD (in FIG. 1) may have a minimum width greater than the width in the second direction Y of the first word line WL (in FIG. 2B) among the gate electrodes 27, in a plan view.

In the first memory block BLK1, the total number of the plurality of upper select lines on the first level may be greater than the total number of the lower select gate lines on the third level. For example, the plurality of upper select lines may include first to fourth upper select lines SSL1, SSL2, SSL3, and SSL4 (in FIG. 2A), and the plurality of lower select gate lines may include first and second lower select lines GSL1 and GSL2 (in FIG. 2C).

The semiconductor device 1 may include auxiliary separation structures BSS.

In the first memory block BLK1, the auxiliary separation structure BSS may be disposed in the block separation structures BSS having a shape of a closed loop.

In the first memory block BLK1, the auxiliary separation structure DSS may include linear portions spaced apart from each other and arranged in the first direction X.

The semiconductor device 1 may further include an upper separation pattern 51 and a lower separation pattern 22.

In the first memory block BLK1, the auxiliary separation structure DSS may include linear portions spaced apart from each other and arranged in the first direction X. For example, in the first memory block BLK1, the auxiliary separation structure DSS may include a first linear portion intersecting the memory cell array region MCA and extending into the gate connection region GI, and second linear portions spaced apart from the first linear portion and arranged in order in the first direction X in the gate connection region GI.

In the memory cell array region MCA, the auxiliary separation structure DSS may isolate the second and third upper select lines SSL2 and SSL3 from each other.

In the first memory block BLK1, the upper separation pattern 51 (in FIG. 2A) may be disposed between the first and second upper select lines SSL1 and SSL2 and may be disposed between the third and fourth upper select lines SSL3 and SSL4.

The upper separation pattern 51 (in FIG. 2A) may include a first linear portion extending in the first direction X.

In an example, when a first linear portion extending in the first direction X is disposed in the gate connection region GI and is spaced apart from the block separation structure BSS, the upper separation pattern 51 (in FIG. 2A) may further include a second linear portion extending in the second direction Y from an end of the first linear portion disposed in the gate connection region GI.

In another example, in the upper separation pattern 51 (in FIG. 2A), a first linear portion extending in the first direction X may intersect the gate connection region GI and may be in contact with the block separation structure BSS.

The lower separation pattern 22 may be disposed between the first and second lower select lines GSL1 and GSL2 in the gate connection region GI, and may be disposed in linear portions of the auxiliary separation structure DSS spaced apart from each other.

The first and second lower select lines GSL1 and GSL2 may be spaced apart from each other by the auxiliary separation structure DSS and the lower separation pattern 22.

The semiconductor device 1 may further include gate contact structures GC disposed in the first memory block BLK1.

The semiconductor device 1 may further include first contact structures TC1 disposed in the through contact region GT.

Each of the gate contact structures GC may include a gate contact plug GCc and an insulating gate spacer GCs surrounding the gate contact plug GCc. The gate spacers GCs may be referred to as "insulating spacers." Each of the first through contact structures TC1 may include a first contact plug TCc and a first insulating spacer TCs surrounding the first contact plug TCc.

At least one of the etch detection regions EPD may have a width greater than a width of each of the plurality of first through contact structures TC1 and the plurality of gate contact structures GC.

At least one of the plurality of gate contact structures GC may have a bar shape or an elliptical shape elongated in one direction, e.g., the first direction X.

A width of each of the plurality of gate contact structures GC and the plurality of first through contact structures TC1 may be greater than a width of each of the vertical memory structures VSc.

Referring to FIGS. 3 and 4 among FIGS. 1 to 6B, the semiconductor device 1 may include a peripheral circuit structure PS and an upper structure MS disposed on the peripheral circuit structure PS.

The peripheral circuit structure PS may include a semiconductor substrate 3, an isolation region 6s defining active regions 6a on the semiconductor substrate 3, peripheral circuits 8 on the active regions 6a, a circuit wiring 12 electrically connected to the peripheral circuits 8 and disposed on the peripheral circuits 8, and an insulating structure covering the circuit wiring 12. Each of the peripheral circuits 8 may include a transistor including a peripheral gate 10a and a peripheral source/drain 10b.

The peripheral circuits 8 may include a first peripheral circuit 8a and a second peripheral circuit 8b.

The semiconductor device 1 may further include a plate pattern 16 and a dummy region 18 disposed on the peripheral circuit structure PS. The dummy region 18 may be disposed on a side surface of the plate pattern 16. The dummy region 18 may include an insulating material layer and/or a dummy pattern of which side surfaces are covered by the insulating material layer.

The plate pattern 16 may include a lower layer 16a, an intermediate layer 16b on the lower layer 16a, and an upper layer 16c on the intermediate layer 16b. The plate pattern 16 may include at least one silicon layer. For example, each of the lower layer 16a, the intermediate layer 16b, and the upper layer 16c may include a polysilicon layer having N-type conductivity.

The upper structure MS may be disposed on the plate pattern 16 and the dummy region 18.

The upper structure MS may include the stack structure ST, the separation structures BSS and DSS including the block separation structures BSS and the auxiliary separation structure DSS, the vertical structures VSS, VSd1, and VSd2, the plurality of gate contact structures GC, and the plurality of first contact structures TC1, described with reference to FIGS. 1 to 2C.

The upper structure MS may further include upper insulating layers 55, 68, and 77, bit lines 80a, and gate connection wirings 80b.

The stack structure ST may include the plurality of gate stack regions GS and the dummy stack region DS described with reference to FIGS. 1 to 2C.

The stack structure ST may include first layers 24a and 24b and second layers 27a and 27b alternately stacked. Thus, the second layers 27a and 27b may be stacked and spaced apart from each other in the vertical direction (Z) perpendicular to the upper surface of the plate pattern 16.

The first layers 24a and 24b may be formed of an insulating material, e.g., silicon oxide. The second layers 27a and 27b may include at least one of, e.g., doped polysilicon, W, Ru, Mo, Ni, NiSi, Co, CoSi, Ti, TiN, or WN.

Among the first layers 24a and 24b, first layers disposed in the plurality of gate stack regions GS may be referred to as first interlayer insulating layers 24a, and the first layers disposed in the dummy stack region DS may be referred to as second interlayer insulating layers 24b.

Among the second layers 27a and 27b, second layers disposed in the plurality of gate stack regions GS may be referred to as gate layers or gate electrodes 27a, and the second layers disposed in the dummy stack region DS may be referred to as first dummy horizontal layers 27b.

Each of the gate stack regions GS may include the first interlayer insulating layers 24a and the gate layers 27a alternately stacked, and each of the dummy stack regions DS may include the second interlayer insulating layers 24b and the first dummy horizontal layers 27b alternately stacked.

The separation structures BSS and DSS may penetrate the stack structure ST.

Upper surfaces of the separation structures BSS and DSS may be disposed on a level lower than a level of upper surfaces of the gate contact structures GC.

Each of the convex separation structures BSS may define the plurality of gate stack regions GS spaced apart from each other. For example, each of the convex structures BSS may have a shape of a closed loop surrounding an entire side surface of each of the plurality of gate stack regions GS spaced apart from each other.

Each of the separation structures BSS and DSS may include a core pattern 49 and an insulating spacer 48 disposed on at least a side surface of the core pattern 49.

In an example, the core pattern 49 may be formed of a conductive material, and may be in contact with the lower layer 16a of the plate pattern 16. In another example, the core pattern 49 may be formed of an insulating material.

The vertical structures VSS, VSd1, and VSd2 may penetrate the plurality of gate stack regions GS.

The upper insulating layers 55, 68, and 77 may include a first upper insulating layer 55, a second upper insulating layer 68 and a third upper insulating layer 77 staked in order on the stack structure ST.

The gate contact structures GC may penetrate the first upper insulating layer 15 and may extend downwardly. As described above, each of the gate contact structures GC may include the gate contact plug GCc and the gate spacers GCs. The gate spacers GCs may be formed of an insulating material. For example, the gate spacers GCs may include at least one of, e.g., silicon oxide, silicon nitride, silicon oxynitride, or a low dielectric material.

The gate contact plugs GCc of the gate contact structures GC may have bottom surfaces disposed on different levels, and may have upper surfaces disposed on the same level.

The gate contact plugs GCc may have bottom surfaces in contact with the gate electrodes 27a stacked and spaced apart from each other in the vertical direction Z. The gate contact plugs GCc may be electrically connected to the gate electrodes 27a.

The plurality of gate electrodes 27a may include a first gate electrode 27M1 (in FIG. 3) and a second gate electrode 27M2 (in FIG. 3) disposed on a level higher than a level of the first gate electrode 27M1. The plurality of gate contact plugs GCc may include a first gate contact plug GCc_1 (in FIG. 3) penetrating through the second gate electrode 27M2 and in contact with the first gate electrode 27M1, and a second gate contact plug GCc_2 (in FIG. 3) in contact with the second gate electrode 27M2 on a level higher than a level of the first gate electrode 27M1. The first and second gate electrodes 27M1 and 27M2 may be first and second word lines.

In an example, when the first gate contact plug GCc_1 (in FIG. 3) and the second gate contact plug GCc_2 (in FIG. 3) are adjacent to each other in the first direction X and are sequentially arranged, one or a plurality of gate electrodes may be disposed between the first gate electrode 27M1 and the second gate electrode 27M2.

The plurality of first contact structures TC1 may penetrate the first and second upper insulating layers 55 and 68, the dummy stack region DS, and the dummy region 18, may extend downwardly, and may be electrically connected to the first peripheral circuit 8a among the peripheral circuits 8. For example, each of the plurality of first through contact structures TC1 may include a first contact plug TCc and a first insulating spacer TCs surrounding the first contact plug TCc, and the first through contact plugs TC1c of the first through contact structures TC1 may be in contact with and electrically connected to the first peripheral pads 12p1 of the circuit wiring 12 electrically connected to the first peripheral circuit 8a.

The bit lines 80a may be electrically connected to the vertical memory structures VSc. For example, the bit lines 80a include linear portions disposed on the third upper insulating layer 77, and via portions penetrating through the first to third upper insulating layers 55, 68, and 77 below the linear portions and in contact with the vertical memory structures VSc.

The gate connection wirings 80b may electrically connect the gate contact plugs GCc of the gate contact structures GC to the first through contact plugs TC1c of the first through contact structures TC1. For example, the gate connection wirings 80b may include linear portions disposed on the third upper insulating layer 77, and via portions penetrating through the second and third upper insulating layers 68 and 77 below the linear portions and in contact with the first through contact plugs TC1c and the gate contact plugs GCc.

Referring to FIG. 4, a dummy structure 60 penetrating through the dummy stack region DS may be disposed in the etch detection stop region EPD. The dummy structure 60 may include an etch stop detection hole 58d penetrating through the dummy stack region DS, a liner 62 covering a sidewall and a bottom of the etch stop detection hole 58d, an insulating spacer 61 disposed between the liner 62 and the sidewall of the etch stop detection hole 58d, and a gap-fill layer 65 filling the etch stop detection hole 58d on the liner 62. The liner 62 may be formed of the same conductive material as that of the gate contact plugs GCc. The insulating spacers 61 may be formed of the same material as that of the gate spacers GCs. The gap-fill layer 65 may be formed of an insulating material, e.g., silicon oxide.

The dummy structure 60 may have a width greater than a width of each of the plurality of first through contact structures TC1 and the plurality of gate contact structures GC.

The dummy structure 60 may have a width greater than the width of the first word line of one of the gate electrodes 27a.

Among FIGS. 1 to 6B, referring to FIG. 5A, the gate electrodes 27a may include a first lower gate electrode 27L1, a lower gate electrode 27L2, intermediate gate electrodes 27M, a first upper gate electrode 27U1, and a second upper gate electrode 27U2, stacked in order in the vertical direction X.

In an example, when the semiconductor device 1 is a NAND flash memory device, the first lower gate electrode 27L1 may be a lower erase control gate electrode used for an erase operation using a gate induced drain leakage (GIDL) phenomenon in the NAND flash memory device, and the second lower gate electrode 27L2 may be a lower select gate line, a portion of the plurality of intermediate gate electrodes 27M may be word lines, the first upper gate electrode 27U1 may be an upper select gate line, and the second upper gate electrode 27U2 may be an upper erase control gate electrode used for an erase operation using a GIDL phenomenon in a NAND flash memory device.

The second lower gate electrode 27L2 may be included in the first and second lower select gate lines GSL1 and GSL2 (in FIG. 2C) described with reference to FIG. 2C, and the first upper gate electrode 27U1 may be the upper select gate lines SSL (in FIG. 2A) described with reference to FIG. 2A. The first and second lower select gate lines GSL1 and GSL2 (in FIG. 2C) may be ground select gate lines, and the upper select gate lines SSL (in FIG. 2A) may be string select gate lines.

According to a planar shape of the upper select gate lines SSL (in FIG. 2A) and the planar shape of the upper separation pattern 51, a portion of the first and second upper gate electrodes 27U1 and 27U2 may be dummy upper gate electrodes 27U1' and 27U2'. In another example, the first and second upper gate electrodes 27U1 and 27U2 may be included in the upper select gate lines SSL (in FIG. 2A) and the upper erase control gate electrodes electrically activated without the dummy upper gate electrodes 27U1' and 27U2'.

Each of the vertical memory structures VSc may include an insulating core region 42, a pad pattern 45 on the insulating core region 42, a data storage structure 36 disposed on a side surface of the insulating core region 42 and a side surface of the pad pattern 45, and a channel layer 39 disposed between the insulating core region 42 and the data storage structure 36 and between the insulating core region 42 and the pad pattern 45

Each of the vertical memory structures VSc may further include a gate dielectric 33 covering an external side surface and a bottom surface of the data storage structure 36.

The pad pattern 45 may include doped silicon, e.g., polysilicon having N-type conductivity. The channel layer 39 may be in contact with the pad pattern 45. The channel layer 39 may be formed as a silicon layer. The data storage structure 36 may include a first dielectric layer 36a, a data storage layer 36d, and a second dielectric layer 36b. The data storage layer 36d may be interposed between the first dielectric layer 36a and the second dielectric layer 36b.

The first dielectric layer 36a may include silicon oxide and/or a high dielectric. The data storage layer 36d may include a material storing data in a NAND flash memory device, e.g., silicon nitride trapping charges. The second dielectric layer 36b may be a tunnel dielectric layer in contact with the channel layer 39. The second dielectric layer 36b may be silicon oxide or silicon oxide doped with impurities. The gate dielectric 33 may include silicon oxide and/or a high dielectric.

The intermediate layer 16b of the plate pattern 16 may penetrate the gate dielectric 33 and the data storage structure 36, and may be in contact with the channel layer 39.

The intermediate layer 16b may be formed of a silicon layer having N-type conductivity. A portion of the channel layer 39 in contact with the intermediate layer 16b may have N-type conductivity.

Among FIGS. 1 to 6B, referring to FIG. 5B, each of the gate contact structures GC may include the gate contact plug GCc and the gate spacers GCs. The gate contact structures GC may have a relatively narrow width on the same levels as levels of the first interlayer insulating layers 24a.

In each of the gate contact structures GC, a bottom surface of the gate contact plug GCc may be disposed on a level lower than a level of a level of a bottom surface of the gate spacer GCs.

In each of the gate contact structures GC, the gate spacer GCs may be disposed on a level higher than a level of a gate electrode in contact with the gate contact plug GCc among the gate electrodes 27a.

Among FIGS. 1 to 6B, referring to FIGS. 6A and 6B, the bit line connection region BI described with reference to FIG. 1 may include third interlayer insulating layers 24c and second dummy horizontal layers 27c alternately stacked.

The first to third interlayer insulating layers 24a, 24b, and 24c may be disposed on substantially the same level. The first to third interlayer insulating layers 24a, 24b, and 24c may be formed of the same insulating material, e.g., silicon oxide.

The gate electrodes 27a, the first dummy horizontal layers 27b, and the second dummy horizontal layers 27c may be disposed on substantially the same level. The gate electrodes 27a, the first dummy horizontal layers 27b and the second dummy horizontal layers 27c may include the same conductive material, e.g., at least one of doped polysilicon, W, Ru, Mo, Ni, NiSi, Co, CoSi, Ti, TiN, or WN.

The plate pattern 16 may have a gap 16g below the bit line connection region BI, and the dummy region 18 may fill the gap 16g.

The semiconductor device 1 may further include second through contact structures TC2. The second through contact structures TC2 may penetrate the first and second upper insulating layers 55 and 68, the bit line connection region BI, and the dummy region 18, may extend downwardly, and may be electrically connected to the second peripheral circuit 8b of the peripheral circuits 8. Each of the second through contact structures TC2 may include a second through contact plug TC2c and a second insulating spacer TC2s surrounding a side surface of the second through contact plug TC2c.

The second through contact plugs TC2c of the second through contact structures TC2 may be in contact with and electrically connected to the second peripheral pads 12p2 of the circuit wiring 12 electrically connected to the second peripheral circuit 8b.

The bit lines 80a may electrically connect the vertical memory structures VSc to the through contact plugs TC2c of the second through contact structures TC2. For example, the bit lines 80a may be disposed on the third upper insulating layer 77, and may include a linear portion extending in the second direction Y, and via portions disposed below the linear portion and in contact with the vertical memory structures Via and the through contact plugs TC2c.

The block separation structure BBS may include a shape of a closed loop surrounding an entire side surface of each of the plurality of memory blocks BLK. Thus, the block separation structure BBS may surround an entire side surface of each of the gate stack regions GS included in the plurality of memory blocks BLK.

In one of the gate stack regions GS, entire external side surfaces of the intermediate gate electrodes 27M (in FIG. 3) may be in contact with the block separation structure BBS. In one of the gate stack regions GS, entire external side surfaces of the gate electrodes 27a (in FIG. 3) may be in contact with the block separation structure BBS.

Ends of the gate electrodes 27a in FIG. 3 may be in contact with the block separation structure BSS, and may be aligned substantially vertically.

The gate electrodes 27a and the gate contact structures GC may be surrounded by the block separation structure BBS.

The side surface of the semiconductor substrate 3 and the side surface of the stack structure ST may be aligned substantially vertically.

Entire external side surfaces of the gate electrodes 27a of the gate stack regions GS of the stack structure ST may be in contact with the block separation structure BBS, and may be aligned substantially vertically. Also, entire external side surfaces of the first dummy horizontal layers 27b1 of the dummy stack region DS may be included in side surfaces of the semiconductor device 1. The entire external side surface of the dummy stack region DS may be included in side surfaces of the semiconductor device 1. The gate electrodes 27a of the gate stack regions GS and the first dummy horizontal layers 27b1 of the dummy stack region DS may be in contact with the block structures BSS. Thus, in the semiconductor device 1, the stack structure ST and the block structures BSS may prevent excessive warpage of the semiconductor device 1, and accordingly, reliability and/or durability of the semiconductor device 1 may improve.

Hereinafter, various example embodiments will be described. Among the components of the semiconductor device 1 according to an example embodiment, modified components or replaced components will be mainly described. The block separation structures BSS and the auxiliary separation structures DSS may be configured to have the same structure through the same process. Thus, in the description of a modified example of the block separation structures BSS below, the auxiliary separation structures DSS may be modified to have a structure substantially the same as that of the modified block separation structures BSS unless otherwise indicated.

A modified example of a semiconductor device will now be described, referring to FIG. 7.

Figure 7:
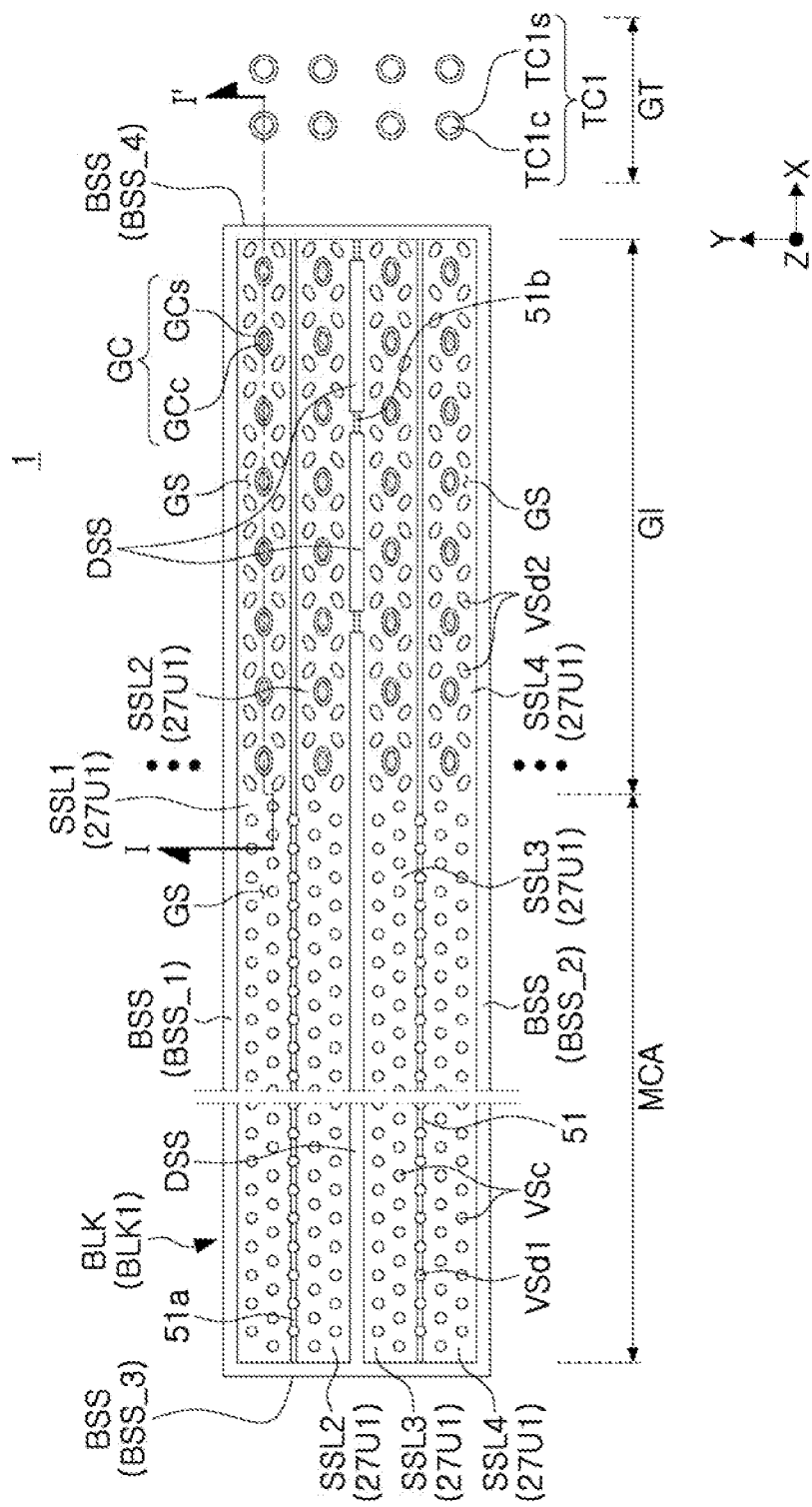
FIG. 7 is a diagram illustrating a modified example of a semiconductor device according to an example embodiment.

FIG. 7 is a diagram of a modified example of a semiconductor device according to an example embodiment, viewed from above. In FIG. 2A, a modified example of the upper separation pattern 51 (in FIG. 2A) may be provided.

Referring to FIG. 7, the upper separation pattern 51 (in FIG. 2A) in FIG. 2A may be modified to upper separation patterns 51a and 51b as in FIG. 7. The upper separation patterns 51a and 51b may include a first upper separation pattern 51a extending in the first direction X and in contact with the third and fourth linear portions BSS_3 and BSS_4 of the block separation structure BSS, and a second upper separation pattern 51b disposed between linear portions of the auxiliary separation structure DSS as in the example described with reference to FIG. 2A. Thus, both ends of each of the plurality of upper select lines SSL1, SSL2, SSL3, and SSL4 may be in contact with the third and fourth linear portions BSS_3 and BSS_4 of the block separation structure BSS.

A modified example of a semiconductor device will now be described, referring to FIG. 8.

Figure 8:
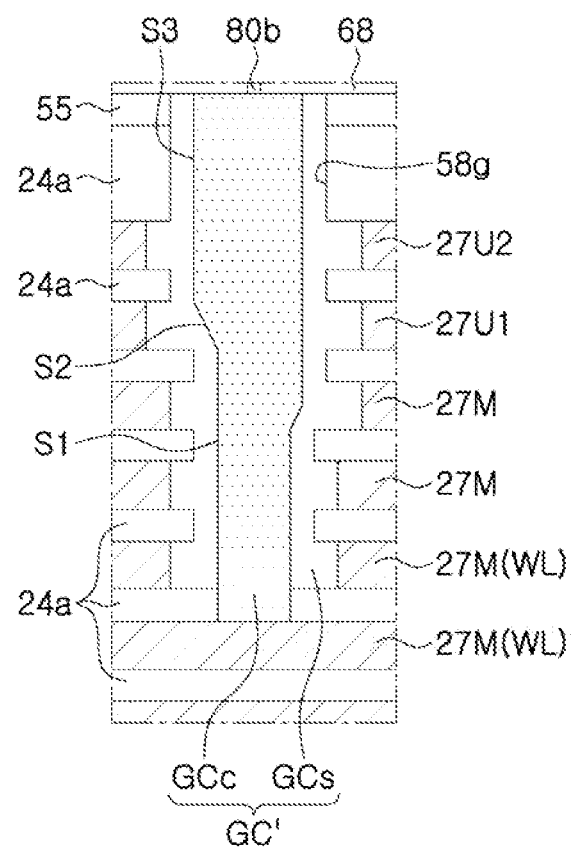
FIG. 8 is a plan diagram illustrating a modified example of a semiconductor device according to an example embodiment.

FIG. 8 is an enlarged cross-sectional diagram of a modified example of a portion of a semiconductor device, and illustrates a modified example of the plurality of gate contact structures GC (in FIG. 3) and may correspond to FIG. 5B.

Referring to FIG. 8, at least one gate contact structure GC' of the gate contact structures GC may include a first portion S1 and a second portion S3 disposed on the first portion S1.

The second portion S2 may have a side surface misaligned with the side surface of the first portion S1.

A central axis disposed between both side surfaces of the first portion S1 may be misaligned with a central axis disposed between both side surfaces of the second portion S3.

The gate contact structure GC' may further include a third portion S2 disposed between the first portion S1 and the second portion S3. A slope of a side surface of the third portion S2 may be different from a slope of a side surface of the first portion S1 and a slope of a side surface of the second portion S3.

A modified example of a semiconductor device will now be described, referring to FIGS. 9A and 9B.

Figure 9A:
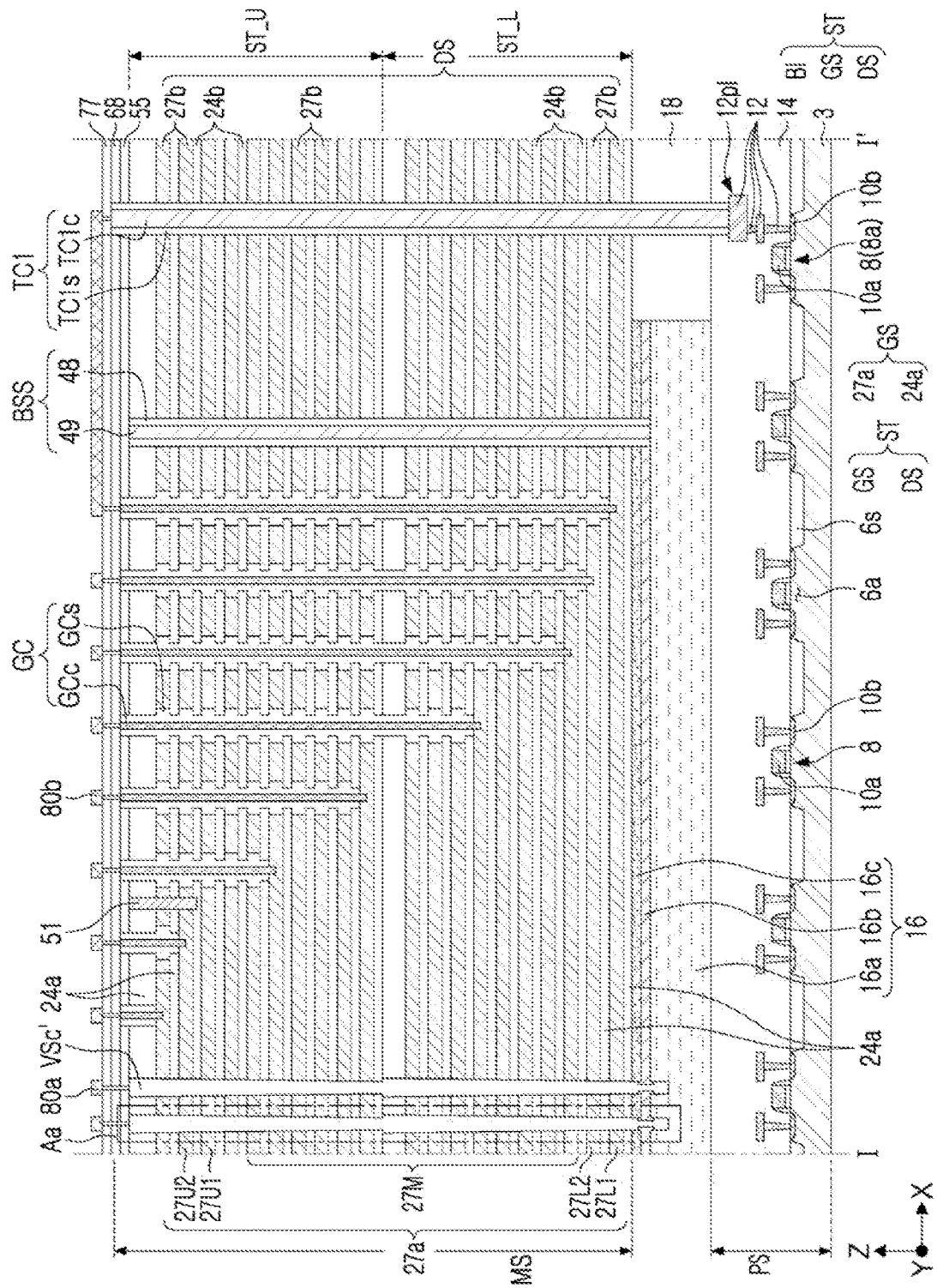
FIGS. 9A and 9B are diagrams illustrating a modified example of a semiconductor device according to an example embodiment.

FIG. 9A is a cross-sectional diagram of a region taken along the line I-I' in FIGS. 2A to 2C. FIG. 9B is an enlarged diagram of region "Aa" in FIG. 9A.

Figure 9B:
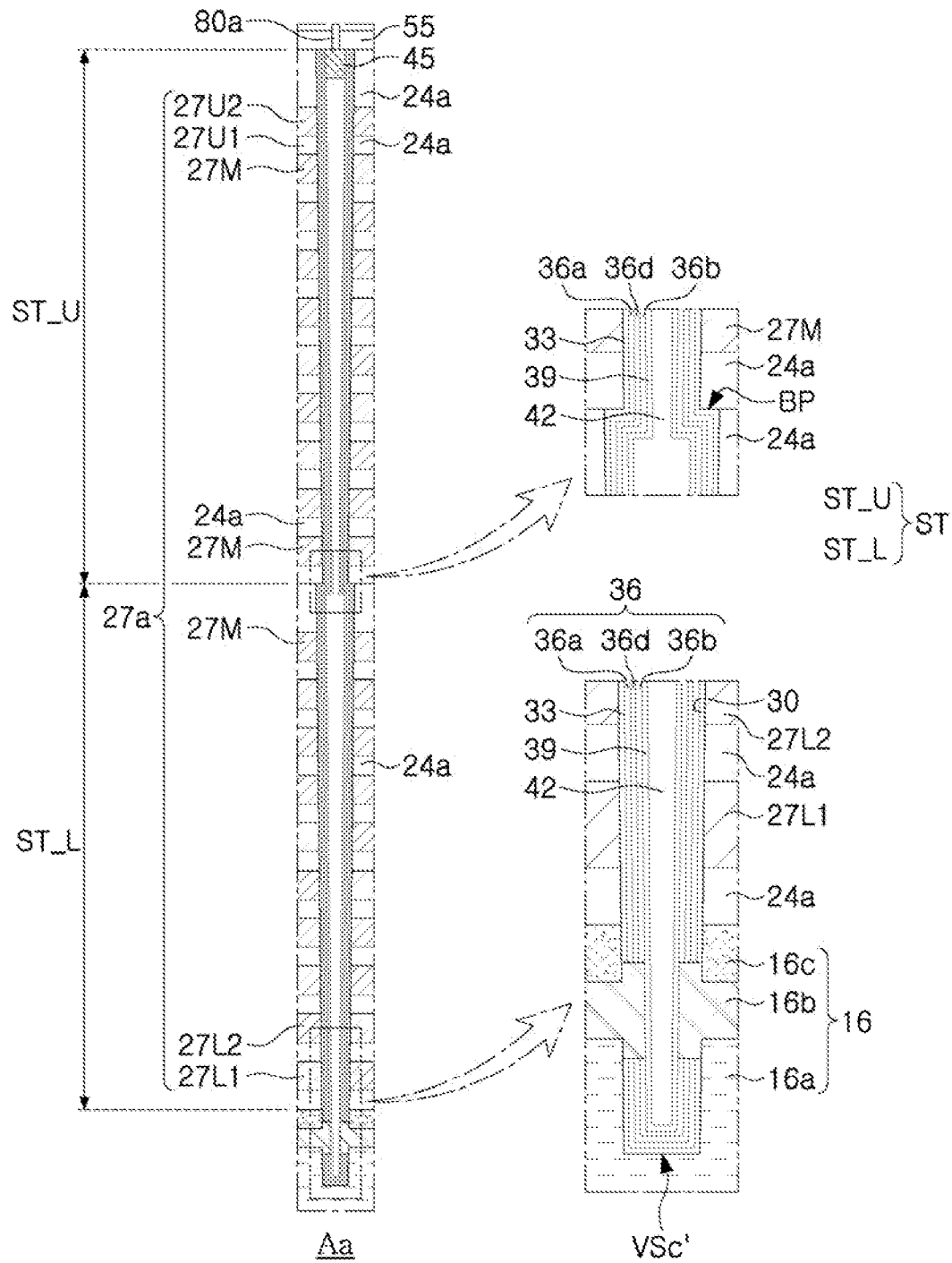

Referring to FIGS. 9A and 9B, the stack structure ST described in the aforementioned example embodiment may be modified to include a lower stack structure ST_L and an upper stack structure ST_U disposed on the lower stack structure ST_L.

Each of the lower stack structure ST_L and the upper stack structure ST_U may include the first interlayer insulating layers 24a and the gate electrodes 27a alternately stacked as described above.

As described above, the vertical memory structures VSc may be modified to vertical memory structures VSc' having a width changing portion BP. The width changing portion BP may be disposed between an uppermost gate electrode among the gate electrodes 27a of the lower stack structure ST_L and a lowermost gate electrode of the gate electrodes 27a of the upper stack structure ST_U. The width changing portion 50V may be a slope changing portion or a bent portion of which a slope of a side surface changes.

A modified example of a semiconductor device will now be described, referring to FIGS. 10 to 12.

Figure 10:
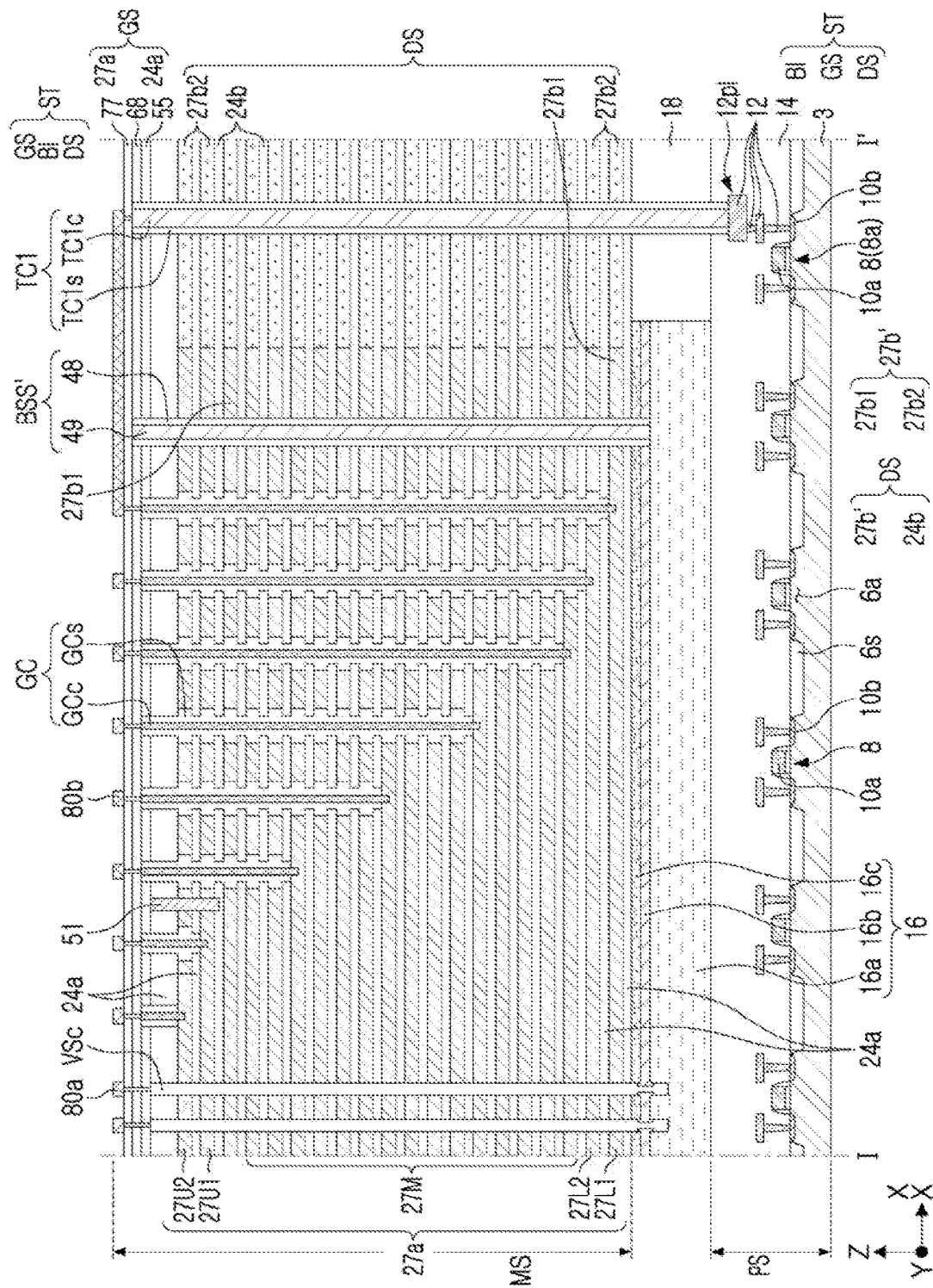
FIGS. 10 to 12 are diagrams illustrating a modified example of a semiconductor device according to an example embodiment.

FIG. 10 is a cross-sectional diagram of a region taken along line I-I' in FIG. 2A. FIG. 11 is a cross-sectional diagram of a region taken along line III-III' in FIG. 6A. FIG. 12 is a cross-sectional diagram of a region taken along line II-II' in FIG. 1.

Figure 11:
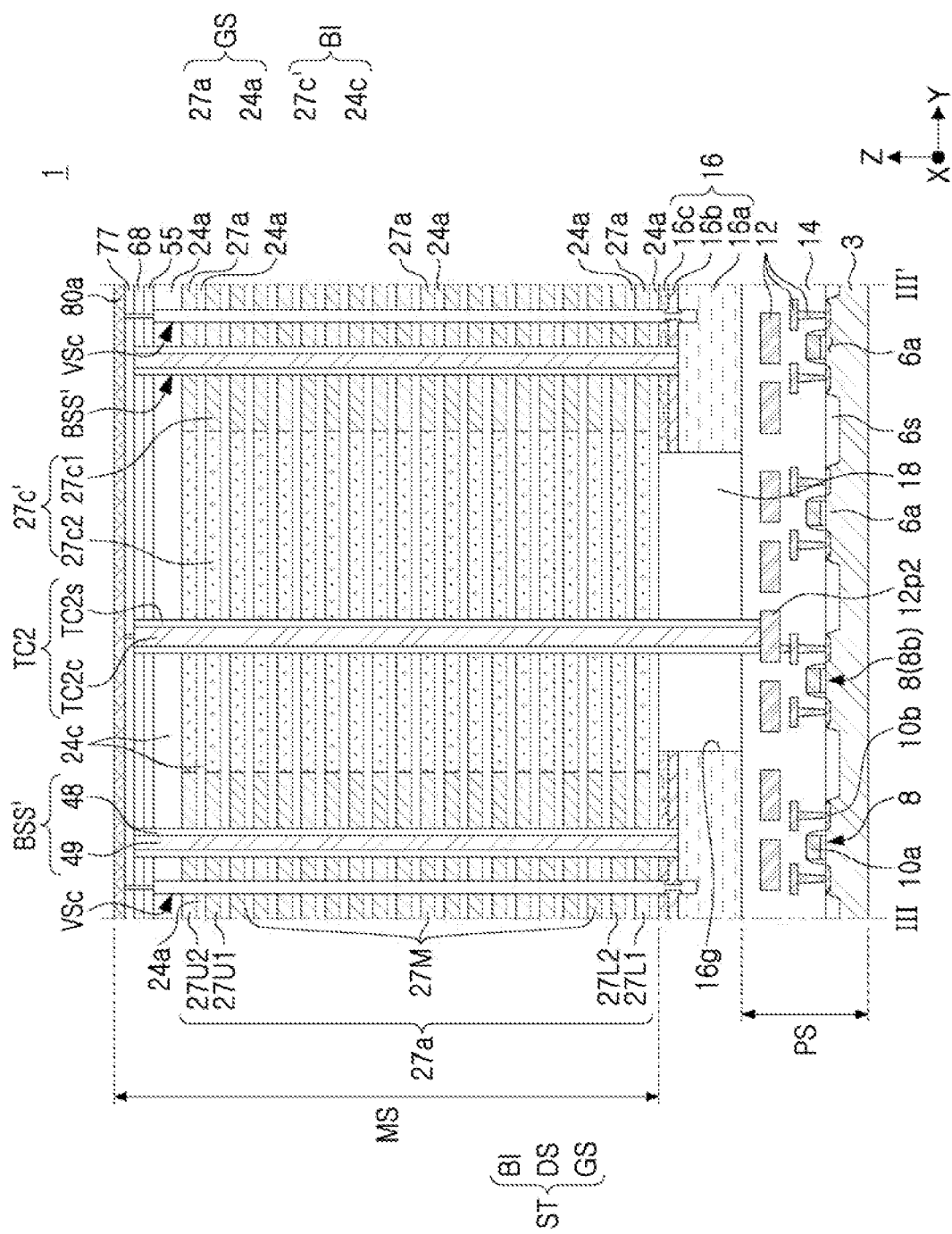
Figure 12:
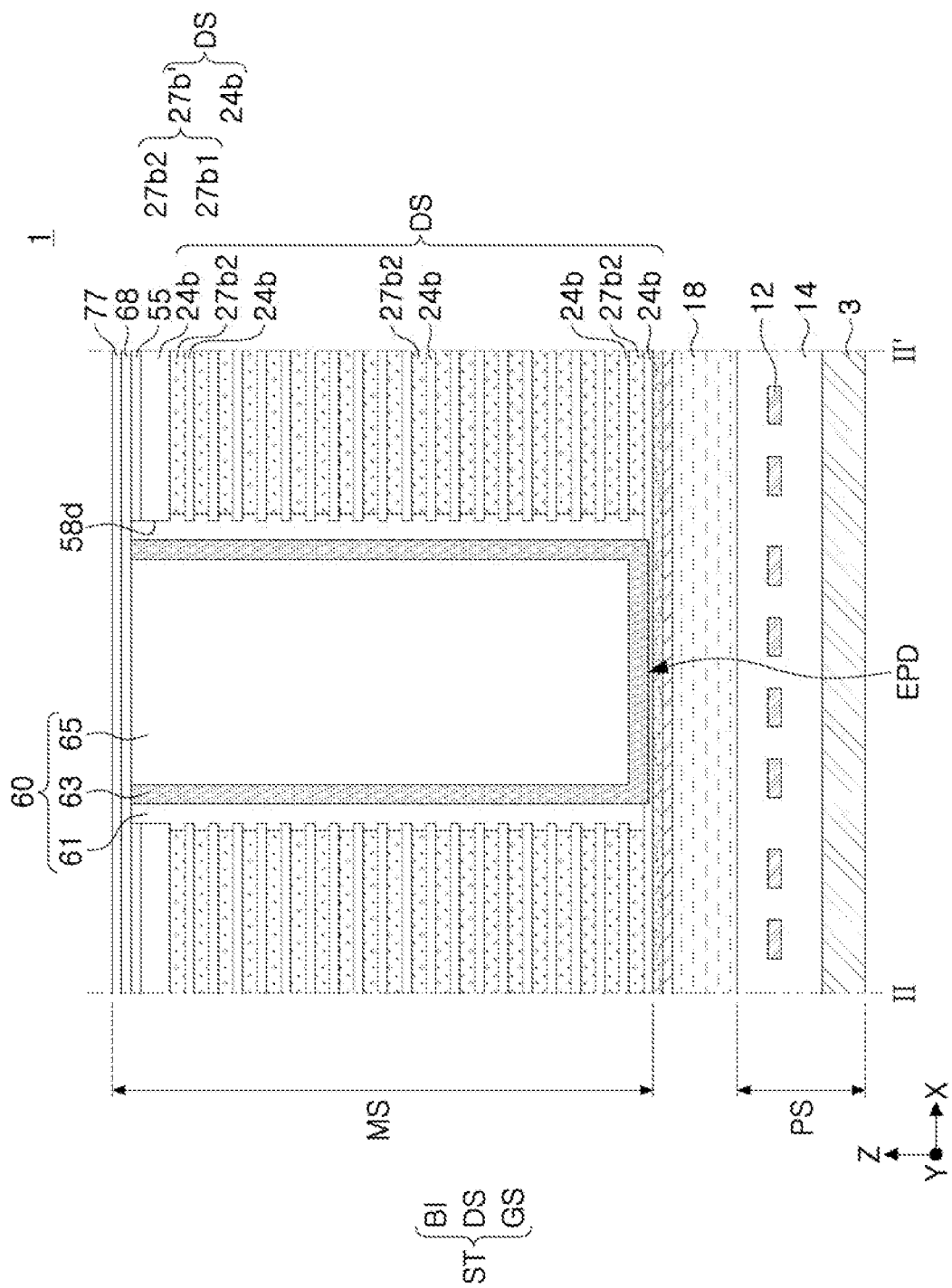

In FIGS. 10 to 12, FIGS. 10 and 12 illustrate a modified example of the first dummy horizontal layers 27b of the dummy stack region DS described with reference to FIGS. 3 and 4, and FIG. 11 illustrates a modified example of the second dummy horizontal layers 27c in the bit line connection region BI described with reference to FIG. 6B.

Referring to FIGS. 10 to 12, the first dummy horizontal layers 27b of the dummy stack region DS described with reference to FIGS. 3 and 4 may be modified to first dummy horizontal layers 27b' including a first portion 27b1 and a second portion 27b2.

The block separation structures BSS (in FIGS. 3 and 6B), having upper surfaces disposed on a level lower than a level of a level of the upper surfaces of the gate contact structures GC described with reference to FIGS. 1 to 6B, may be modified to block separation structures BSS', having upper surfaces disposed on a level higher than a level of the upper surfaces of the gate contact structures GC. The block separation structures BSS' may penetrate the stack structure ST and may penetrate the first and second upper insulating layers 55 and 68.

In each of the first dummy horizontal layers 27b', the first portion 27b1 may be in contact with the block separation structure BSS, and may be disposed between the block separation structure BSS and the second portion 27b2. The second portion 27b2 may be disposed on the dummy region 18. The first through contact structures TC1 may penetrate the second portions 27b2 of the first dummy horizontal layers 27b' of the dummy stack region DS.

In each of the first dummy horizontal layers 27b', the first portion 27b1 may be formed of the same material as that of the gate electrodes 27a, and the second portion 27b2 may be formed of a material different from that of the first portion 27b1, e.g., silicon nitride.

The second dummy horizontal layers 27c in the bit line connection region BI described with reference to FIG. 6B may be modified to second dummy horizontal layers 27c' including a third portion 27c1 and a fourth portion 27c2.

In each of the second dummy horizontal layers 27c', the third portion 27c1 may be in contact with the block separation structure BSS, and may be disposed between the block separation structure BSS and the fourth portion 27c2. The fourth portion 27c2 may be disposed on the dummy region 18. The second through contact structures TC2 may penetrate the fourth portions 27c2 of the second dummy horizontal layers 27c' of the bit line connection region BI.

In each of the second dummy horizontal layers 27c', the third portion 27c1 may be formed of the same material as that of the gate electrodes 27a, and the fourth portion 27c2 may be formed of a material different from that of the first portion 27b1, e.g., silicon nitride.

A modified example of a semiconductor device will now be described, referring to FIGS. 13 to 15B.

Figure 13:
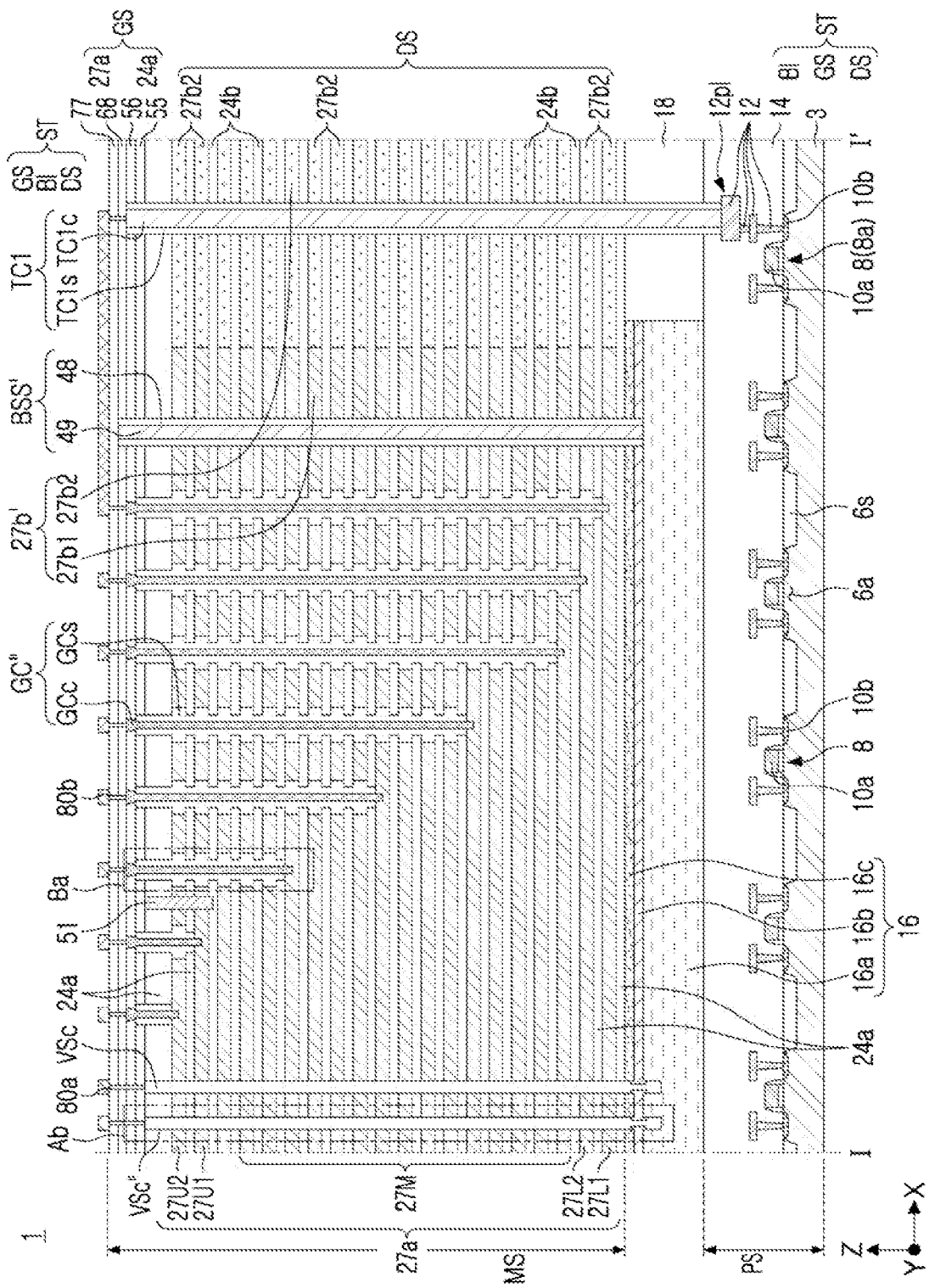
FIGS. 13 to 15B are diagrams illustrating a modified example of a semiconductor device according to an example embodiment.
Figure 14:
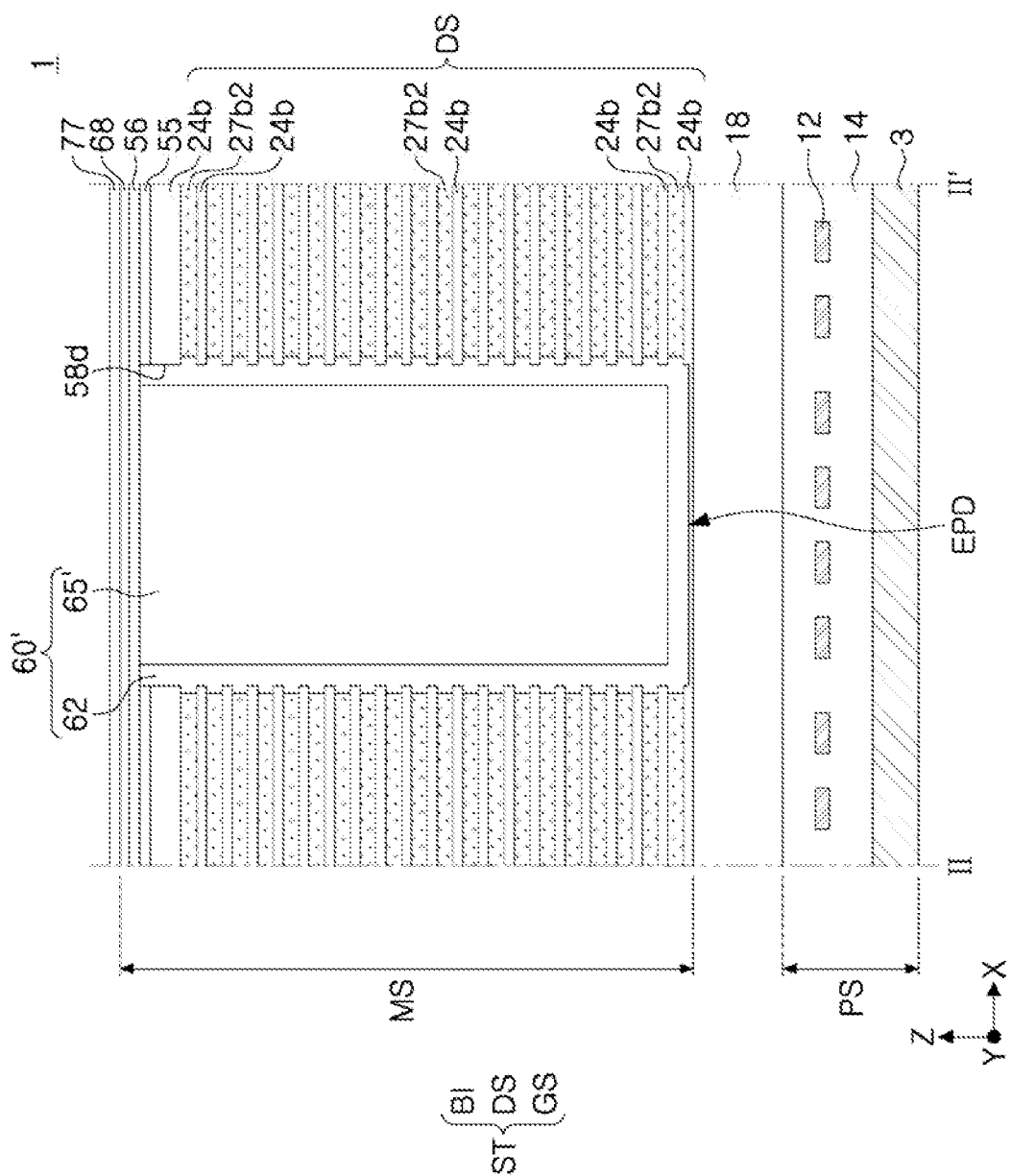
Figure 15A:
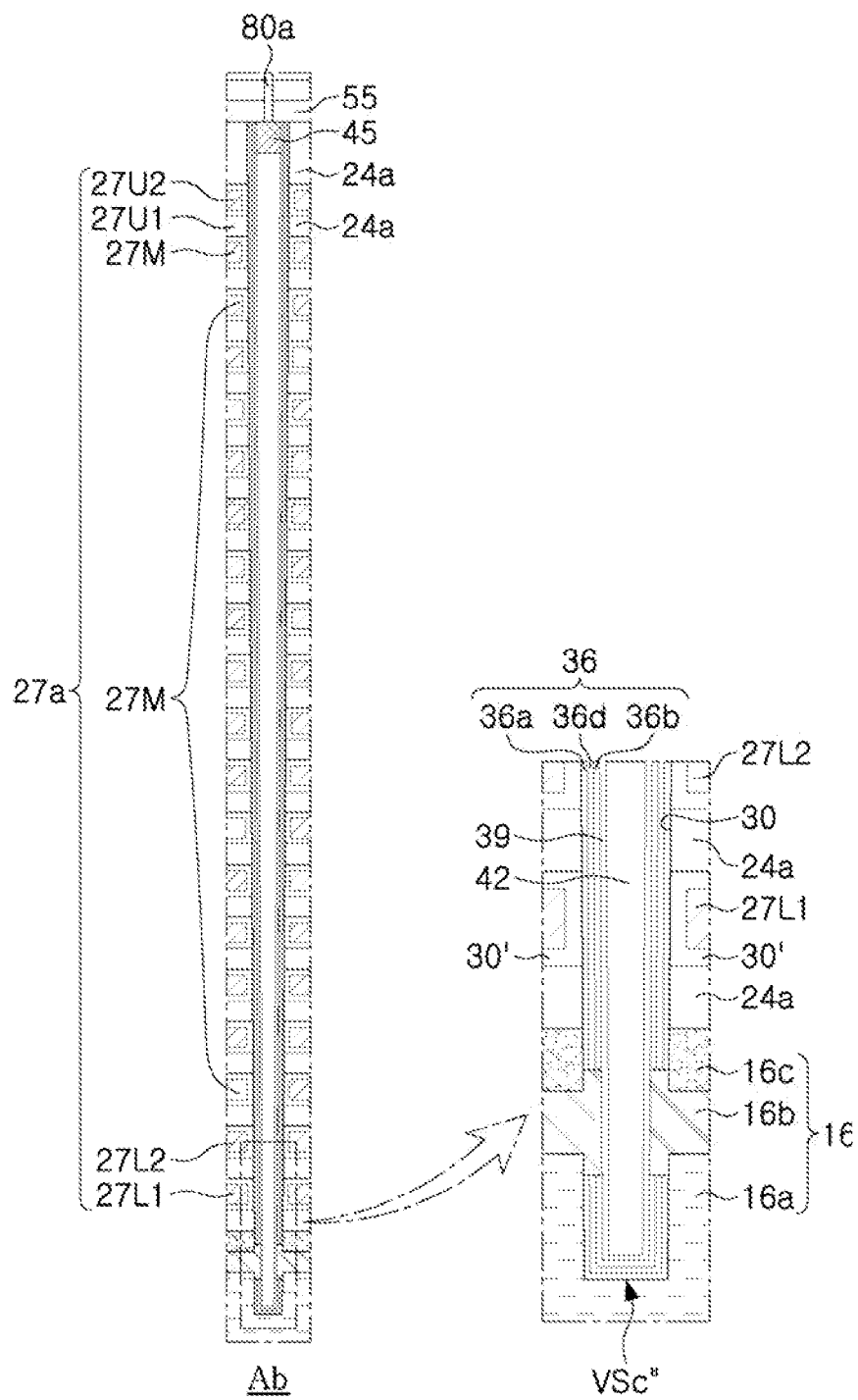
Figure 15B:
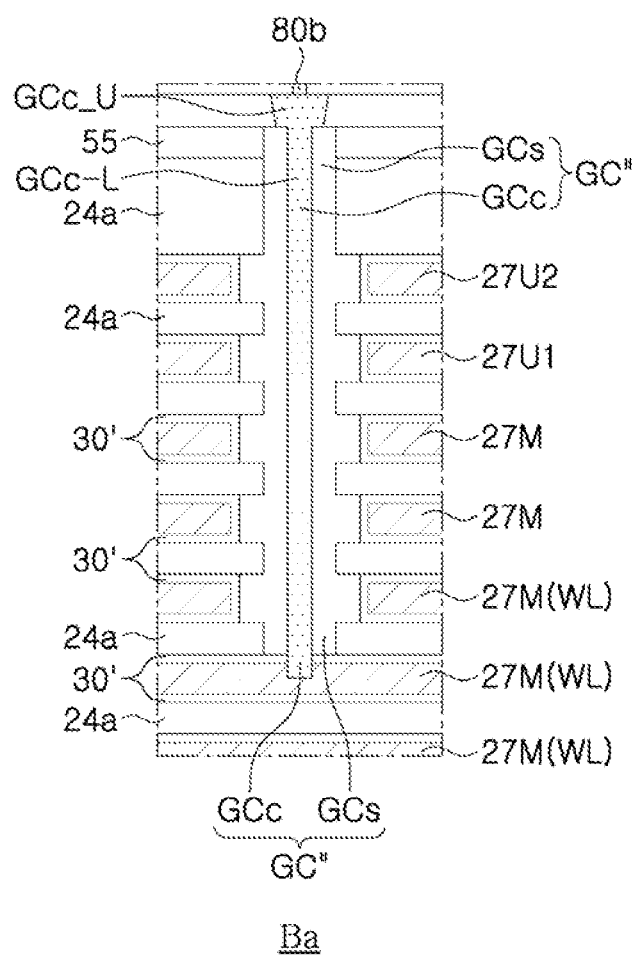

FIG. 13 is a cross-sectional diagram of a region taken along line I-I' in FIG. 2A, and may illustrate a portion modified from the example in FIG. 3. FIG. 14 is a cross-sectional diagram of a region taken along line II-II', and may illustrate a portion modified from the example in FIG. 4. FIG. 15A is an enlarged diagram of region "Ab" in FIG. 13, and may illustrate the modified portion from the example in FIG. 5A. FIG. 15B is an enlarged diagram of region "Ba" in FIG. 13, and may illustrate the portion modified from the example in FIG. 5B.

Referring to FIGS. 13 to 15B, the vertical memory structures VSc described with reference to FIG. 5B may be replaced with vertical memory structures VSc" in which the gate dielectric 30' is not provided. The semiconductor device 1 may further include a gate dielectric 30' covering upper and lower surfaces of each of the gate electrodes 27a, and covering a side surface of each of the gate electrodes 27a opposing the gate contact structures GC and the vertical memory structures VSc". The gate dielectric 30' may be formed of silicon oxide and/or a high-k dielectric.

The semiconductor device 1 may further include an additional insulating layer 56 disposed between the first upper insulating layer 55 and the second upper insulating layer 68.

The gate contact structures GC described with reference to FIG. 3 may be modified to gate contact structures GC" further including a portion extending into the additional insulating layer 56. For example, as described with reference to FIG. 3, the gate contact plugs GC" may include a gate contact plug GCc in contact with the gate electrodes 27a and a gate spacer GCs disposed on a side surface of the gate contact plug GCc, and the gate contact plug GCc may include an extended portion extending upwardly from a portion disposed in the first upper insulating layer 55 and penetrating through the additional insulating layer 56.

The gate spacers GCs may be disposed on a level lower than that of the additional insulating layer 56. A portion of the gate contact plug GCc penetrating through the additional insulating layer 56 may vertically overlap the gate spacers GCs.

The dummy structure 60 described with reference to FIG. 4 may include a liner 62 covering the internal wall of the etch stop detection hole 58d, and a dummy structure 60' including a gap-fill layer 65' filling the etch stop detection hole 58d on the liner 62. The liner 62 may be formed of a material different from that of the gate contact plugs GCc, e.g., an amorphous carbon layer. The gap-fill layer 65' may be formed of an insulating material, e.g., silicon oxide.

The block separation structures BSS (in FIGS. 3 and 6B), having upper surfaces disposed on a level lower than a level of the upper surfaces of the gate contact structures GC described with reference to FIGS. 1 to 6B, may be modified to the block separation structures BSS', having upper surfaces disposed on a level higher than a level of the upper surfaces of the gate contact structures GC. The block separation structures BSS' may extend upwardly by penetrating through the stack structure ST, and may penetrate the second upper insulating layer 68.

A modified example of a semiconductor device will now be described, referring to FIG. 16.

Figure 16:
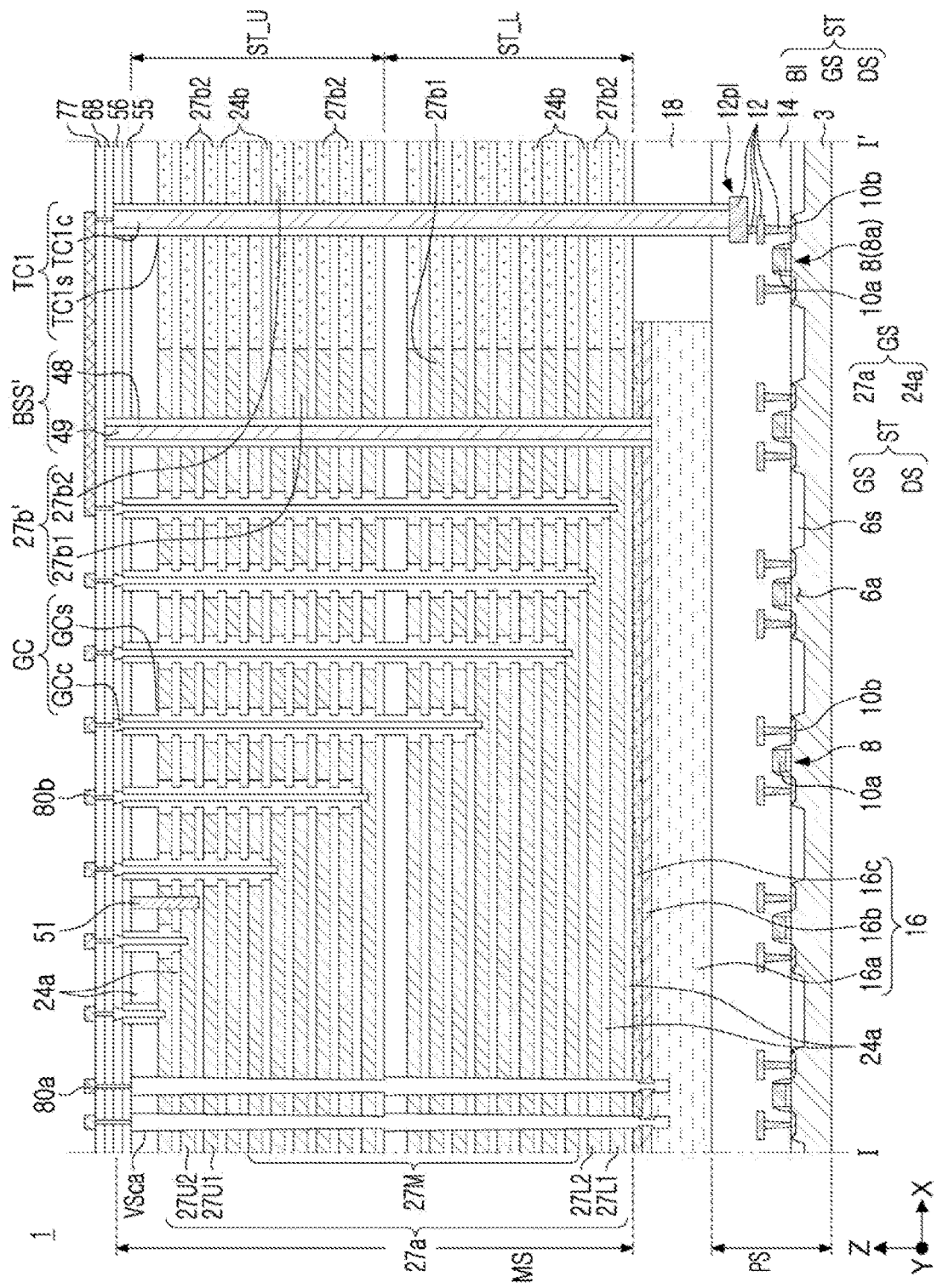
FIG. 16 is a cross-sectional diagram illustrating a modified example of a semiconductor device according to an example embodiment.

FIG. 16 is a cross-sectional diagram of a region taken along line I-I' in FIG. 2a, and may illustrate a portion modified from the example in FIG. 13.

Referring to FIG. 16, the stack structure ST in FIG. 13 may be modified to include the lower stack structure ST_L and the upper stack structure ST_U as in FIG. 9A. The vertical memory structures VSc in FIG. 13 may be replaced with vertical memory structures VSca having substantially the same structure as the vertical memory structures VSc' in FIGS. 9A and 9B.

A modified example of a semiconductor device will now be described, referring to FIGS. 17A and 17B.

Figure 17A:
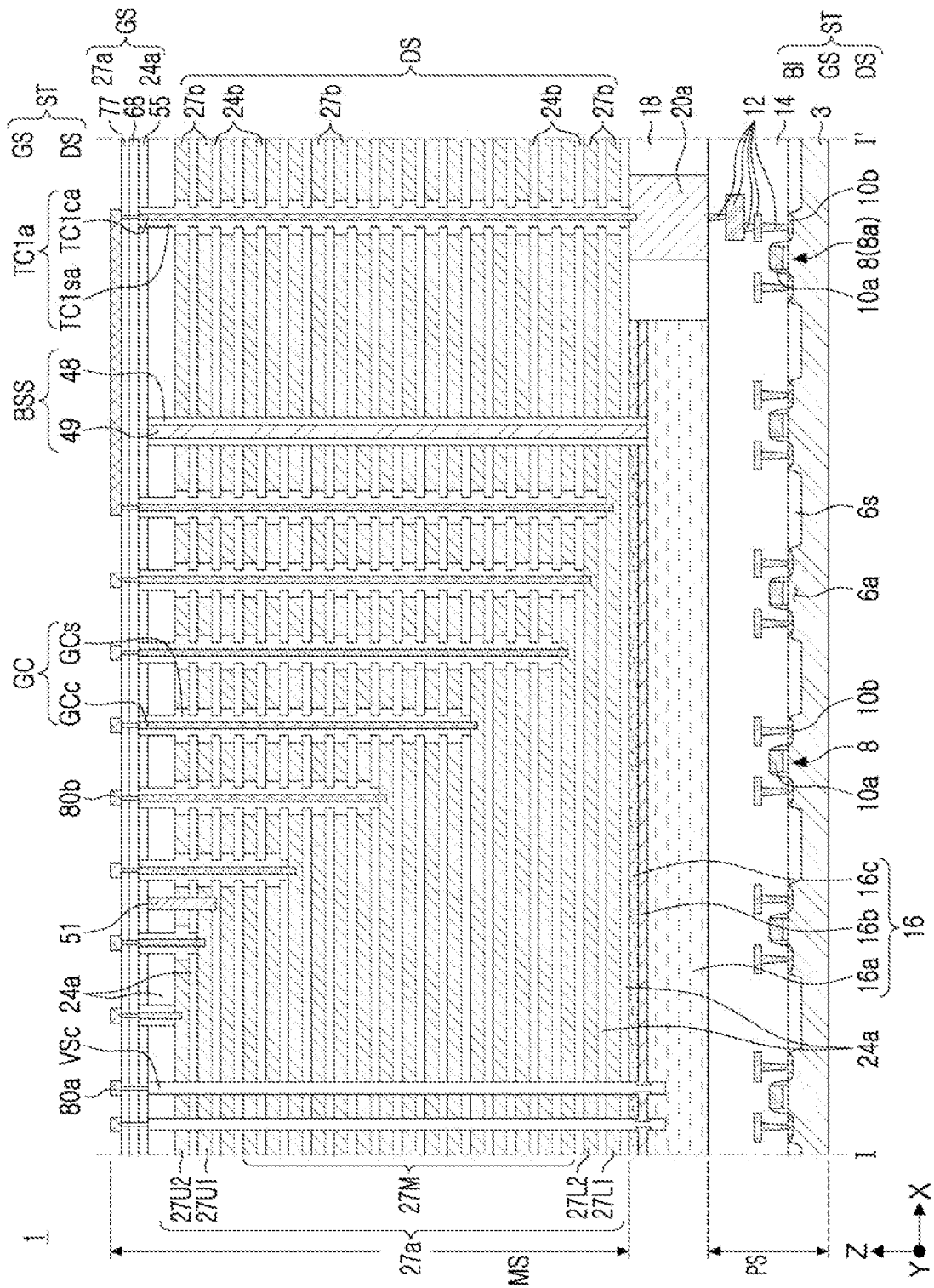
FIGS. 17A and 17B are diagrams illustrating a modified example of a semiconductor device according to an example embodiment.

FIG. 17A is a cross-sectional diagram of a region taken along line I-I' in FIG. 2A, and may illustrate a portion modified from the example in FIG. 3. FIG. 17B is a diagram of a region taken along line III-III', in FIG. 6A, and may illustrate a portion modified from the example in FIG. 6B.

Figure 17B:
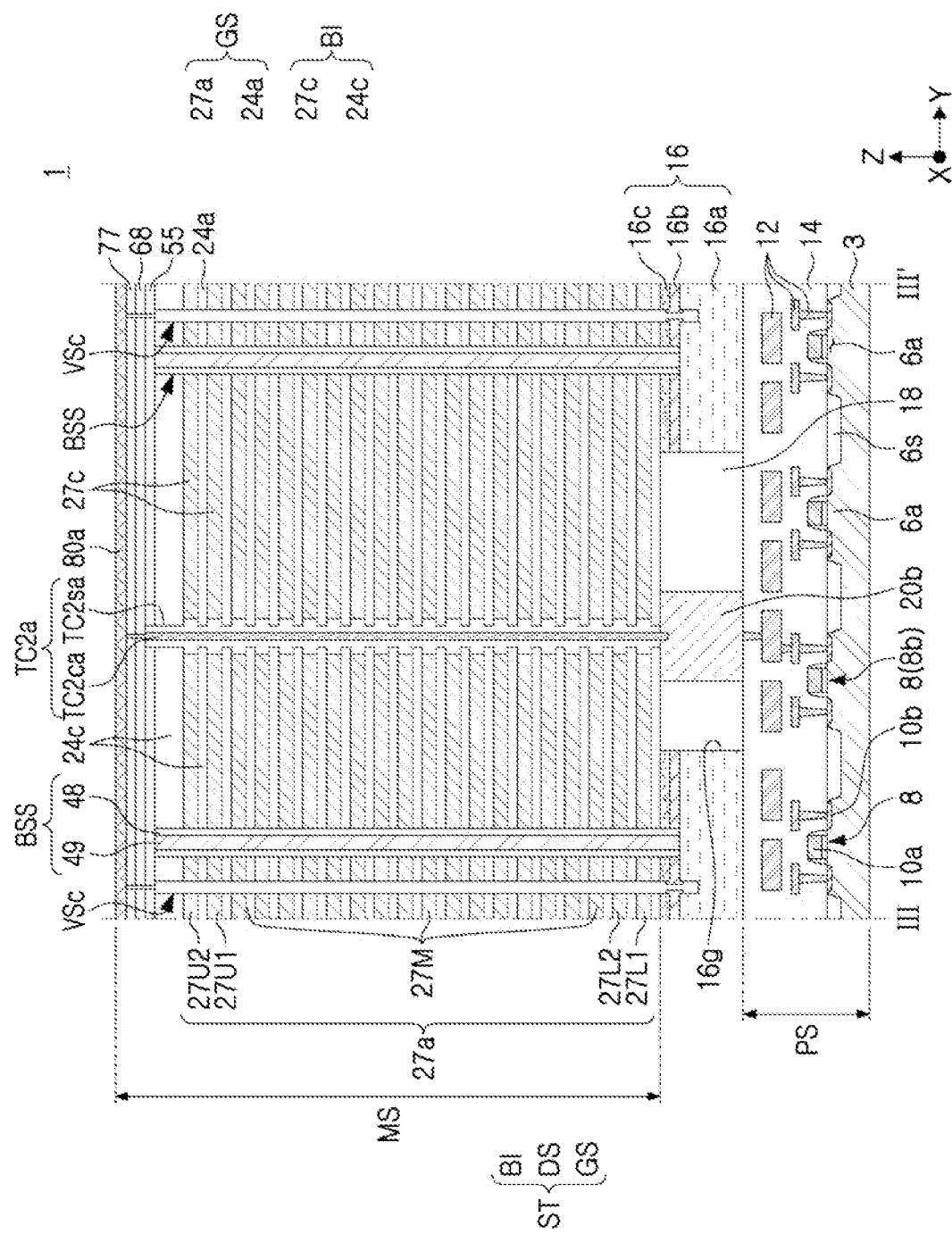

Referring to FIGS. 17A and 17B, the semiconductor device 1 may include a first pad pattern 20a and a second pad pattern 20b disposed in the dummy region 18 and including a conductive material. The first and second pad patterns 20a and 20b may include at least one of, e.g., doped silicon or a metal material. The first pad pattern 20a may be electrically connected to the first peripheral circuit 8a via the circuit wiring 12. The second pad pattern 20b may be electrically connected to the second peripheral circuit 8b via the circuit wiring 12. The first through contact structure TC1 in FIG. 3 may be modified to the first through contact structure TC1a as in FIG. 17A. The second through contact structure TC2 in FIG. 6B may be modified to the second through contact structure TC2a as in FIG. 17B.

The first through contact structure TC1a may be in contact with the first pad pattern 20a. The second through contact structure TC2a may be in contact with the second pad pattern 20b.

The first through contact structure TC1a and the second through contact structure TC2a may have a shape similar to that of the gate contact plugs GC. For example, each of the first and second through contact structures TC1a and TC2a may have a relatively narrow width on the same level as a level of the second and third interlayer insulating layers 24b and 24c. Each of the first and second through contact structures TC1a and TC2a may include through contact plugs TC1ca and TC2ca, and insulating spacers TC1sa and TC2sa surrounding side surfaces of the through contact plugs TC1ca and TC2ca. The through contact plugs TC1ca and TC2ca may be formed of the same conductive material as that of the gate contact plugs GCc. The insulating spacers TC1sa and TC2sa may be formed of the same insulating material as that of the gate spacers GCs.

A modified example of a semiconductor device will now be described, referring to FIGS. 18A and 18B.

Figure 18A:
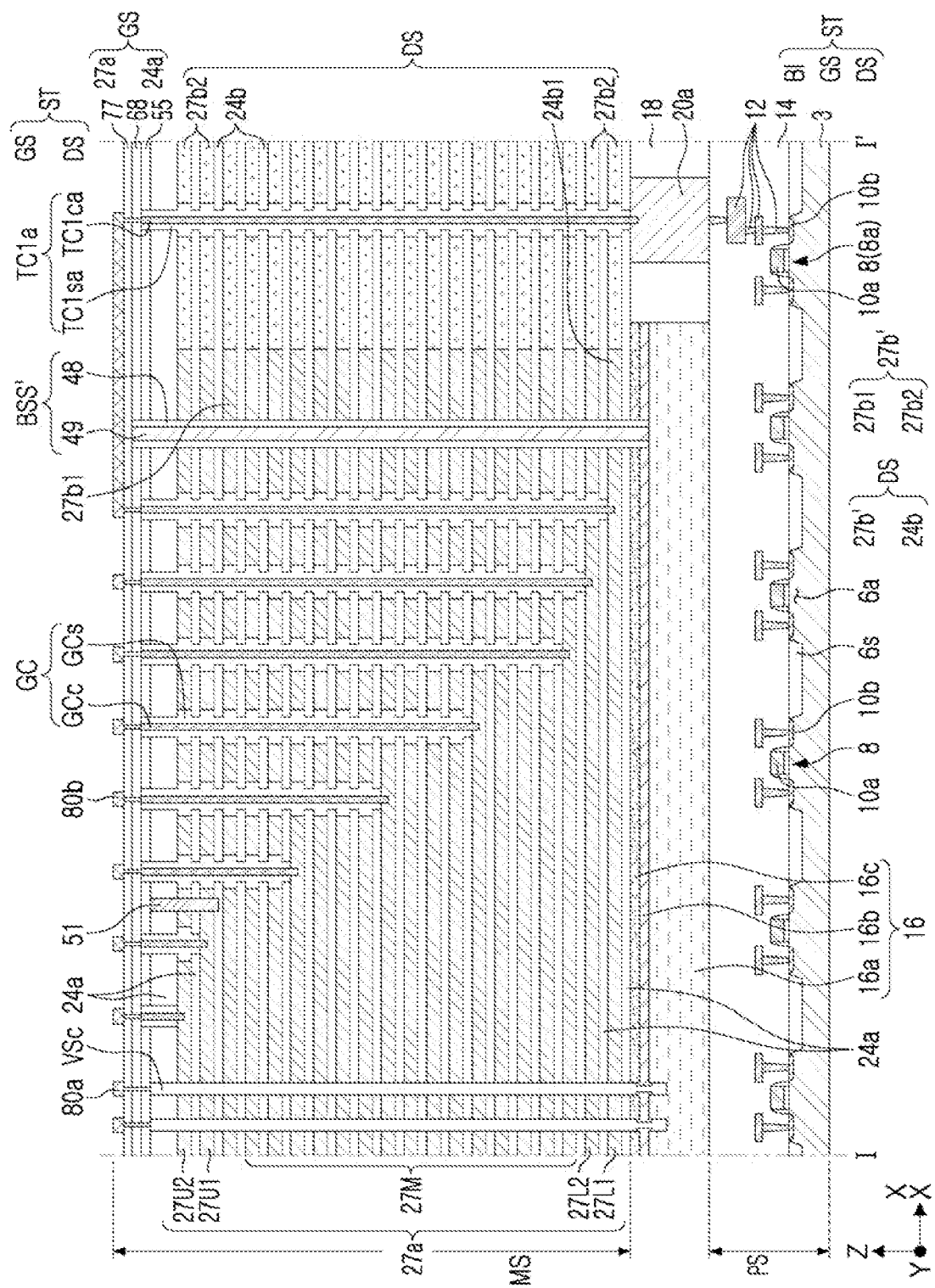
FIGS. 18A and 18B are diagrams illustrating a modified example of a semiconductor device according to an example embodiment.

FIG. 18A is a cross-sectional diagram of a region taken along line I-I' in FIG. 2A, and may illustrate a portion modified from the example in FIGS. 3 and 17A. FIG. 18B is a cross-sectional diagram taken along line III-III' in FIG. 6A, and may illustrate a portion modified from the example in FIGS. 6B and 17B.

Figure 18B:
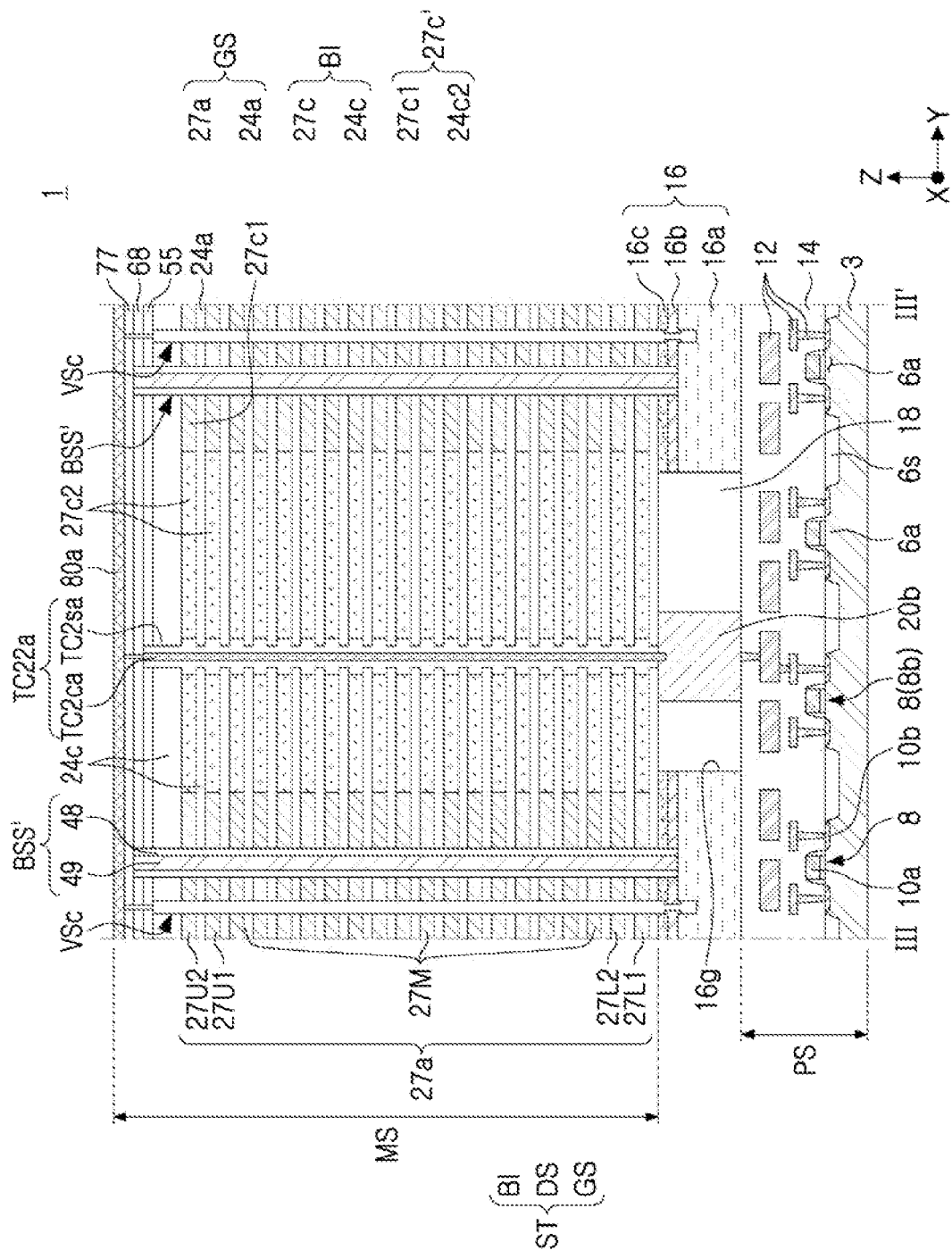

Referring to FIGS. 18A and 18B, the first dummy horizontal layers 27b of the dummy stack region DS described with reference to FIGS. 3 and 4 may be modified to the first dummy horizontal layers 27b' including the first portion 27b1 and the second portion 27b2 substantially the same as the example described with reference to FIG. 10. The first through contact structure TC1a described with reference to FIG. 17A may penetrate the second portions 27b2 of the first dummy horizontal layers 27b', and may be in contact with the first pad pattern 20a.

The second dummy horizontal layers 27c in the bit line connection region BI described with reference to FIG. 6B may be modified to second dummy horizontal layers 27c' including the third portion 27c1 and the fourth portion 27c2 as in FIG. 11. The second through contact structure TC2a described with reference to FIG. 17B may penetrate the fourth portions 27c2 of the second dummy horizontal layers 27c', and may be in contact with the second pad pattern 20b.

The block separation structures BSS (in FIGS. 3 and 6B) described with reference to FIGS. 1 to 6B may be modified to the block separation structures BSS' described in the aforementioned example embodiment with reference to FIG. 10.

A modified example of a semiconductor device will now be described, referring to FIG. 19.

Figure 19:
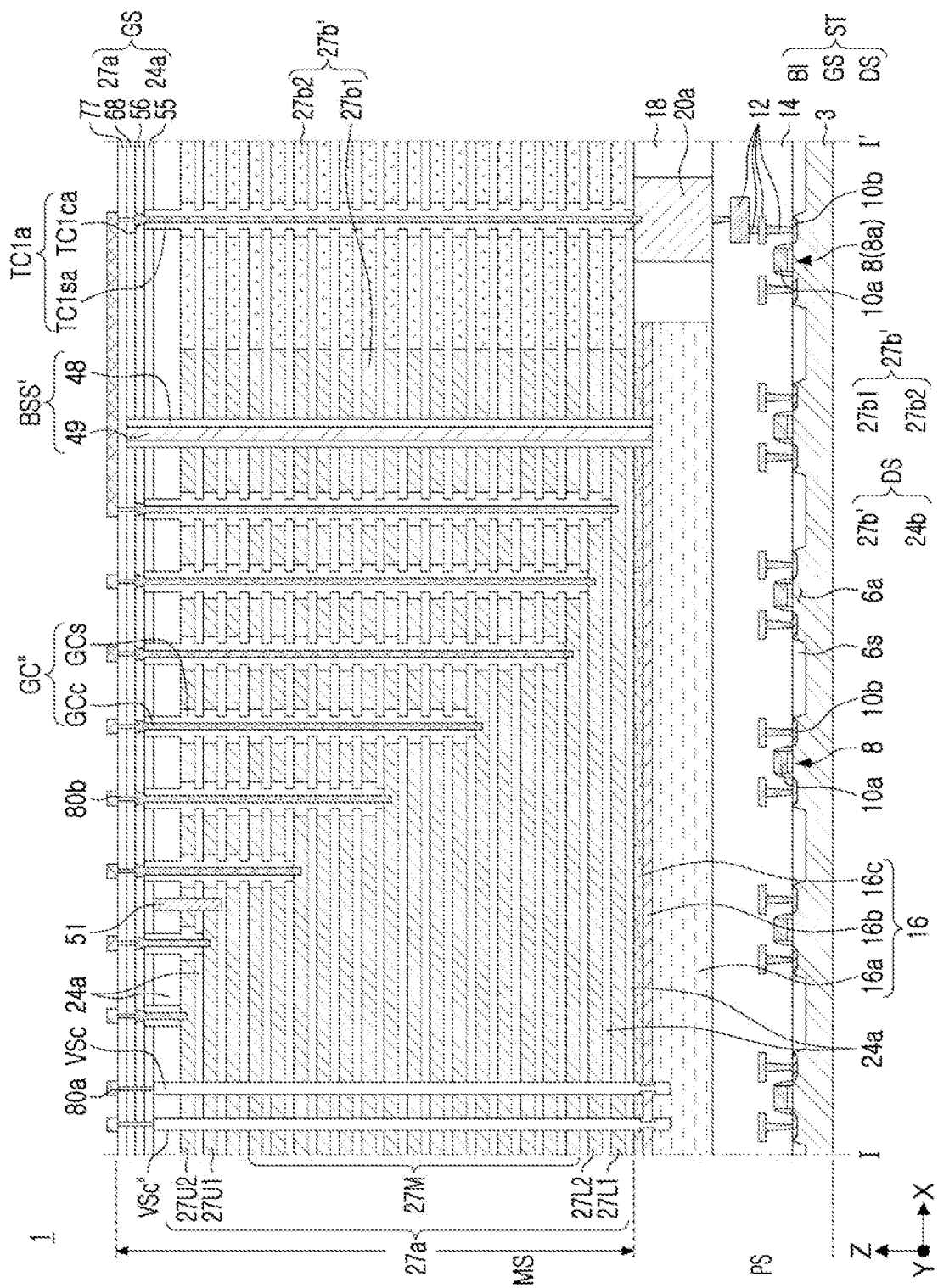
FIG. 19 is a cross-sectional diagram illustrating a modified example of a semiconductor device according to an example embodiment.

FIG. 19 is a cross-sectional diagram of a region taken along line I-I' in FIG. 2A, and may illustrate a portion modified from the example in FIG. 13.

Referring to FIG. 19, the semiconductor device 1 may include the first pad pattern 20a disposed in the dummy region 18 as illustrated in FIG. 17A and including a conductive material. The semiconductor device 1 may include the stack structure ST as illustrated in FIG. 13. The first through contact structure TC1 as illustrated in FIG. 13 may be replaced with a first through contact structure TC1a penetrating through the second portions 27b2 of the horizontal layers 27b', and in contact with the first pad pattern 20a described with reference to FIG. 13.

The first through contact structure TC1a may include a portion extending into the additional insulating layer 56, as described with reference to FIG. 13. The first through contact structure TC1a may include a through contact plug TC1ca in contact with the first pad pattern 20a, extending upwardly, and penetrating up to the additional insulating layer 56, and an insulating spacer TC1s disposed on the side surface of the through contact plug TC1ca below the additional insulating layer 56. The first through contact structure TC1a may have a shape similar to that of the gate contact plugs GC. For example, the first through contact structure TC1a may have a relatively narrow width on the same level as that of the second interlayer insulating layers 24b. The through contact plug TC1ca may be formed of the same material as that of the gate contact plugs GCc. The insulating spacer TC1sa may be formed of the same material as that of the gate spacers GCs. The block separation structures BSS (in FIGS. 3 and 6B) described with reference to FIGS. 1 to 6B may be modified to the block separation structures BSS' described with reference to FIG. 16.

Figure 20:
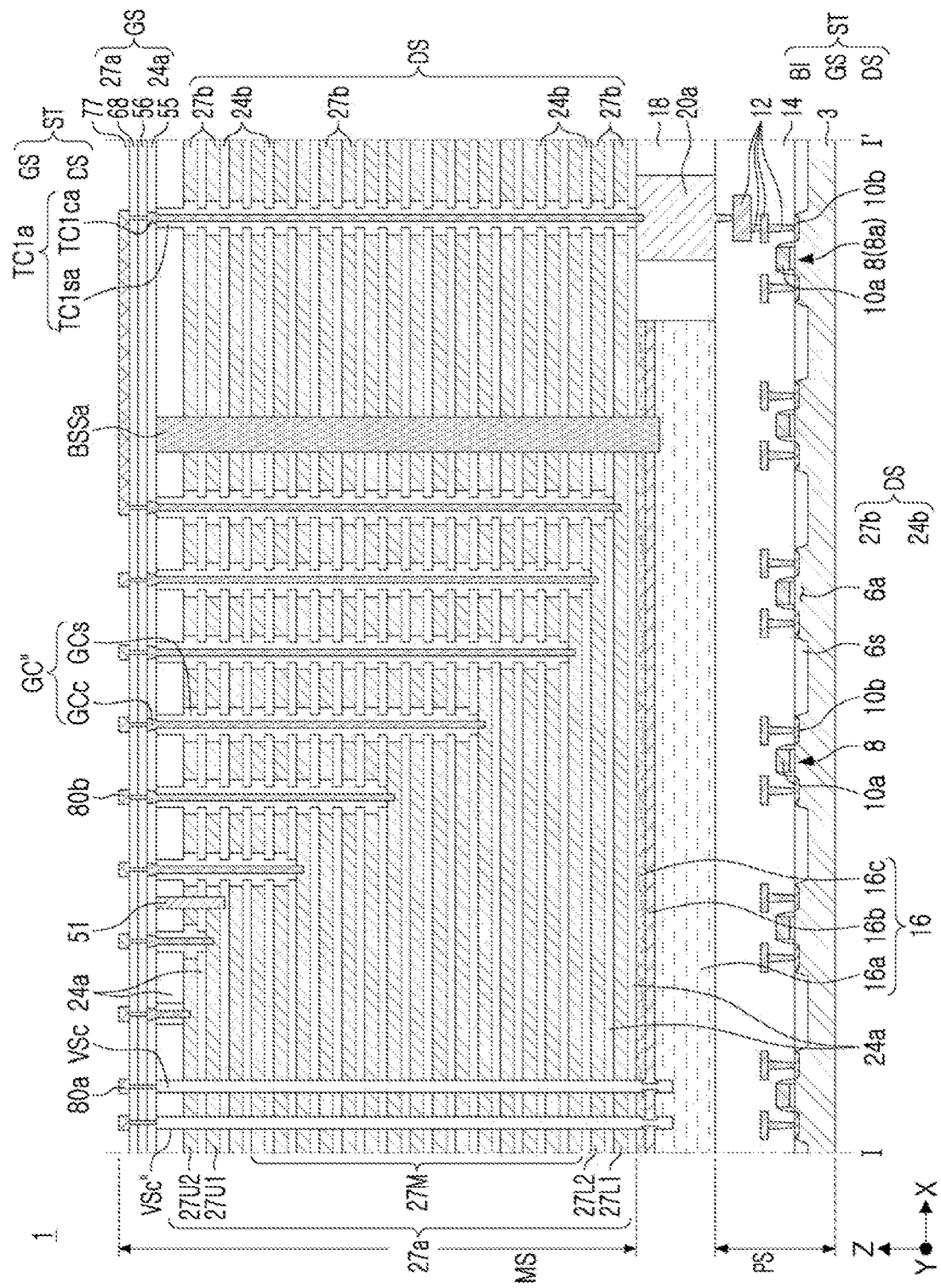
FIG. 20 is a cross-sectional diagram illustrating a modified example of a semiconductor device according to an example embodiment.

A modified example of a semiconductor device will now be described, referring to FIG. 20. FIG. 20 is a cross-sectional diagram of a region taken along line I-I' in FIG. 2A, and may illustrate a portion modified from the example in FIG. 19.

Referring to FIG. 20, the vertical memory structures VSc, the gate contact structures GC", the block separation structures BSSa, and the through contact structures TC1a may include portions formed by the same process. For example, openings for forming the vertical memory structures VSc", the gate contact structures GC", the block separation structures BSSa, and the through contact structures TC1a may be simultaneously formed, sacrificial layers filling the openings may be formed, the upper insulating layer may be stacked, and the sacrificial layers in the openings may be removed in order while an opening penetrating through the upper insulating layer may be formed, such that intended components may be formed in the openings. For example, upper surfaces of the vertical memory structures VSc" may be disposed on a level the same as a level of a slope changing portion of a side surface of each of the contact structures GC" and the through contact structures TC1a. The slope changing portion of a side surface of each of the contact structures GC" and the through contact structures TC1a may be disposed in a boundary region between the stack structure ST and the first upper insulating layer 55.

Upper surfaces of the block separation structures BSSa may be disposed on the same level as a level of the slope changing portion of a side surface of each of the through contact structures TC1a.

A modified example of a semiconductor device will now be described, referring to FIG. 21.

Figure 21:
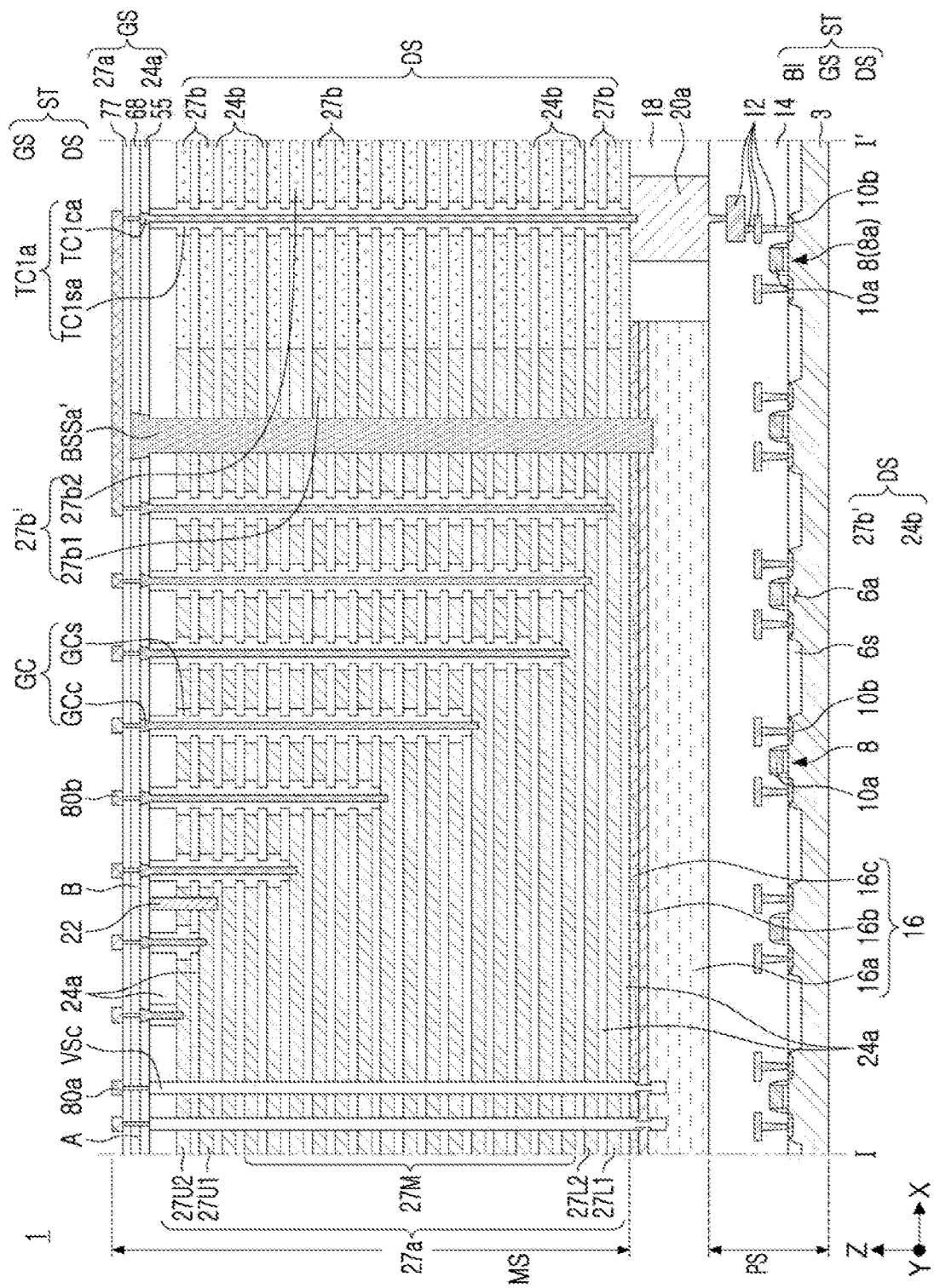
FIG. 21 is a cross-sectional diagram illustrating a modified example of a semiconductor device according to an example embodiment.

FIG. 21 is a cross-sectional diagram of a region taken along line I-I' in FIG. 2A, and may illustrate a portion modified from the example in FIG. 19.

Referring to FIG. 21, the block separation structures BSS' described with reference to FIG. 19 may be modified to the block separation structures BSSa' as in FIG. 21. As described with reference to FIG. 20, the vertical memory structures VSc, the gate contact structures GC", the block separation structures BSSa', and the through contact structures TC1a may include portions formed by the same process.

Upper surfaces of the vertical memory structures VSc" may be disposed on a level the same as a level of a slope changing portion of a side surface of each of the gate contact structures GC", the through contact structures TC1a, and the block separation structures BSSa'. The slope changing portion of a side surface of each of the gate contact structures GC", the through contact structures TC1a, and the block separation structures BSSa' may be disposed in a boundary region between the stack structure ST and the upper insulating layers 55.

In the block separation structure BSSa', a width of a portion penetrating through the first and second upper insulating layers 55 and 68 may be different from a width of a portion penetrating through the stack structure ST. For example, in the block separation structure BSSa', a width of a portion penetrating through the first and second upper insulating layers 55 and 68 may be greater than a width of a portion penetrating through the stack structure ST.

A modified example of a semiconductor device will now be described, referring to FIG. 22.

Figure 22:
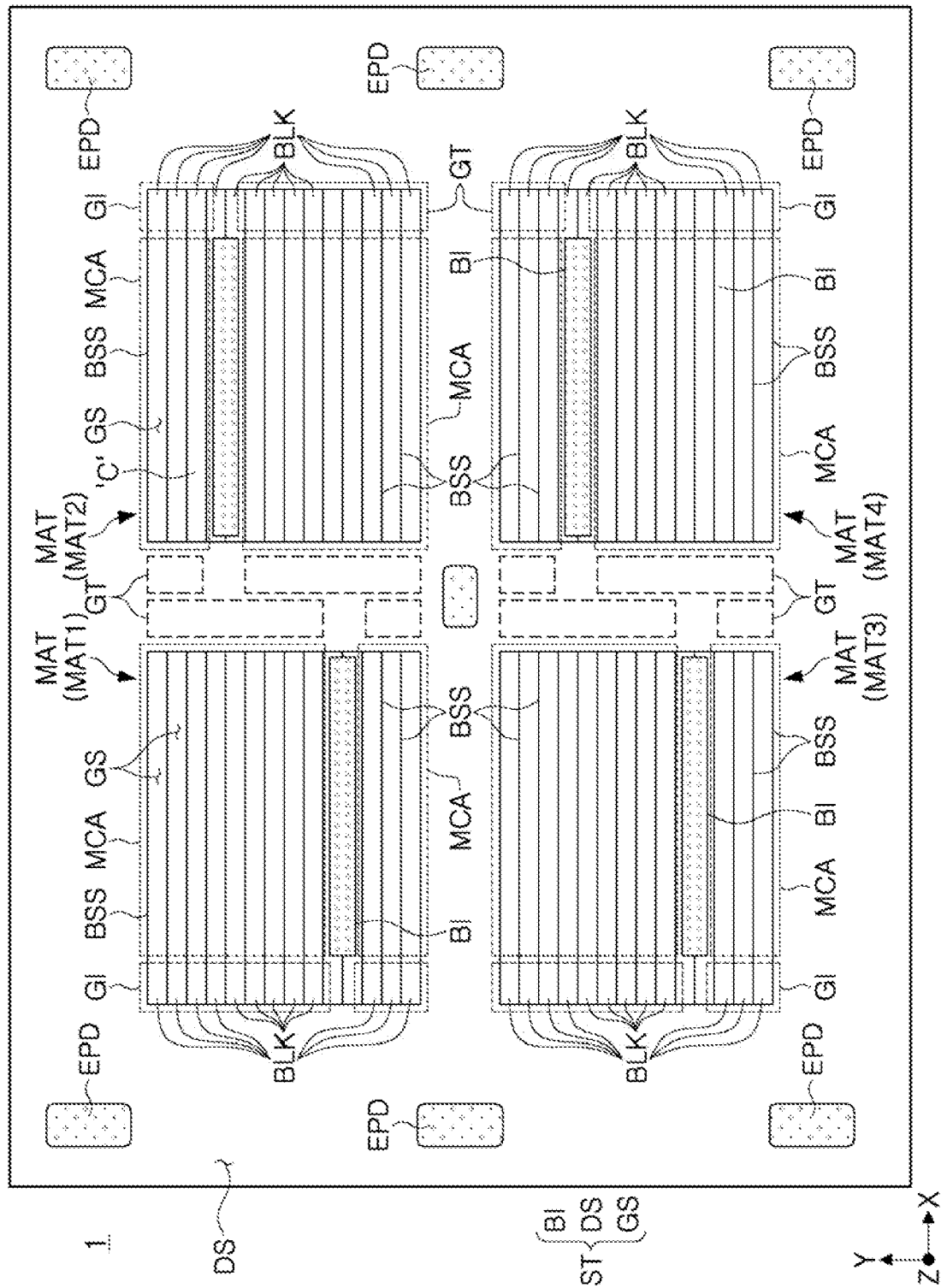
FIG. 22 is a diagram illustrating a modified example of a semiconductor device according to an example embodiment, viewed from above.

FIG. 22 is a diagram of a modified example of a semiconductor device according to an example embodiment, viewed from above, and is a diagram of a modified example of the through contact regions GT in FIG. 1.

Referring to FIG. 22, in FIG. 1, the plurality of memory mats MAT may be disposed between the through contact regions GT. Referring to FIG. 22, the through contact regions GT in FIG. 1 may be modified to be disposed in a region between the plurality of memory mats MAT adjacent to each other in the first direction X.

A modified example of a semiconductor device in an example embodiment will now be described, referring to FIG. 23.

Figure 23:
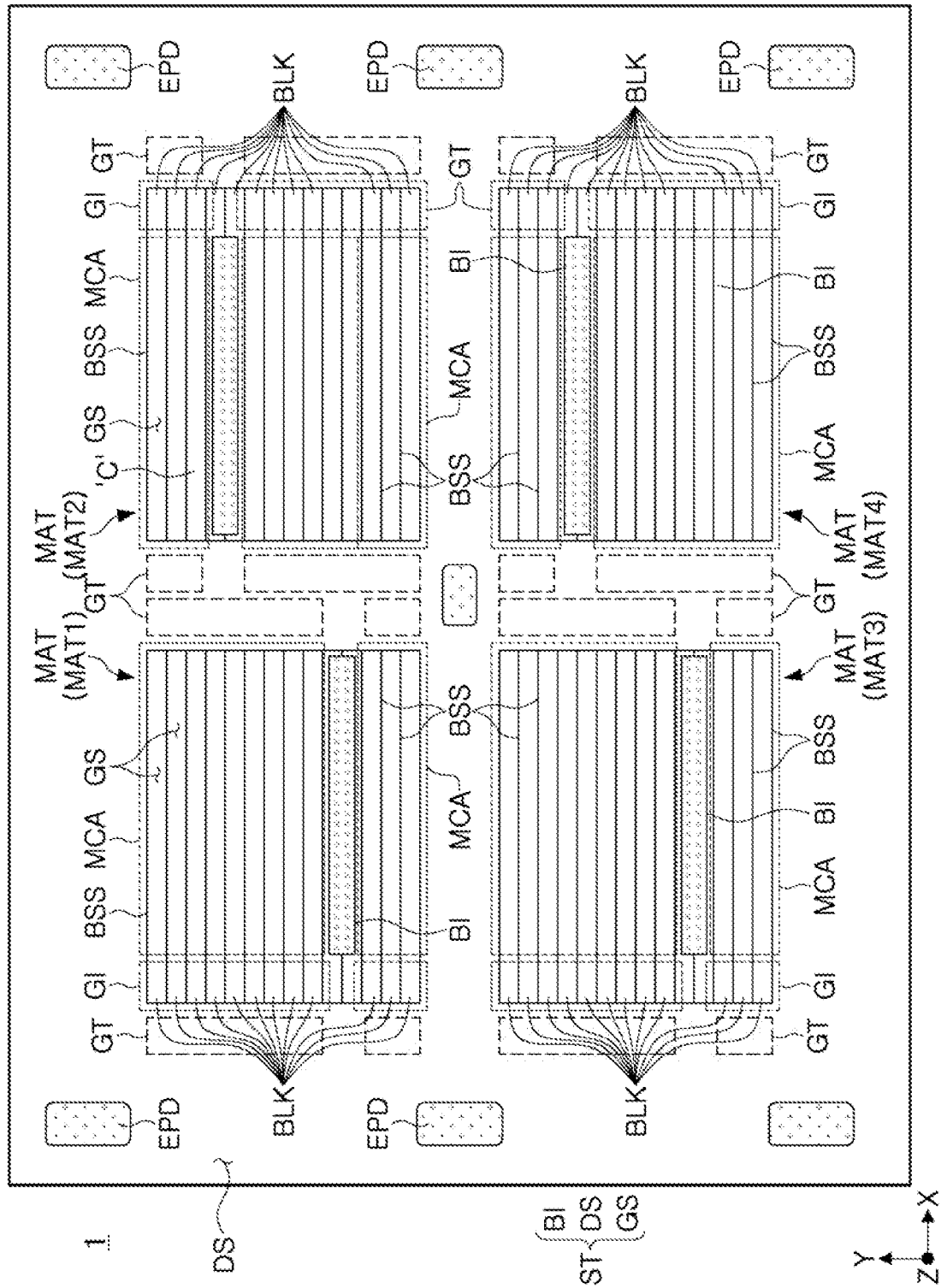
FIG. 23 is a diagram illustrating a modified example of a semiconductor device according to an example embodiment, viewed from above.

FIG. 23 is a diagram of a modified example of a semiconductor device according to an example embodiment, viewed from above, and is a diagram of a modified example of the through contact regions GT in FIG. 1.

Referring to FIG. 23, the through contact regions GT in FIG. 1 may be modified to be disposed on both sides of each of the plurality of memory mats MAT. For example, one of the memory mat MAT1 may be disposed between the through contact regions GT on both sides.

A modified example of a semiconductor device will now be described, referring to FIGS. 24 and 25.

Figure 24:
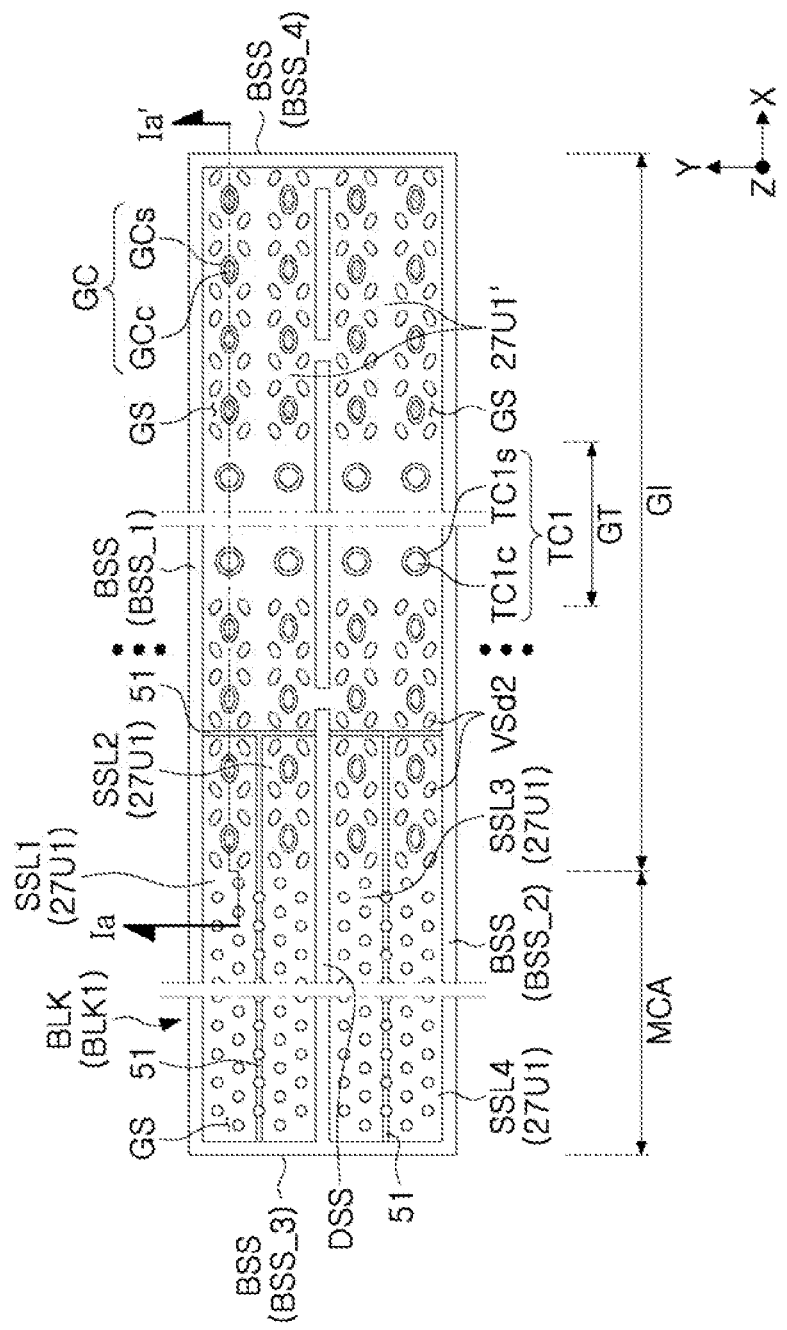
FIGS. 24 and 25 are diagrams illustrating a modified example of a semiconductor device according to an example embodiment, viewed from above.

FIG. 24 is a diagram of a modified example of a semiconductor device according to an example embodiment, viewed from above, and is a diagram of a portion modified from the example in FIG. 2A. FIG. 25 is a cross-sectional diagram taken along line Ia-Ia' in FIG. 24, and is a diagram of a portion modified from the example in FIG. 3.

Figure 25:
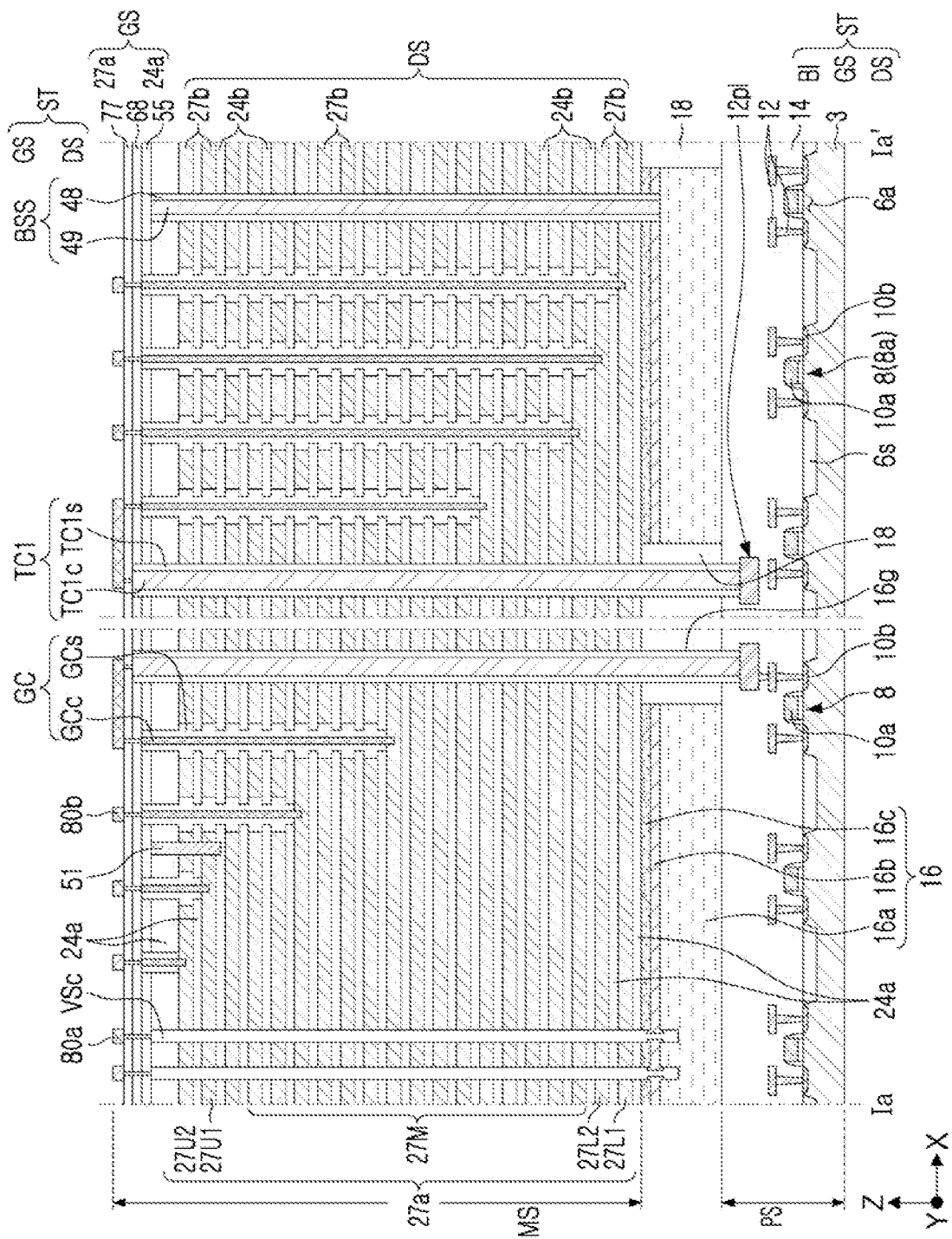

Referring to FIGS. 24 and 25, the through contact region GT in FIGS. 1 to 3 may be modified to be disposed in the gate connection region GI as in FIG. 24. Thus, the first through contact structures TC1 described with reference to FIGS. 2A to 2C and 3 may penetrate the through contact region GT in the gate connection region GI, and may be electrically connected to the first peripheral circuit 8a. The plate pattern 16 may have a gap 16g below the through contact region GT. The dummy region 18 may be disposed in the gap 16g. The first through contact structures TC1 may penetrate the dummy region 18, may extend downward, and may be in contact with the first peripheral pad 12p1 of the circuit wiring 12 electrically connected to the first peripheral circuit 8a.

A modified example of a semiconductor device will now be described, referring to FIG. 26.

Figure 26:
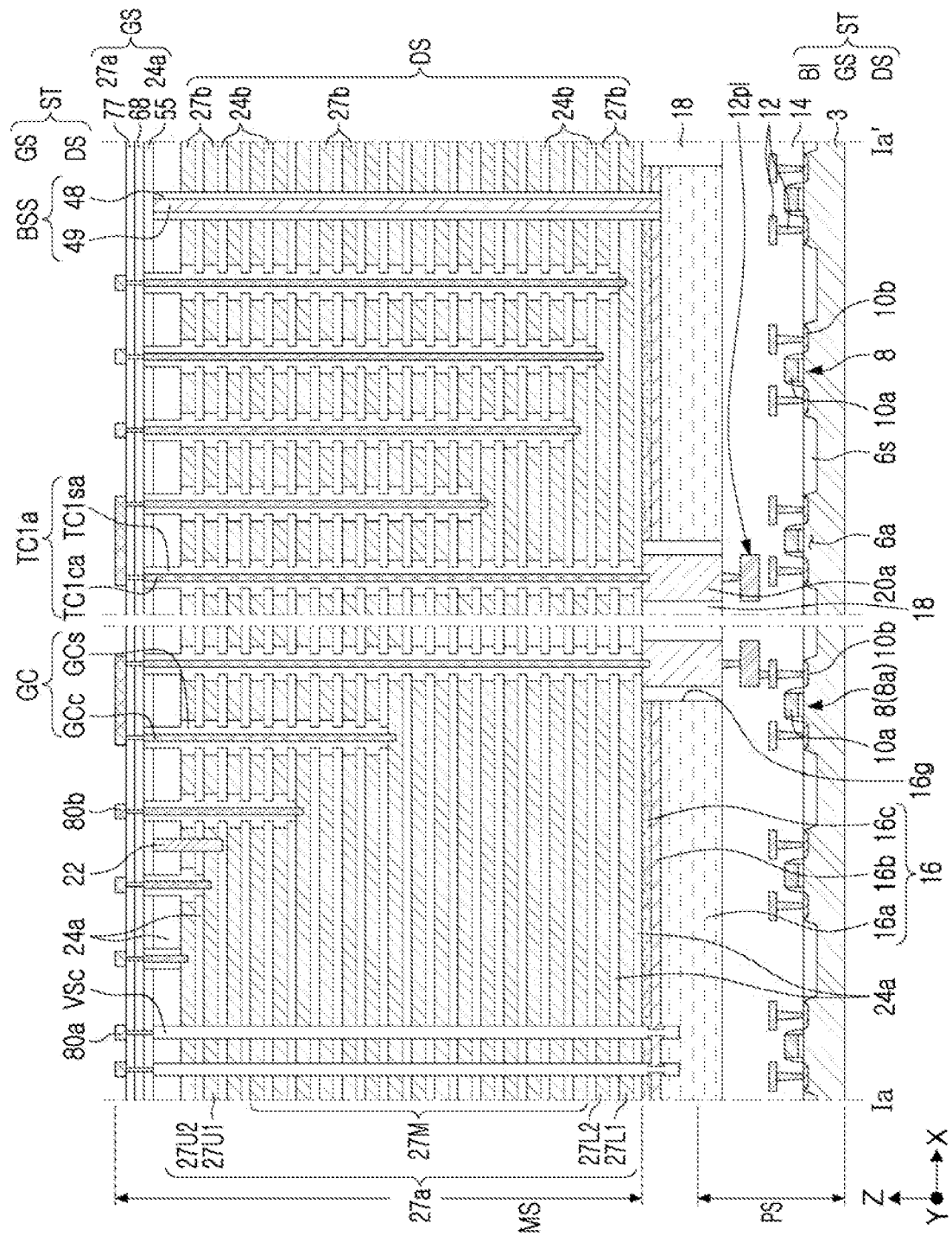
FIG. 26 is a cross-sectional diagram illustrating a modified example of a semiconductor device according to an example embodiment.

FIG. 26 is a cross-sectional diagram of a region taken along line Ia-Ia' in FIG. 24, and is a diagram of a portion modified from the example in FIG. 25.

Referring to FIG. 26, the first pad patterns 20a substantially the same as those described with reference to FIG. 17A may be disposed in the dummy region 18 in the gap 16g described with reference to FIG. 25. The first through contact structures TC1 described with reference to FIG. 25 may be replaced with the first through contact structures TC1a having substantially the same structure as the first through contact structures TC1a described with reference to FIG. 17A. Thus, the first through contact structure TC1a in FIG. 26 may penetrate the gate stack region GS and may be in contact with the first pad pattern 20a.

A modified example of a semiconductor device will now be described, referring to FIGS. 27 and 28.

Figure 27:
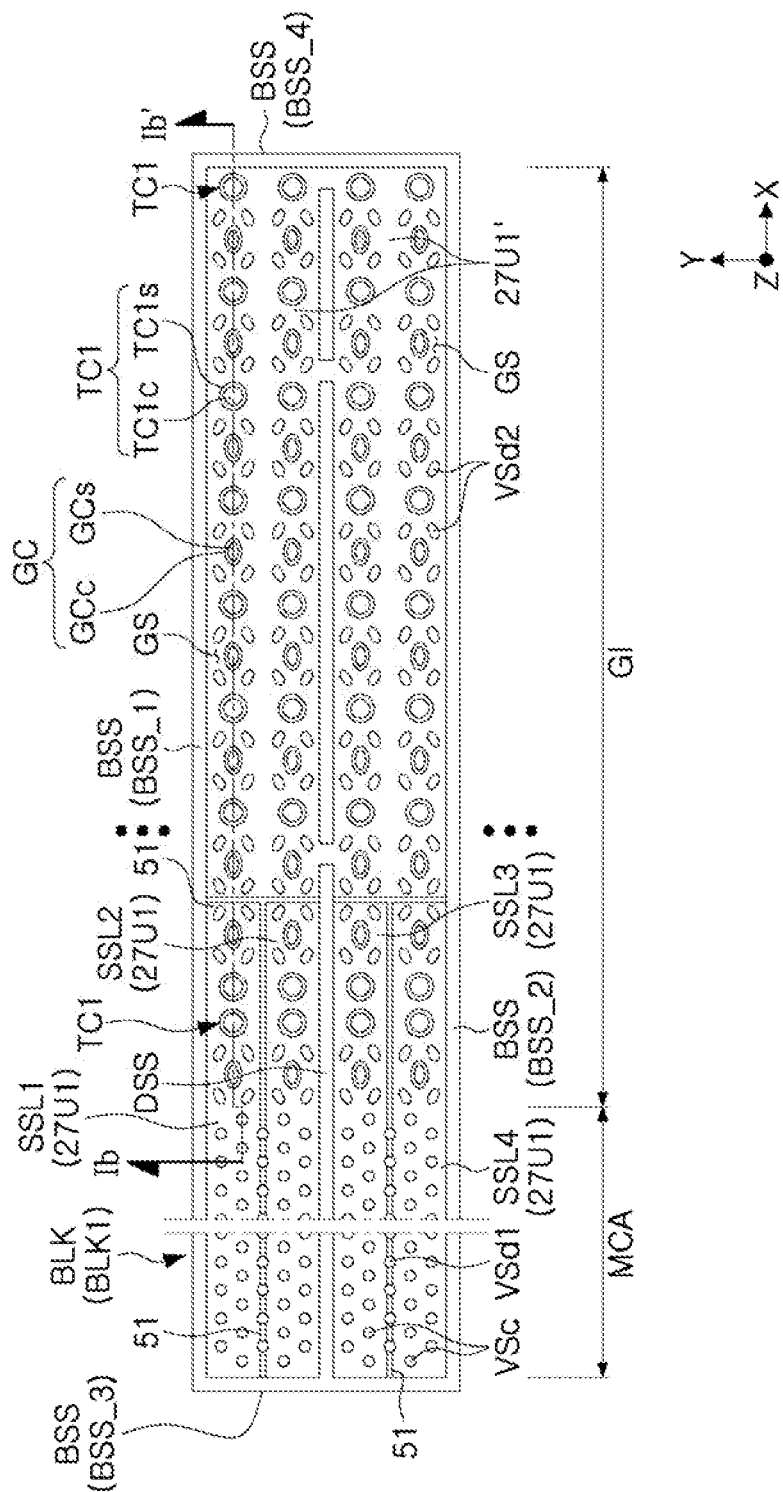
FIGS. 27 and 28 are diagrams illustrating a modified example of a semiconductor device according to an example embodiment.

FIG. 27 is a diagram of a modified example of a semiconductor device according to an example embodiment, and is a diagram of a portion modified from the example in FIG. 24. FIG. 28 is a cross-sectional diagram taken along line Ib-Ib' in FIG. 27, and is a diagram of a portion modified from the example in FIG. 25.

Figure 28:
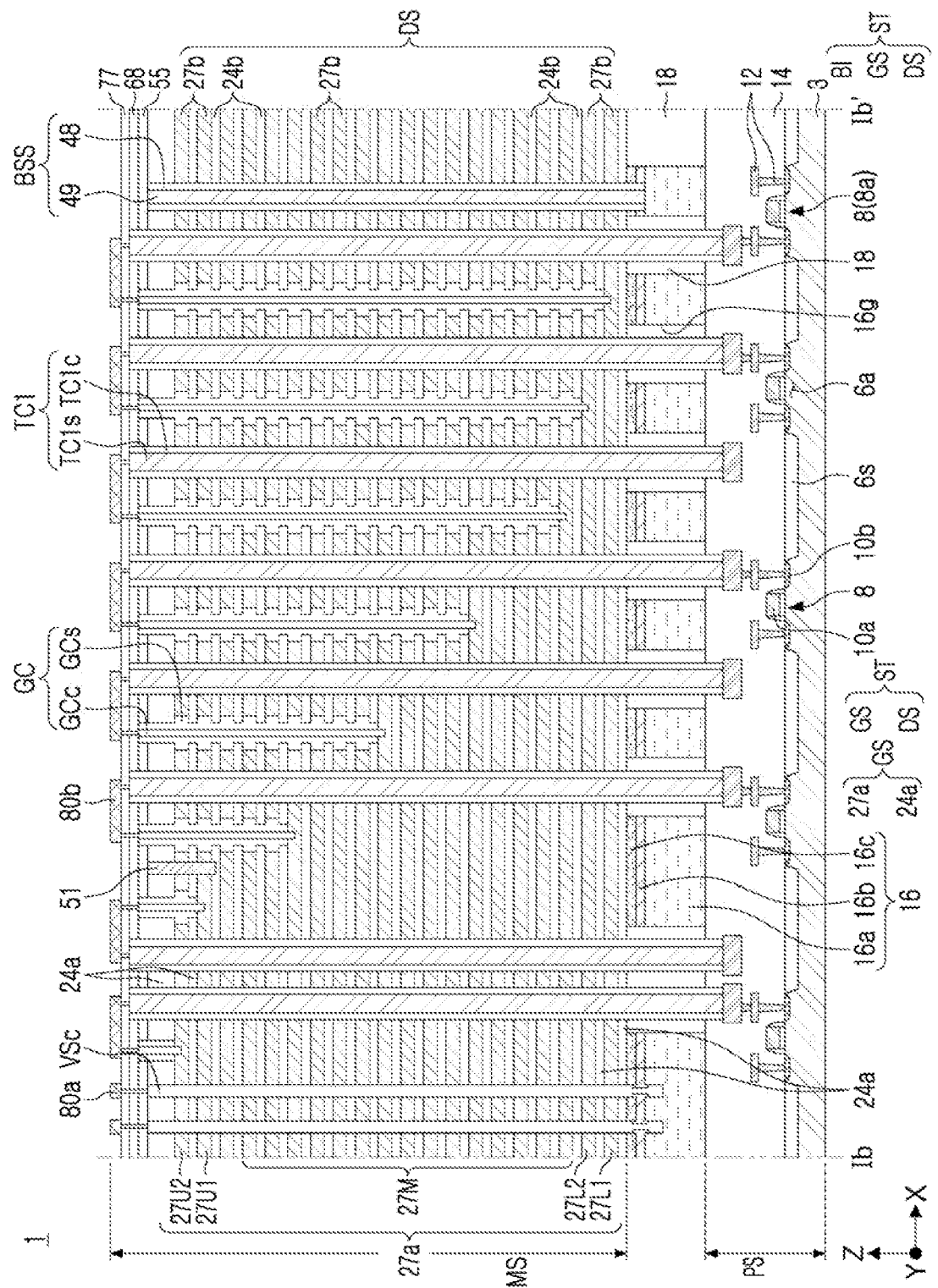

Referring to FIGS. 27 and 28, the first through contact structures TC1 described with reference to FIGS. 24 and 25 may be alternately arranged with the gate contact structures GC in the first direction X.

A modified example of a semiconductor device will now be described, referring to FIG. 29.

Figure 29:
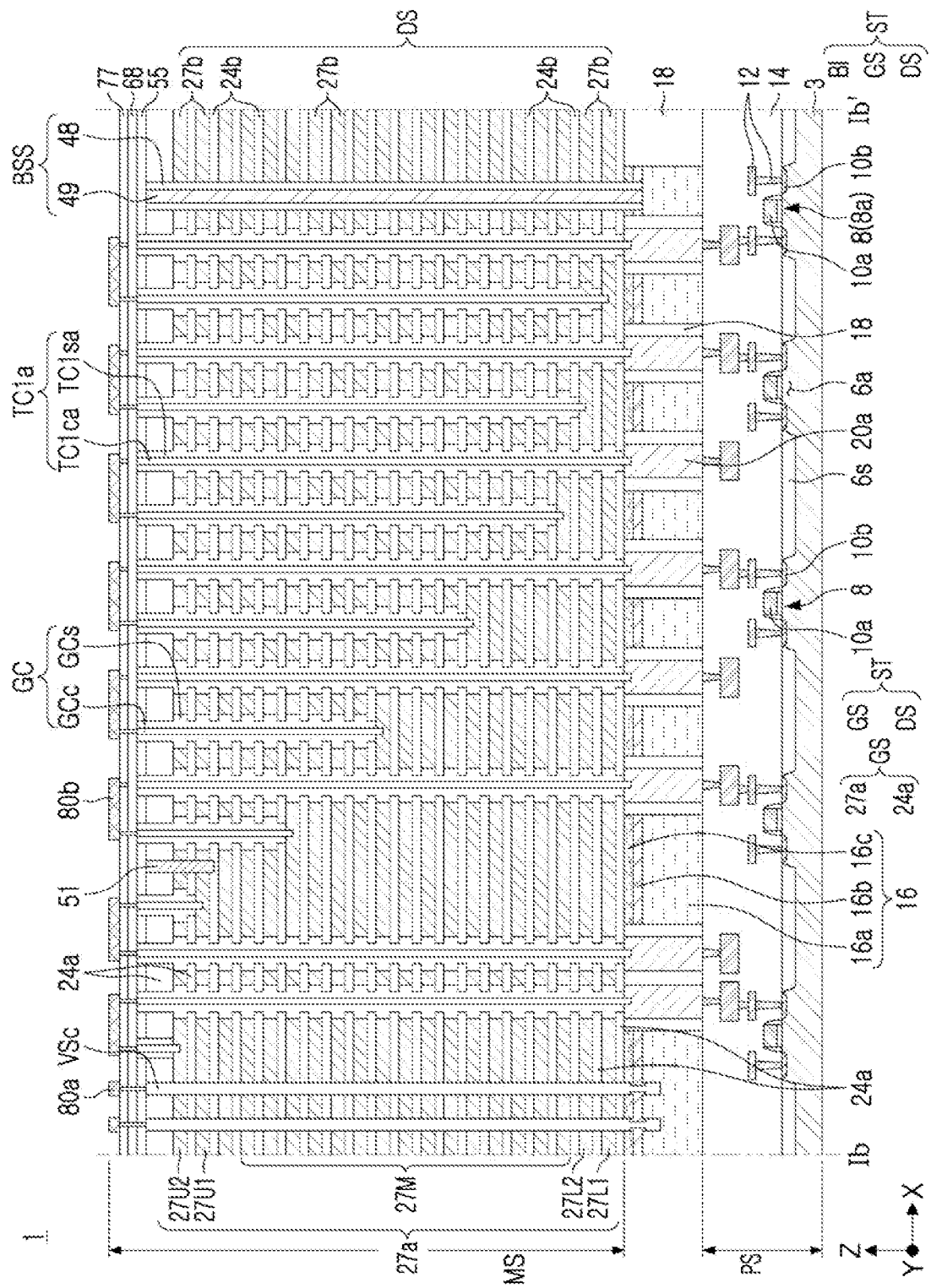
FIG. 29 is a cross-sectional diagram illustrating a modified example of a semiconductor device according to an example embodiment.

FIG. 29 is a cross-sectional diagram of a region taken along line Ib-Ib' in FIG. 27, and is a diagram of a portion modified from the example in FIG. 28.

Referring to FIG. 29, the plate pattern 16 may have gaps 16g below the gate connection region GI. The dummy region 18 may be disposed within the gaps 16g. The first pad patterns 20a described with reference to FIG. 26 may be disposed in each of the gaps 16g. The first through contact structures TC1 arranged as in FIGS. 27 and 28 may be replaced with the first through contact structures TC1a described with reference to FIG. 26.

A modified example of a semiconductor device will now be described, referring to FIG. 30.

Figure 30:
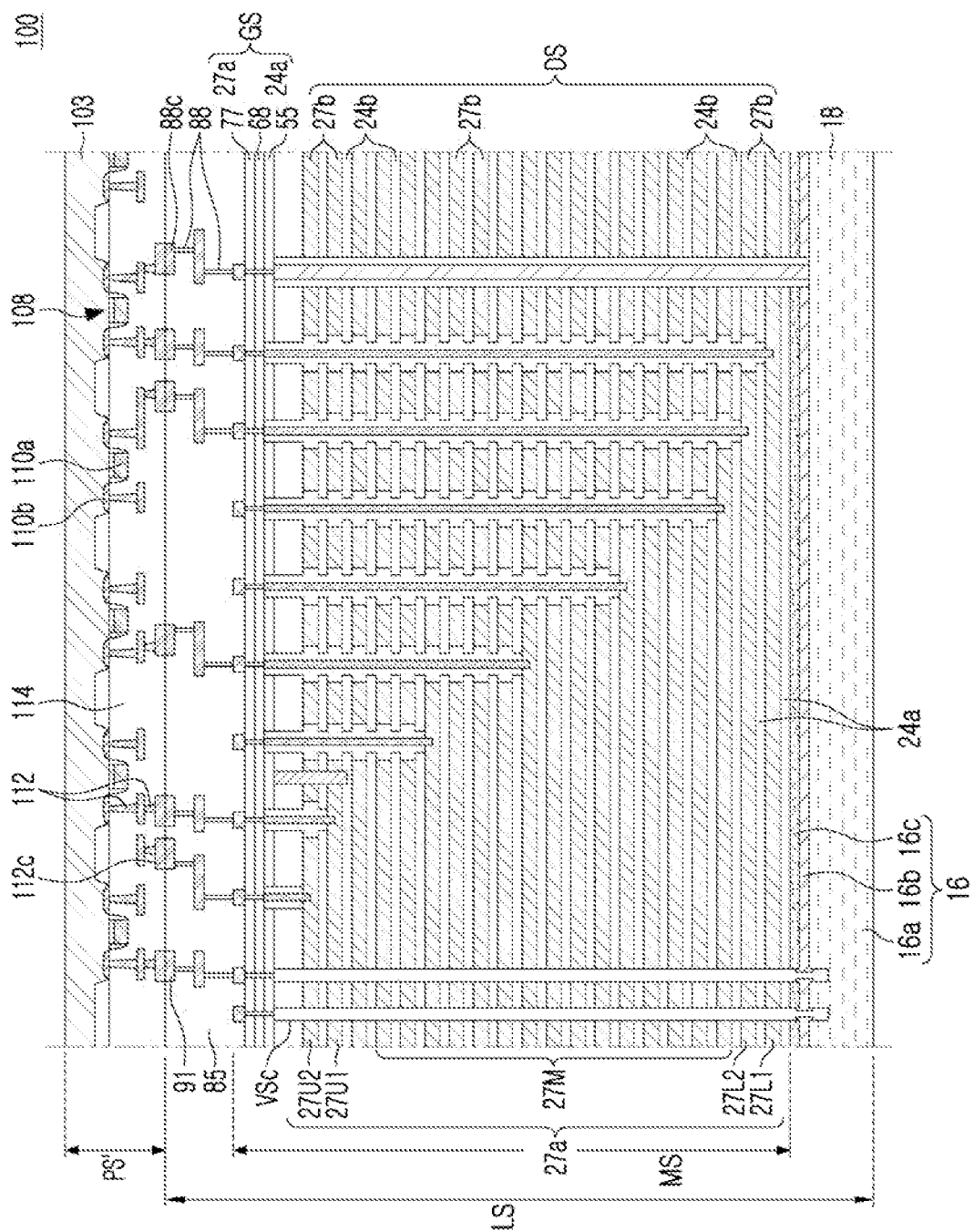
FIG. 30 is a cross-sectional diagram illustrating a modified example of a semiconductor device according to an example embodiment.

Referring to FIG. 30, the semiconductor device 100 according to an example embodiment may include a lower chip LS and an upper chip PS' bonded to the lower chip LS.

The lower chip LS may include substantially the same plate pattern 16 as described above. The upper structure MS may be on the plate pattern 16. The upper structure MS may include the stack structure ST, the vertical memory structures VSc, the gate contact structures GC, the separation structures BSS, the bit lines 80a, and the gate connection wirings 80b, substantially the same as those described above.

The lower chip LS may be disposed on the upper structure MS, and may include the capping insulating structure 85 in contact with the upper chip PS', a wiring structure 88 embedded in the capping insulating structure 85 and electrically connected to the bit lines 80a and the gate connection wirings 80b, and metal bonding pads 88c electrically connected to the wiring structure 88.

The upper chip PS' may include the semiconductor substrate 103, the peripheral circuits 108 on the semiconductor substrate 103, a circuit wiring 112 electrically connected to the peripheral circuits 108 on the peripheral circuits 108, and the insulating structure 114 and bonding pads 112c covering the peripheral circuits 108 and the circuit wiring 112. Each of the peripheral circuits 108 may include a transistor including a peripheral gate 110a and a peripheral source/drain 110b.

The bonding pads 112c of the upper chip PS' may be bonded to the bonding pads 88c of the lower chip LS.

Figure 31A:
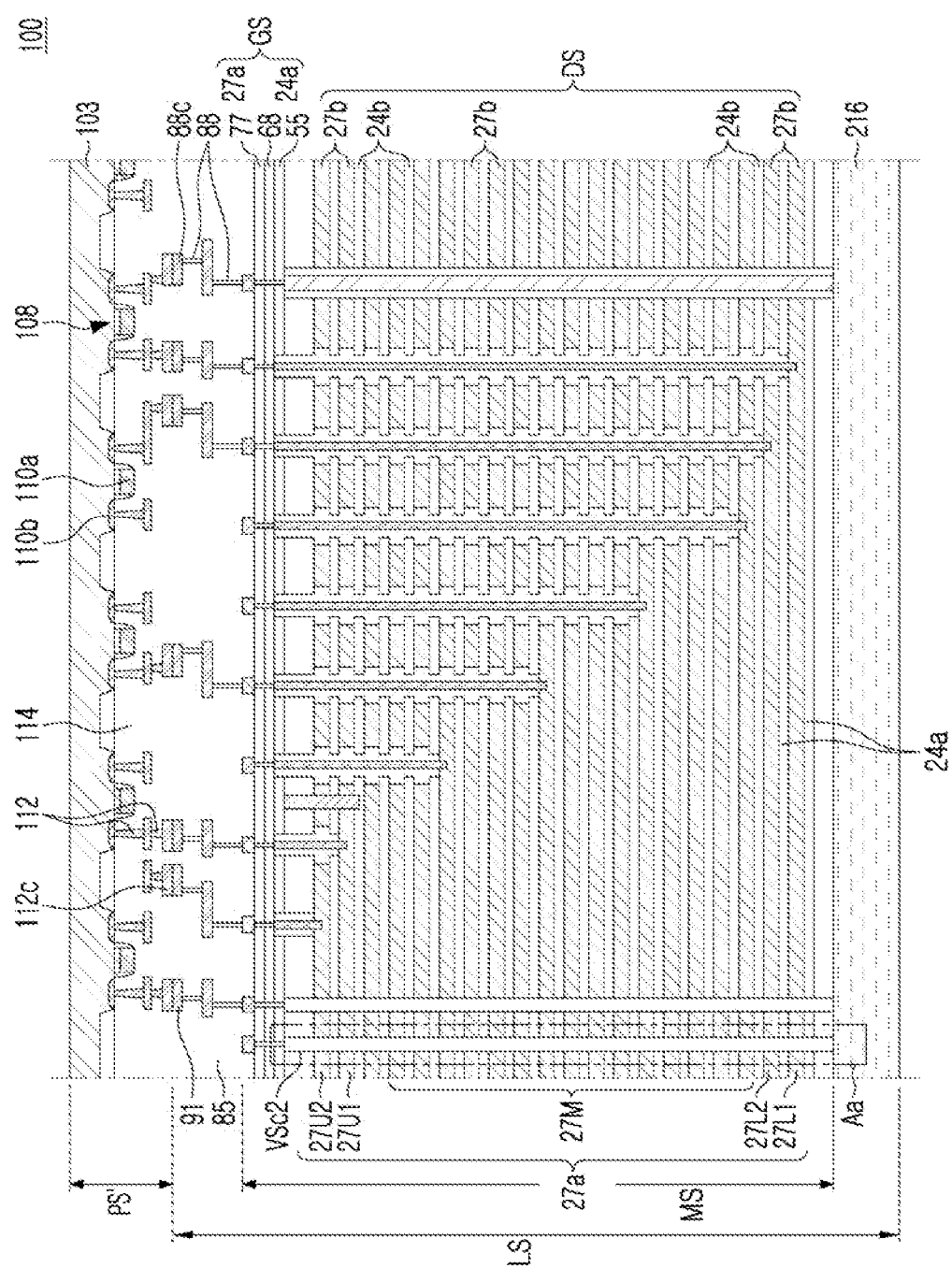
FIGS. 31A and 31B are diagrams illustrating a modified example of a semiconductor device according to an example embodiment.
Figure 31B:
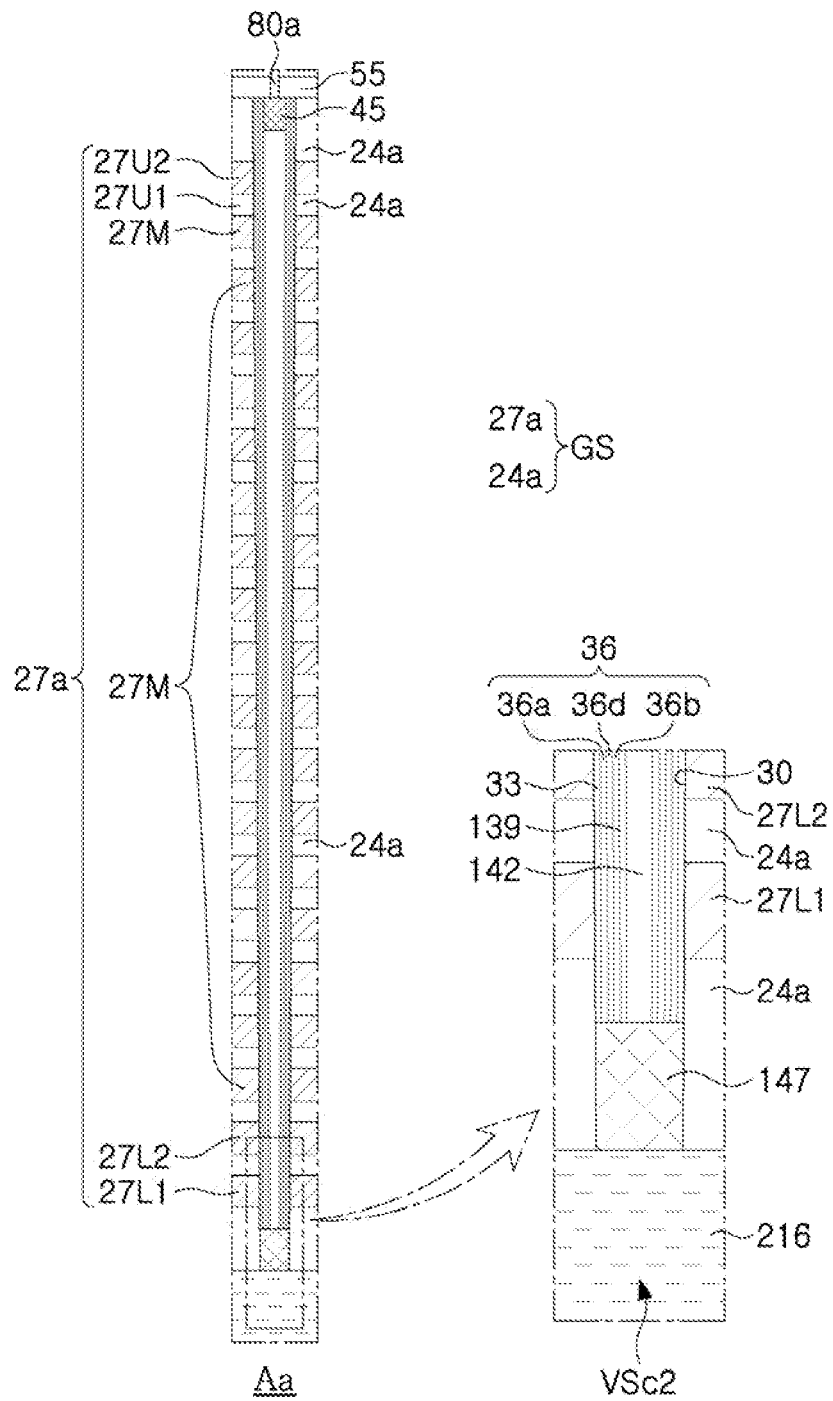

FIGS. 31A and 31B are diagrams illustrating a modified example of a semiconductor device according to an example embodiment.

Referring to FIGS. 31A and 31B, in FIG. 30, the vertical memory structure VSc and the plate pattern 16 may be modified to the vertical memory structures VSc2 and the plate pattern 216 in FIGS. 31A and 31B, respectively. For example, the vertical structure VSc described with reference to FIG. 5A may be replaced with a vertical structure VSc2 having a lower surface in contact with the upper surface of the plate pattern 216. In a portion in contact with the plate pattern 216, the vertical structure VSc2 may include a lower pad pattern 147. The lower pad pattern 147 may be formed as a silicon layer having N-type conductivity, and may be in contact with the channel layer 139 and the insulating core region 142 of the vertical memory structure VSc2.

An example of a method of manufacturing a semiconductor device in an example embodiment will now be described, referring to FIGS. 32 to 36B.

Figure 32:
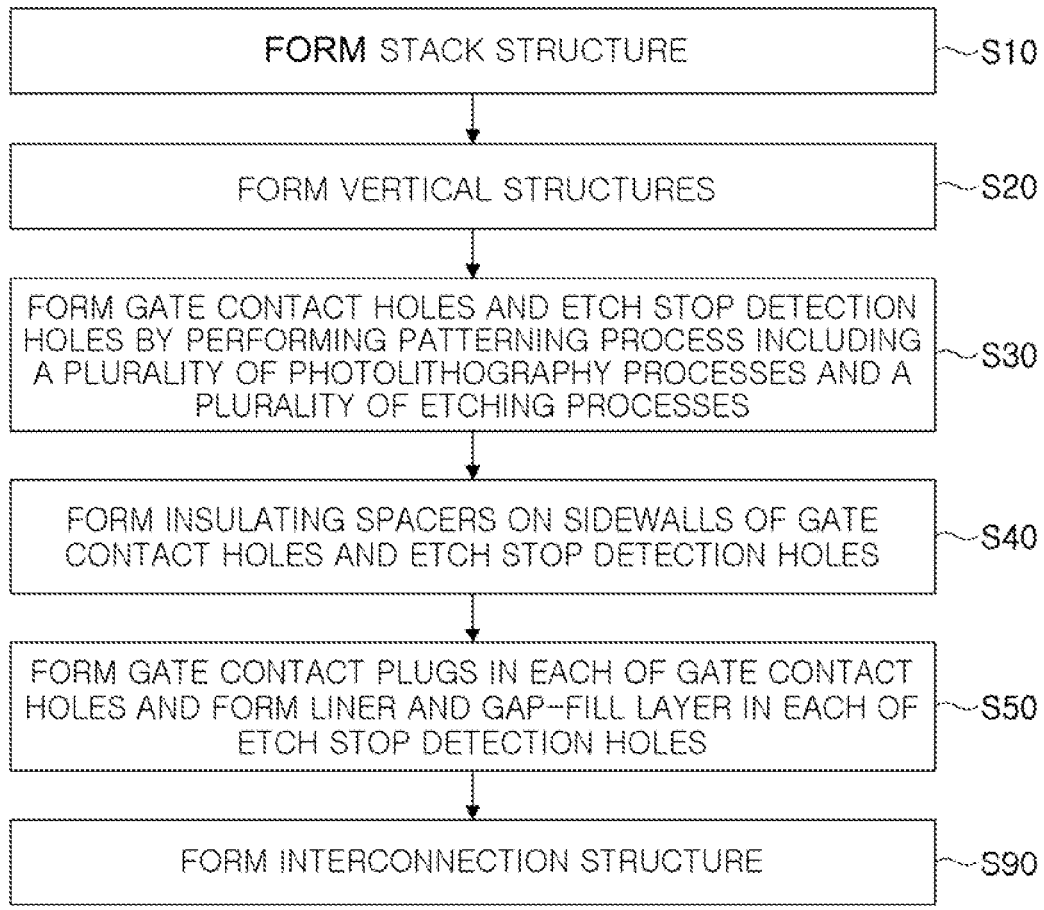
FIGS. 32 to 36B are diagrams illustrating a method of manufacturing a semiconductor device according to an example embodiment.
Figure 33:
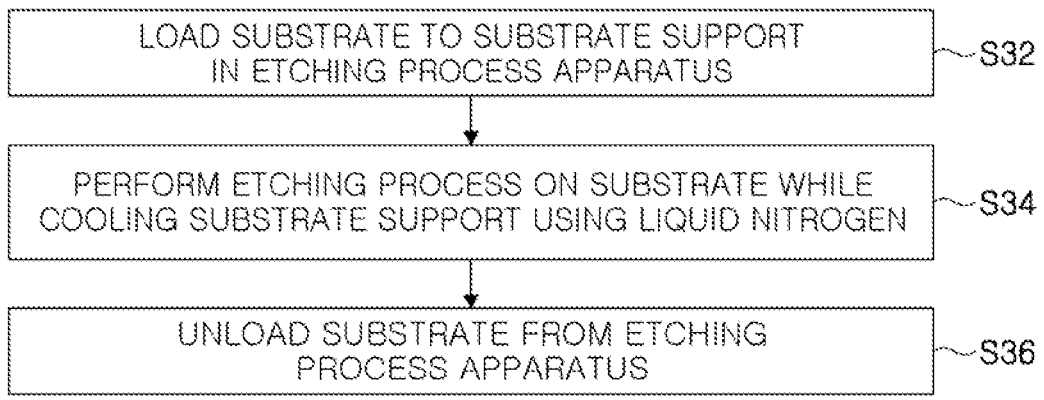
Figure 34A:
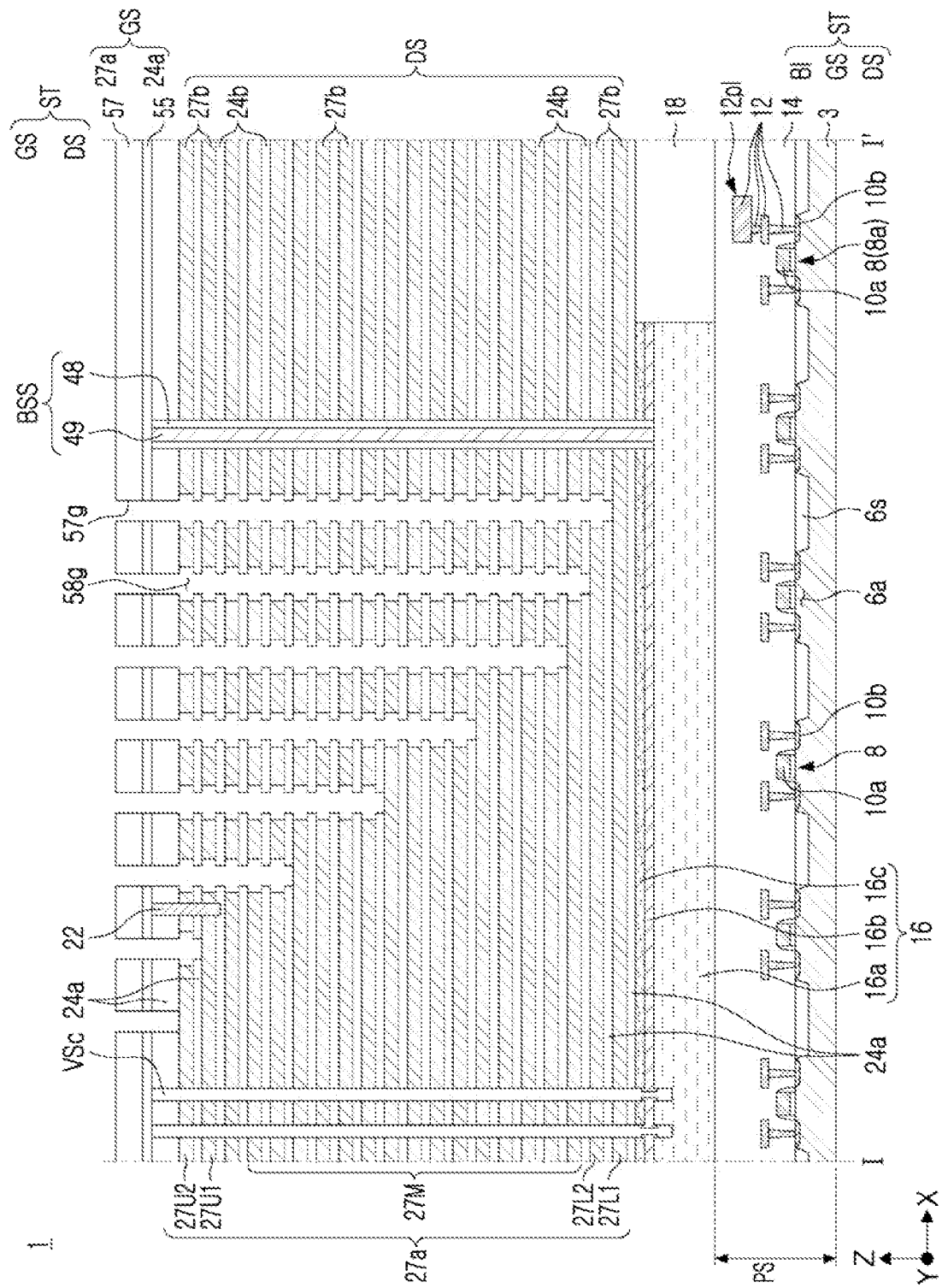
Figure 34B:
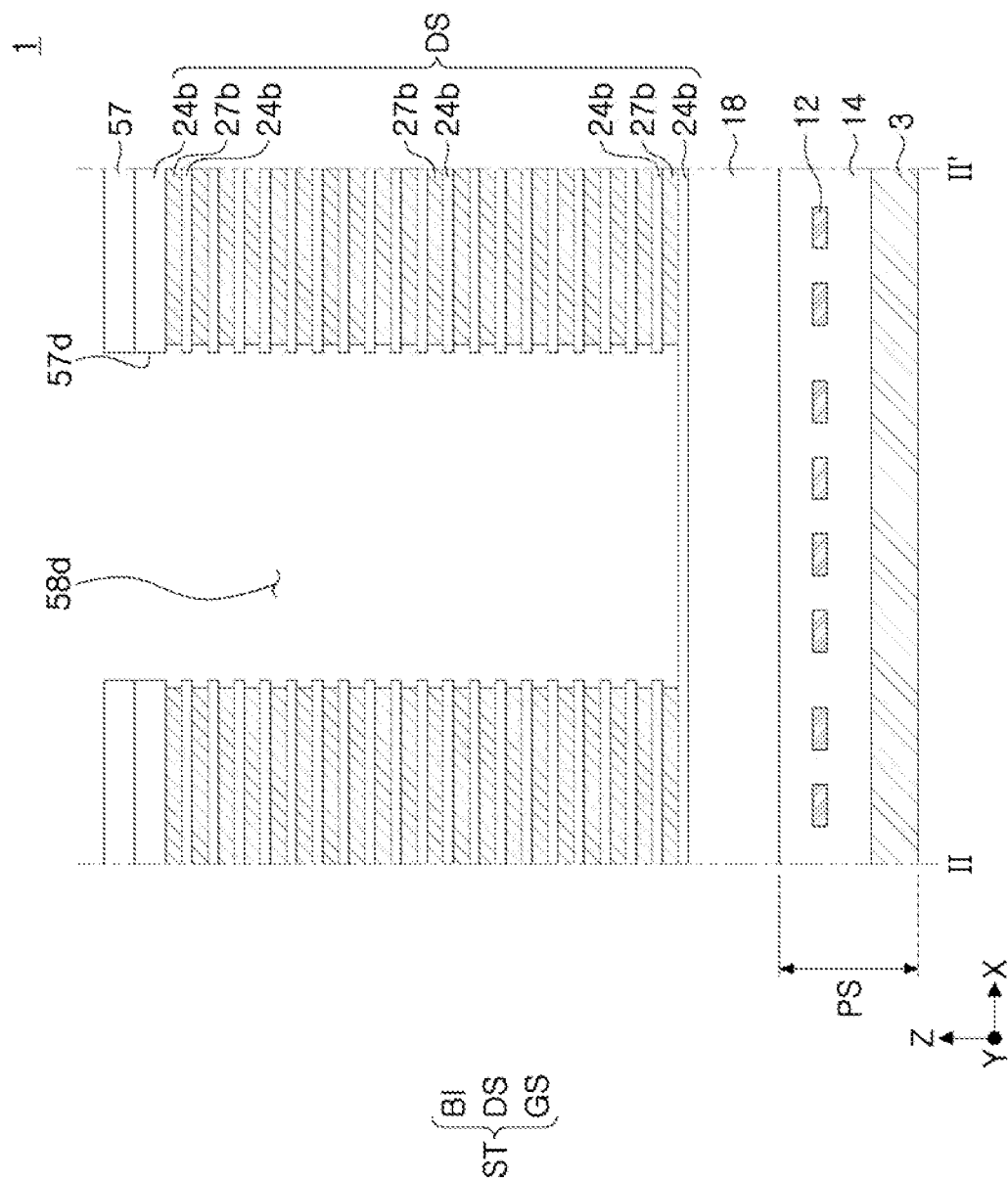
Figure 35A:
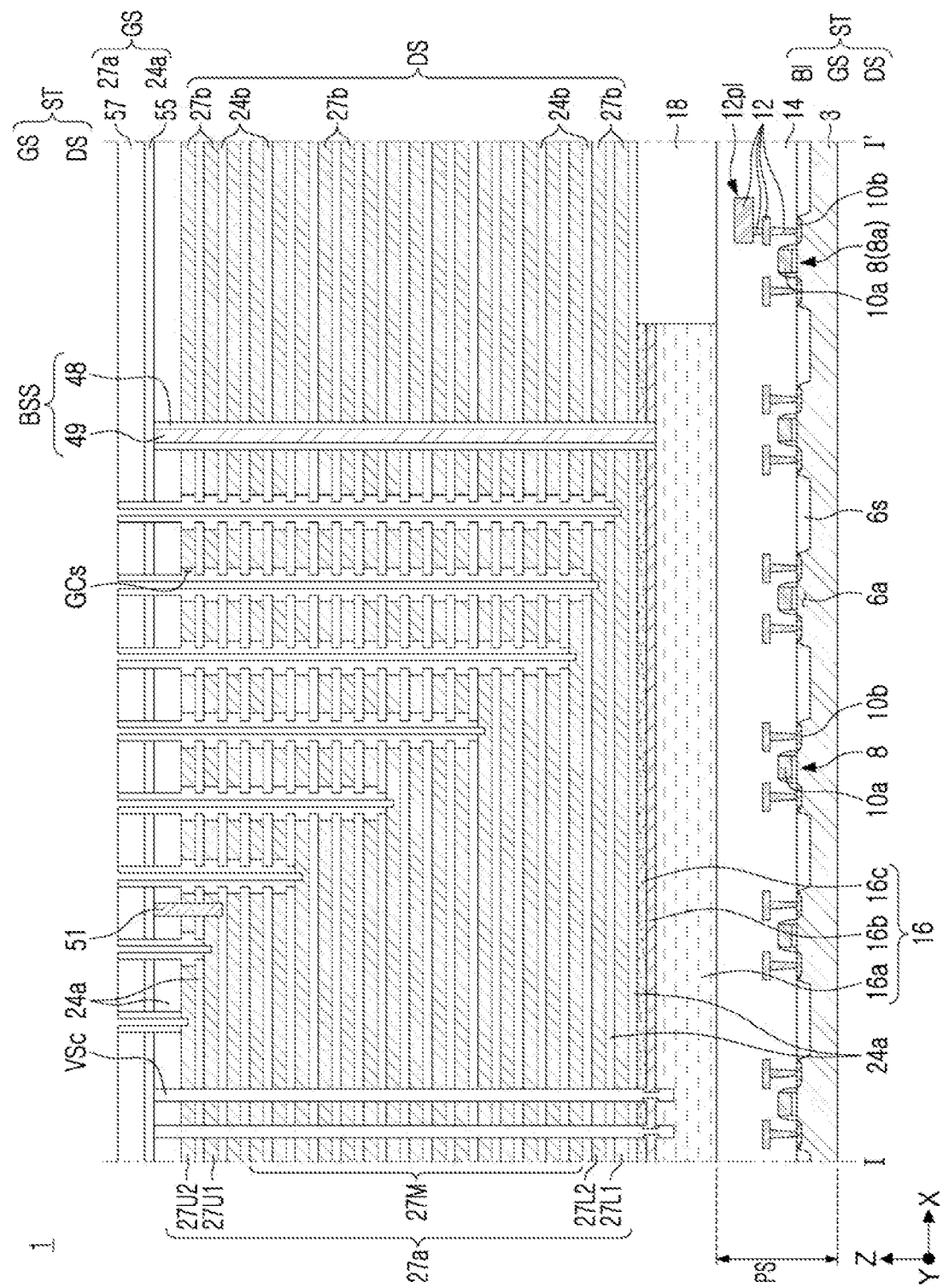
Figure 35B:
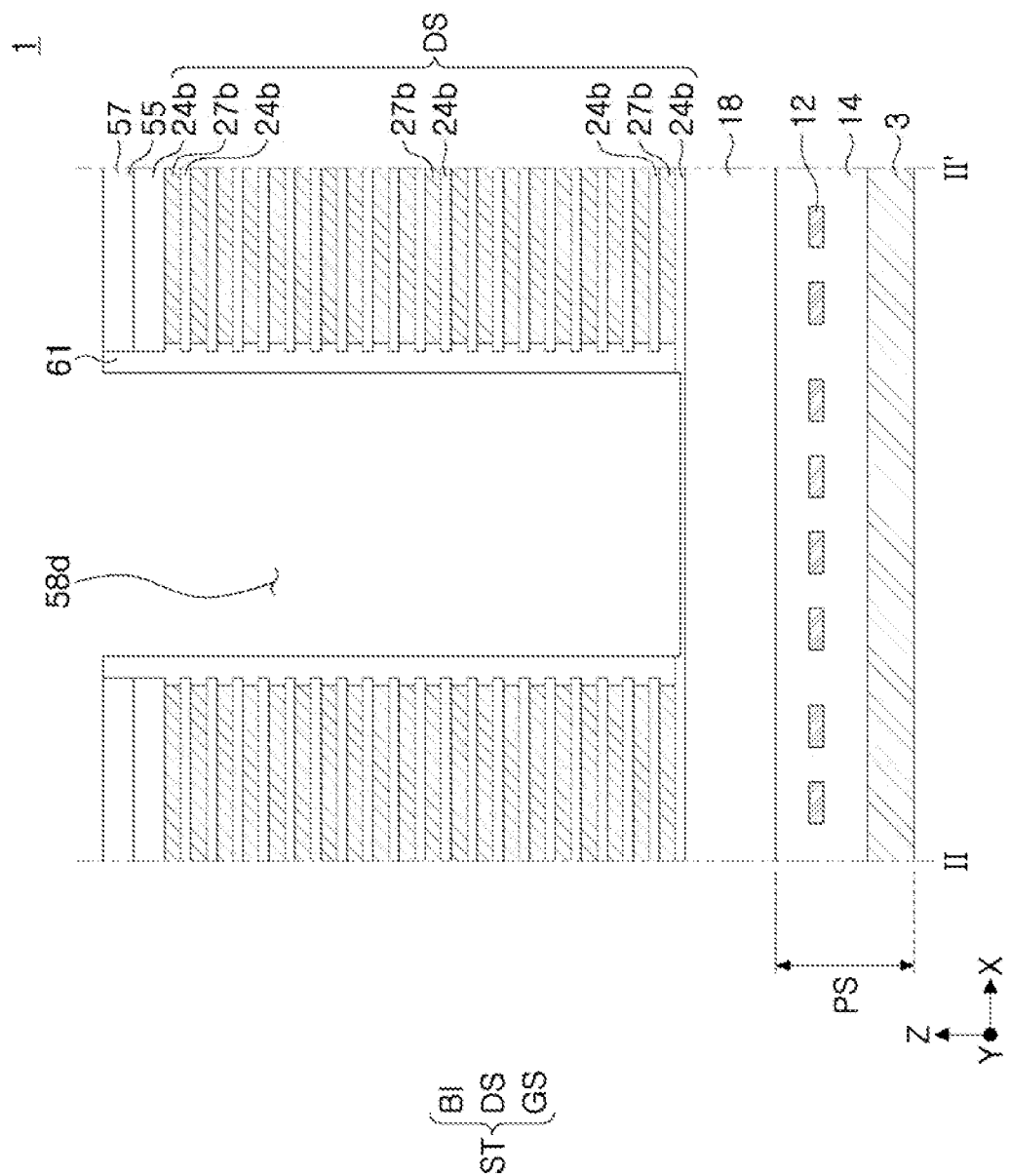
Figure 36A:
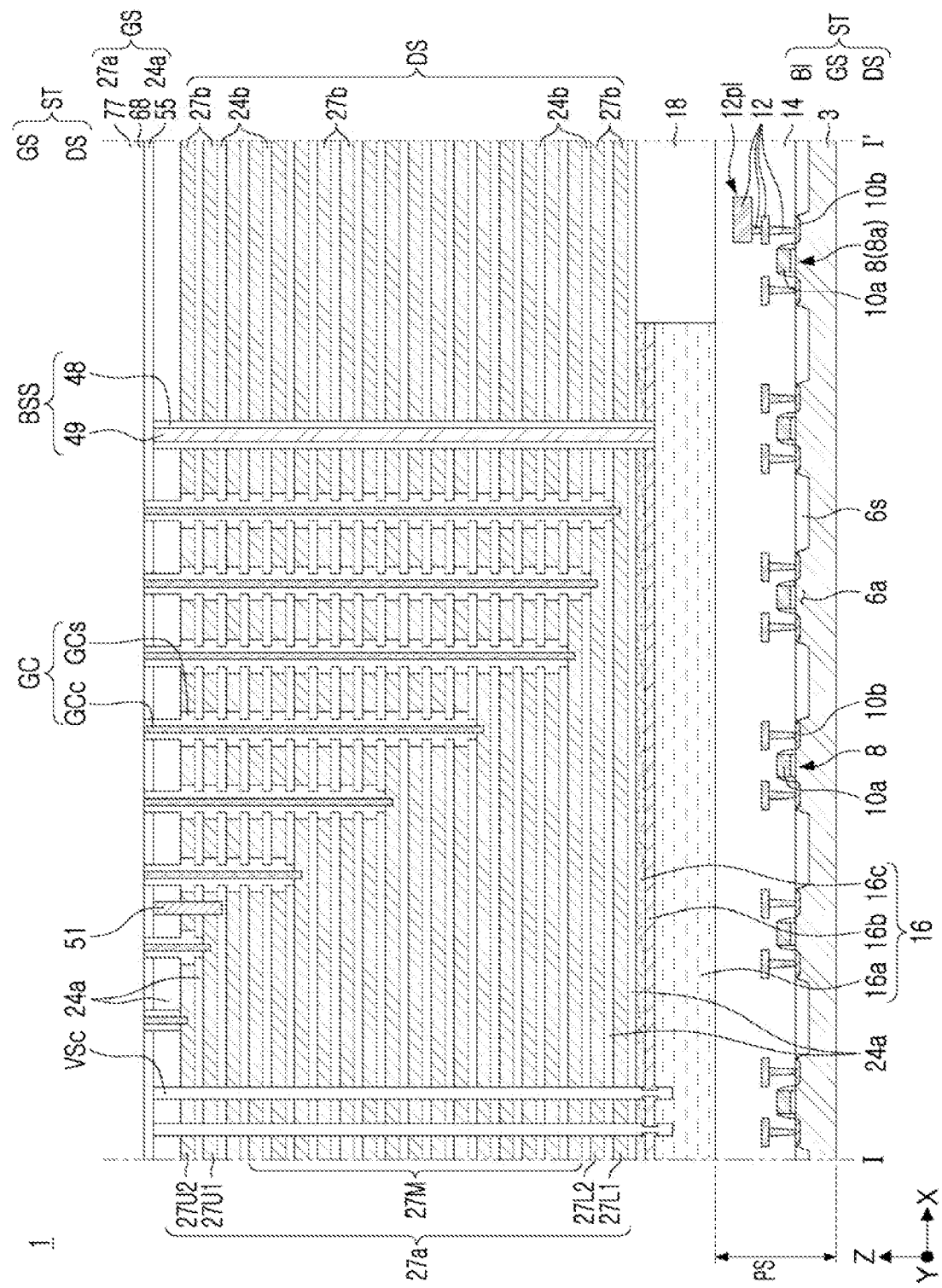
Figure 36B:
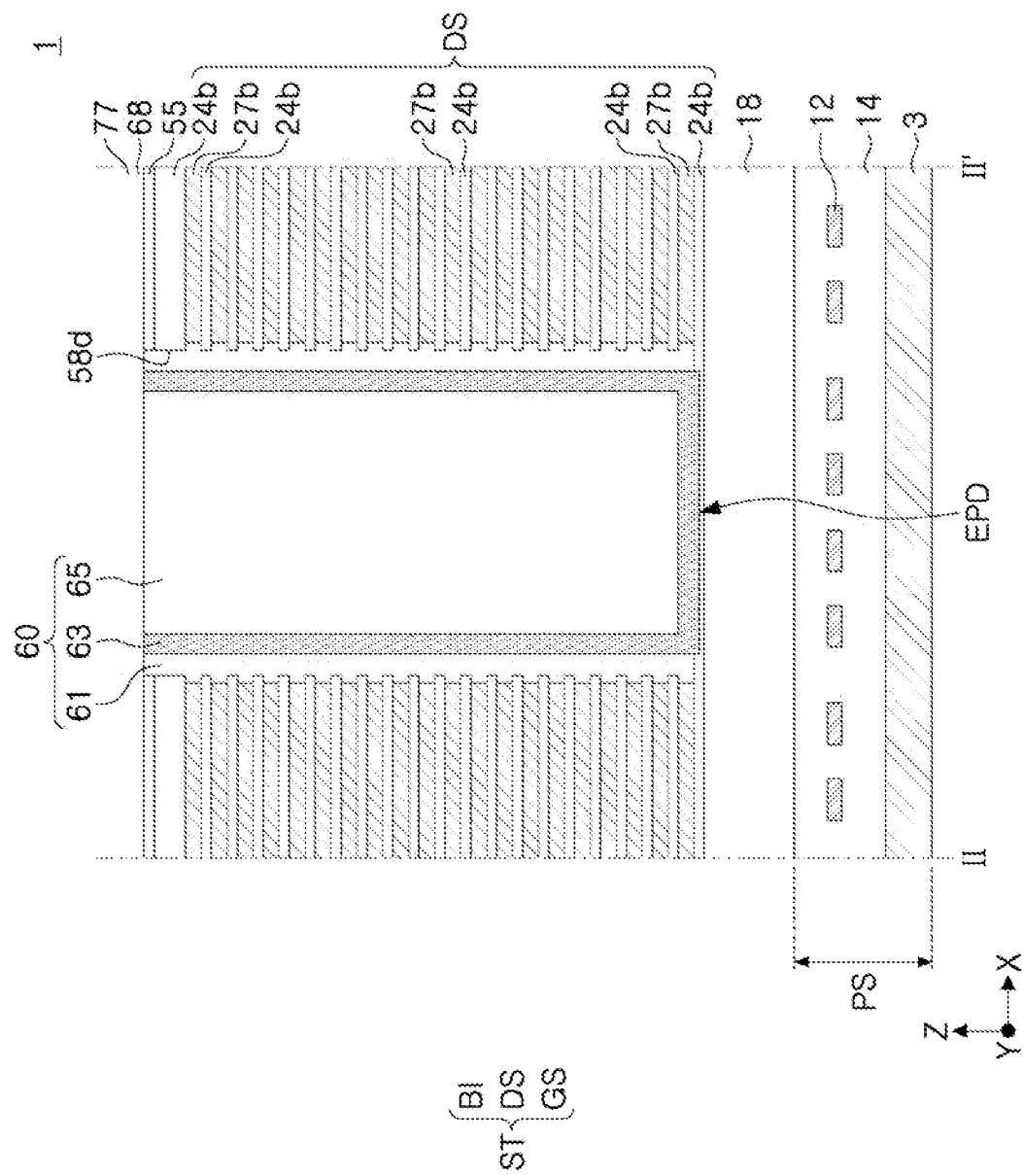

FIG. 32 is a flowchart of an example of a method of manufacturing a semiconductor device according to an example embodiment. FIG. 33 is a flowchart of an etching process for forming holes of a method of manufacturing a semiconductor device according to an example embodiment. FIGS. 34A, 35A, and 36A are cross-sectional diagrams of a method of manufacturing a semiconductor device taken along line I-I' in FIG. 2A. FIGS. 34B, 35B, and 36B are cross-sectional diagrams of a method of manufacturing a semiconductor device, illustrating a region taken along line in FIG. 1.

Referring to FIGS. 1, 2A to 2C, 32, 33, 34A, and 34B, a peripheral circuit structure PS may be formed. Forming the peripheral circuit structure PS may include forming an isolation region 6s defining active regions 6a on the semiconductor substrate 3, forming peripheral circuits 8 on the active regions 6a, forming a circuit wiring 12 electrically connected to the peripheral circuits 8 on the peripheral circuits 8, and forming an insulating structure 14 covering the peripheral circuits 8 and the circuit wiring 12. The peripheral circuits 8 may include a transistor including a peripheral gate 10a and a peripheral source/drain 10b.

A plate pattern 16 and a dummy region 18 on a side surface of the plate pattern 16 may be formed on the peripheral circuit structure PS. The dummy region 18 may include an insulating material layer and/or a dummy pattern of which side surfaces are covered by the insulating material layer.

The plate pattern 16 may include a lower layer 16a, an intermediate layer 16b on the lower layer 16a, and an upper layer 16c on the intermediate layer 16b. The plate pattern 16 may include at least one silicon layer. For example, the lower layer 16a and the upper layer 16c of the plate pattern 16 may be formed of a polysilicon layer having N-type conductivity.

A stack structure ST may be formed (S10). The stack structure ST may include first layers 24a and 24b and second layers 27a and 27b alternately stacked.

Vertical structures VSc, VSd1 and VSd2 (in FIGS. 2A to 2C and 34A and in FIGS. 2A to 2C) may be formed (S20). Forming the vertical structures VSc, VSd1, and VSd2 may include forming holes penetrating through the stack structure ST, and forming the vertical structures VSc, VSd1, and VSd2 in the holes.

The separation structures BSS and DSS (in FIGS. 1, 2A to 2C, and 34A and in FIGS. 2A to 2C) penetrating through the stack structure ST may be formed. The separation structure BSS and DSS (in FIGS. 1, 2A to 2C and 34A and in FIGS. 2A to 2C) may include a block separation structure BSS and an auxiliary separation structure DSS.

A protective insulating layer covering the vertical structures VSc, VSd1, and VSd2 (in FIGS. 2A to 2C), a separation trench penetrating through the stack structure ST and the protective insulating layer, a material of the intermediate layer 16b of the plate pattern 16 exposed by the separation trench may be replaced with polysilicon having N-type conductivity, the separation structure BSS and DSS (in FIGS. 1, 2A-2C and 34A and in FIGS. 2A-2C) filling the separation trench may be formed. Thus, the intermediate layer 16b of the plate pattern 16 may be formed of a polysilicon layer having N-type conductivity.

The stack structure ST may be divided into gate stack regions GS and the dummy stack region DS by the block separation structure BSS. For example, the block separation structure BSS may have a shape of a closed loop surrounding each of the plurality of gate stack regions GS, and the dummy stack region DS may be formed with the block separation structure BSS.

The first layers 24a and 24b of the stack structure ST may be referred to as interlayer insulating layers 24a and 24b. The interlayer insulating layers 24a and 24b may be formed of silicon oxide.

Among the second layers 27a and 27b of the stack structure ST, the second layers 27a disposed in the plurality of gate stack regions GS may be referred to as gate layers 27a, and the dummy stack region DS disposed on the dummy stack region DS may be referred to as dummy horizontal layers 27b. The second layers 27a and 27b may include a conductive material. For example, the second layers 27a and 27b may include at least one of, e.g., doped polysilicon, W, Ru, Mo, Ni, NiSi, Co, CoSi, Ti, TiN, or WN.

The vertical structures VSc, VSd1 and VSd2 (in FIGS. 2A to 2C and 34A and in FIGS. 2A to 2C) may penetrate the gate stack regions GS.

A first upper insulating layer 55 covering the separation structure BSS and DSS (in FIGS. 1, 2A to 2C and 34A and in FIGS. 2A to 2C) and the vertical structures VSc, VSd1 and VSd2 (in FIGS. 2A to 2C) may be formed on the stack structure ST.

Gate contact holes 58g and etch stop detection holes 58d may be formed by performing a patterning process including photolithography processes and etching processes (S30).

Then, the forming the gate contact holes 58g and the etch stop detection holes 58d may include repeatedly performing a single photolithography process and a single etching process as a unit patterning process. For example, the forming the gate contact holes 58g and the etch stop detection holes 58d may include forming a hard mask layer 57 having first openings 57g exposing positions in which the gate contact holes 58g are formed and second openings 57d exposing positions in which the etch stop detection holes 58d are formed, and repeatedly performing the unit patterning process.

While the unit patterning process is repeatedly performed, the second openings 57d may be exposed by the photoresist layer formed by a photolithography process, and a portion of the first openings 57g may be covered by the photoresist layer formed by the photolithography process and the first openings in a region to be etched may be exposed. Thus, in the regions of the stack structure ST exposed by the first openings 57g, the gate contact holes 58g having different depths may be formed by performing the etching process different times, and the regions of the stack structure ST exposed by the second openings 57d may be etch stop detection regions EPD (in FIG. 1) indicating that each of the etching processes has terminated. For example, since each of the first openings 57g may be formed to have a small width and each of the second openings 57d may be formed to have a large width, the entire area of the openings 57g and 56d occupied in the entire region of the semiconductor wafer for forming the semiconductor device may be several percent, e.g., 1 percent to about 10 percent, or may be 20 percent. Thus, by the second openings 57d each having a large width, the termination of each of the etching processes may be accurately indicated. Thus, the etching process may be accurately terminated in a desired position of the stack structure ST.

After the gate contact holes 58g having different depths are formed, the etch stop detection holes 58d may completely penetrate the stack structure ST.

The forming the gate contact holes 58g and the etch stop detection holes 58d may include partially etching the second layers 27a and 27b to expand the width of each of the holes after the holes are formed. Thus, sidewalls of the gate contact holes 58g and the etch stop detection holes 58d may be formed to have a shape in which the interlayer insulating layers 24a and 24b protrude or the second layers 27a and 27b are recessed.

In the process (S30) of forming the gate contact holes 58g and the etch stop detection holes 58d by performing the patterning process including the plurality of photolithography processes and the plurality of etching processes, the performing each of the plurality of etching processes described above may include loading the substrate to a substrate support in the etching process apparatus (S32), performing an etching process on the substrate while cooling the substrate support using liquid nitrogen (S34), and unloading the substrate from the etching process apparatus (S36). The substrate may be formed up to the hard mask layer 57.

Cooling the substrate support using liquid nitrogen may secure linearity of the etching gas used in the etching process, such that the vertical central axis of each of the gate contact holes 58g may be kept straight. Thus, the gate contact holes 58g may be formed uniformly and stably.

In the above-described embodiment, the liquid nitrogen may be replaced with other low-temperature means for lowering a temperature of the substrate loaded to the substrate support.

In the process (S34) of performing an etching process on the substrate while cooling the substrate support using liquid nitrogen, etching process may be precisely terminated in a desired position by the etch stop detection regions EPD (in FIG. 1). Thus, by the etch stop detection regions EPD (in FIG. 1), the gate contact holes 58g having different depths may be reliably and stably formed without process defects.

Referring to FIGS. 1, 2A to 2C, 32, 35A, and 35B, a spacer layer 59 covering internal walls of each of the gate contact holes 58g and the etch stop detection holes 58d. and covering the hard mask layer 57. may be formed.

The spacer layer 59 may include an insulating material, e.g., at least one of silicon oxide, silicon oxynitride, a low-k dielectric, or silicon nitride.

Referring to FIGS. 1, 2A to 2C, 32, 36A, and 36B, insulating spacers GCs and 61 may be formed on sidewalls of the gate contact holes 58g and the etch stop detection holes 58d (S40). The forming the insulating spacers GCs 61 may include anisotropically etching the spacer layer 59 in FIGS. 35A and 35B. The gate layers 27a below the gate contact holes 58g may be exposed while the spacer layer 59 in FIGS. 35A and 35B is anisotropically etched.

In addition to forming a gate contact plug GCc in each of the gate contact holes 58g, a liner 63 and a gap-fill layer 65 may be formed in each of the etch stop detection holes 58d (S50). For example, after the insulating spacers GCs 61 are formed, the liner 63 filling in each of the gate contact holes 58g having a relatively small width and covering internal walls of the etch stop detection holes 58d having a relatively large width may be formed, a gap-fill layer 65 filling the etch stop detection holes 58d may be formed on the liner 63, and a planarization process may be performed until the hard mask layer 57 (in FIGS. 35A and 35B) is formed and the first upper insulating layer 55 is exposed.

The gate contact plug GCc and the liner 63 may be formed of the same conductive material. For example, the gate contact plug GCc and the liner 63 may include at least one of, e.g., Ti, TiN, Ta, TaN, WN, or W. The gap-fill layer 65 may be formed of an insulating material, e.g., silicon oxide, silicon nitride, or a low-k dielectric.

A gate contact structure GC may be formed in each of the gate contact holes 58g, and a dummy structure 60 may be formed in each of the etch stop detection holes 58d.

Each of the gate contact structures GC may include the gate contact plug GCc and the insulating spacer GCs. The dummy structure 60 in the etch stop detection region EPD may include the insulating spacer 61, the liner 63, and the gap-fill layer 65.

Referring back to FIGS. 3 to 6B along with FIGS. 1 and 2A to 2C, a bit line connection region BI may be formed between the plurality of gate stack regions GS defined by the block separation structures BSS. Thus, the stack structure ST may include the bit line connection region BI together with the plurality of gate stack regions GS and the dummy stack region DS. The bit line connection region BI may include interlayer insulating layers 24c and horizontal layers 27c alternately stacked.

The horizontal layers 27c may be formed of the same material as that of the gate layers 27a, and may be formed on substantially the same level as a level of the gate layers 27a.

A second upper insulating layer 68 may be formed on the first upper insulating layer 55, through contact structures TC1 and TC2 extending downwardly by penetrating through the first and second upper insulating layers 55 and 68 and the stack structure ST and electrically connected to the peripheral circuit 8 may be formed, and a third upper insulating layer 77 may be formed.

The through contact structures TC1 and TC2 may include first through contact structures TC1 extending downwardly by penetrating through the through contact region GT disposed in the dummy stack region DS and electrically connected to the first peripheral circuit 8a, and second through contact structures TC2 penetrating through the bit line connection region BI, extending downwardly by penetrating through the bit line connection region BI and electrically connected to the second peripheral circuit 8b.

Each of the first and second through contact structures TC1 and TC2 may include through contact plugs TC1c and TC2c and insulating spacers TC1s and TC2s surrounding side surfaces of the through contact plugs TC1c and TC2c. The through contact plugs TC1c and TC2c may be formed of a conductive material.

The first through contact plugs TC1c of the first through contact structures TC1 may be in contact with and electrically connected to first peripheral pads 12p1 of the circuit wiring 12 electrically connected to the first peripheral circuit 8a. The second through contact plugs TC2c of the second through contact structures TC2 may be in contact with and electrically connected to second peripheral pads 12p2 of the circuit wiring 12 electrically connected to the second peripheral circuit 8b.

An interconnection structure may be formed (S90). For example, a connection wiring structure including a via portion penetrating through at least one of the first to third upper insulating layers 55, 68, or 77, and a linear portion formed on the second upper insulating layer 77, may be formed. The connection wiring structure may include gate connection wirings 80b electrically connecting the gate contact plugs GCc of the gate contact structures GC to the through contact plugs TC1c of the first through contact structures TC1, and bit lines 80a electrically connecting the vertical memory structures VSc to the through contact plugs TC2c of the second through contact structures TC2.

As described above, due to the etch stop detection regions EPD (in FIG. 1), the gate contact holes 58g having different depths may be reliably and stably formed without process defects, and the gate contact structures GC may be formed without a process for forming the gate pads of the gate electrodes 27a in a staircase shape. Thus, productivity of the semiconductor device 1 may improve. Also, since the gate contact structures GC may be formed without forming the gate pads of the gate electrodes 27a in a staircase shape, deformation such as warpage of the semiconductor device 1 may be prevented. Thus, the semiconductor device 1 having improved reliability may be provided.

As described above with reference to FIGS. 32, 33, 34A and 34B, the second layers 27a and 27b may be formed of a conductive material. However, the second layers 27a and 27b (in FIGS. 34A and 34B) may be formed of a sacrificial material having an etch selectivity different from that of the first layers 24a and 24b (in FIGS. 34A and 34B), such as, silicon nitride, instead of a conductive material. An example embodiment in which the second layers 27a and 27b (in FIGS. 34A and 34B) are formed of a sacrificial material will now be described, referring to FIG. 37.

Figure 37:
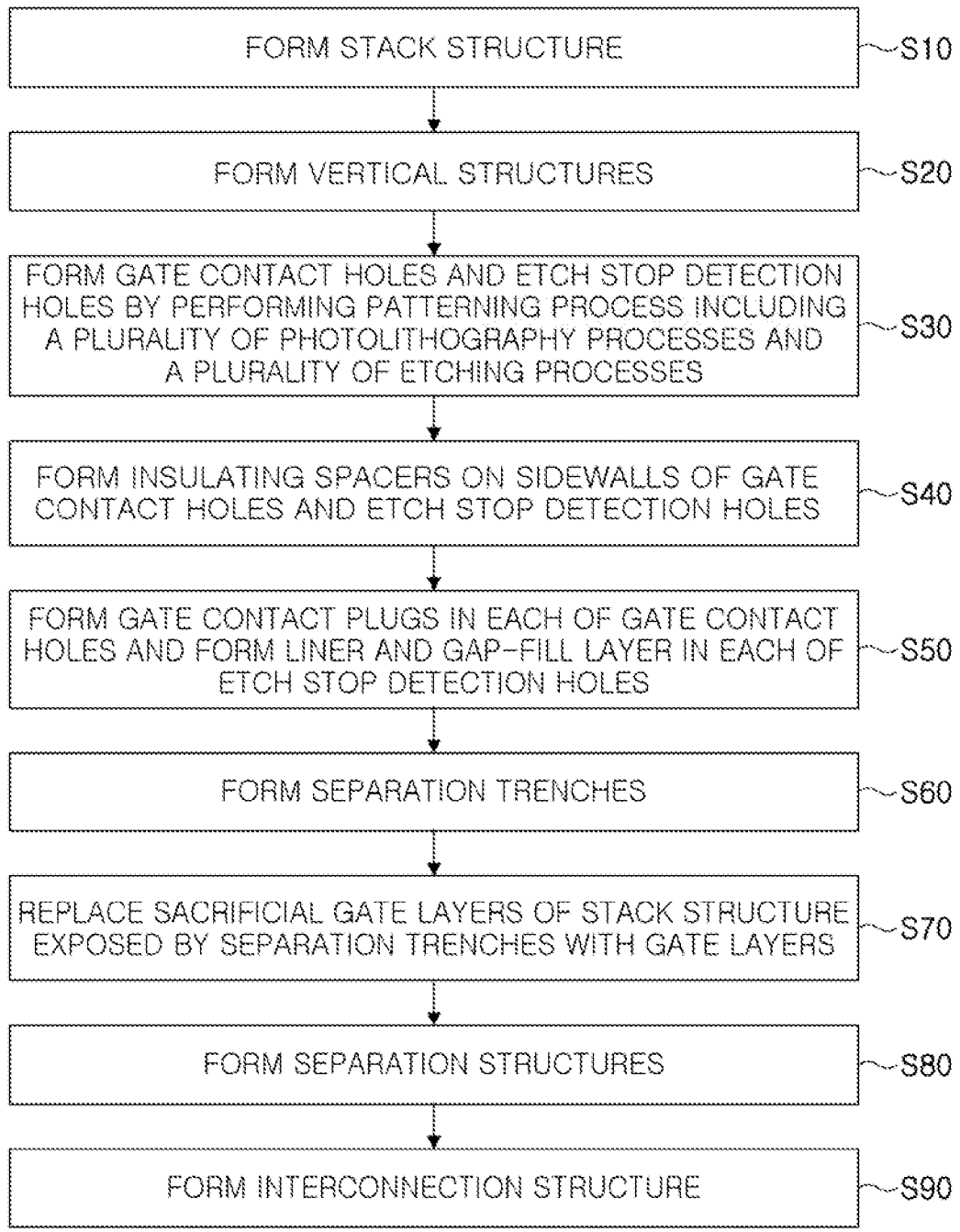
FIG. 37 is a flowchart illustrating another example of a method of manufacturing a semiconductor device according to an example embodiment.

FIG. 37 is a flowchart of another example of a method of manufacturing a semiconductor device according to an example embodiment.

Referring to FIG. 37, in the process (S10) of forming the stack structure ST described with reference to FIG. 32, the second layers 27a and 27b (in FIGS. 34A and 34B) may be formed of a sacrificial material. Subsequently, the patterning process including forming the vertical structures VSc (in FIG. 34A) described with reference to FIG. 32 (S20), forming the gate contact holes 58g (in FIG. 34A) and the etch stop detection holes 58d (in FIG. 34B) by performing the patterning process including the plurality of photolithography processes and the plurality of etching processes (S30), forming the insulating spacers GCs and 61 (in FIG. 35A and in FIG. 35B) on the sidewalls of the gate contact holes 58g (in FIG. 34A) and the etch stop detection holes 58d (in FIG. 34B) (S40), forming a gate contact plug GCc (in FIG. 36A) in each of the gate contact holes 58G (in FIG. 35A) and forming the liner 63 (in FIG. 36B) and a gap-fill layer 65 (in FIG. 36B) in each of the etch stop detection holes 58d (in FIG. 35B) (S50) may be performed.

Separation trenches penetrating through the stack structure ST may be formed (S60).

The sacrificial gate layers of the stack structure exposed by the separation trenches may be replaced with gate layers (S70). An entirety of the sacrificial gate layers in the gate stack regions GS (in FIG. 1) may be replaced with the gate layers, and the sacrificial gate layers in the dummy stack region DS (in FIG. 1) and the bit line connection region BI (in FIG. 1) may be partially replaced. For example, the sacrificial gate layers may be the second layers 27a and 27b (in FIGS. 34a and 34b), and the gate layers in which the sacrificial gate layers are replaced may be the gate electrodes 27a (in FIG. 10), the first portions 27b1 (in FIG. 10) of the first dummy horizontal layers 27b' (in FIG. 10), and the first portions 27c1 (in FIG. 11) of the second dummy horizontal layers 27c' (in FIG. 11), and the remaining sacrificial gate layers may be the second portions 27b2 (in FIGS. 10 and 12) of the first dummy horizontal layers 27b' (in FIG. 10) and the second portions 27c2 (in FIG. 11) of the second dummy horizontal layers 27c' (in FIG. 11).

Thereafter, separation structures BSS' (in FIG. 10) may be formed (S80). An interconnection structure may be formed (S90).

Figure 38:
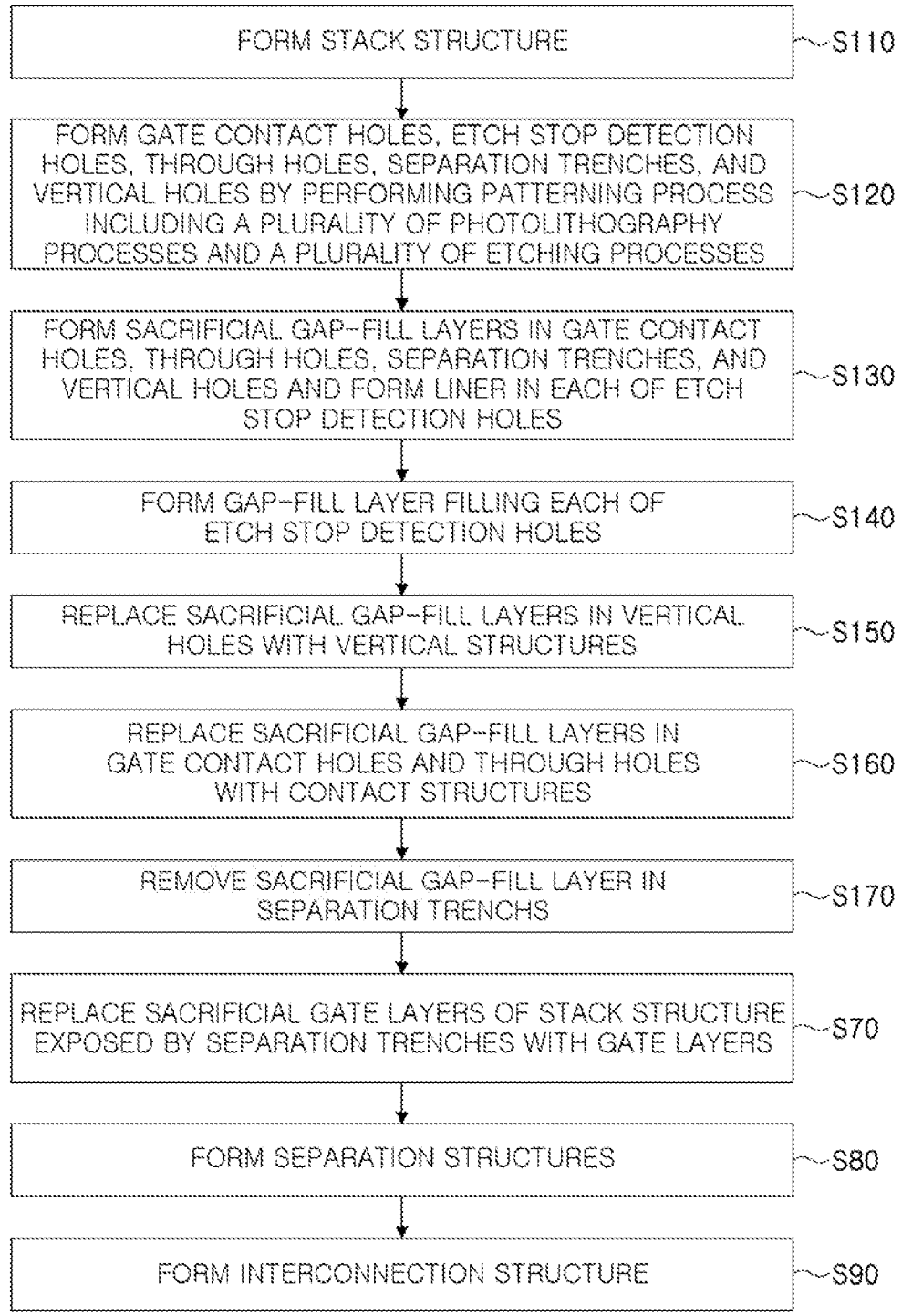
FIG. 38 is a flowchart illustrating another example of a method of manufacturing a semiconductor device according to an example embodiment.

FIG. 38 is a flowchart of an example of a method of manufacturing a semiconductor device according to another example embodiment.

Referring to FIG. 38, the process (S10) of forming the stack structure ST described with reference to FIG. 37 may be performed. Thereafter, gate contact holes, etch stop detection holes, through holes, separation trenches, and vertical holes may be formed by performing a patterning process including photolithography processes and etching processes (S120). The gate contact holes, the etch stop detection holes, the through holes, the separation trench, and the vertical holes may penetrate the stack structure ST.

Sacrificial gap-fill layers may be formed in each of the gate contact holes, the through holes, the separation trench, and the vertical holes. A liner may be formed in each of the etch stop detection holes (S130).

A gap-fill layer filling each of the etch stop detection holes may be formed (S140).

The sacrificial gap-fill layers in the vertical hole may be replaced with vertical structures VSc (in FIG. 21) (S150).

The sacrificial gap-fill layers in the gate contact holes and the through holes may be replaced with contact structures GC and TC1a (in FIG. 21) (S160).

The sacrificial gap-fill layer in the separation trench may be removed (S170).

Subsequently, the process (S70) of replacing the sacrificial gate layers of the stack structure exposed by the separation trenches with the gate layers 27a and 27b1 (in FIG.

21) and the process (S80) of forming the separation structure BSSa' (in FIG. 21) may be performed.

A data storage system including a semiconductor device according to an example embodiment will now be described, referring to FIGS. 39, 40, and 41.

Figure 39:
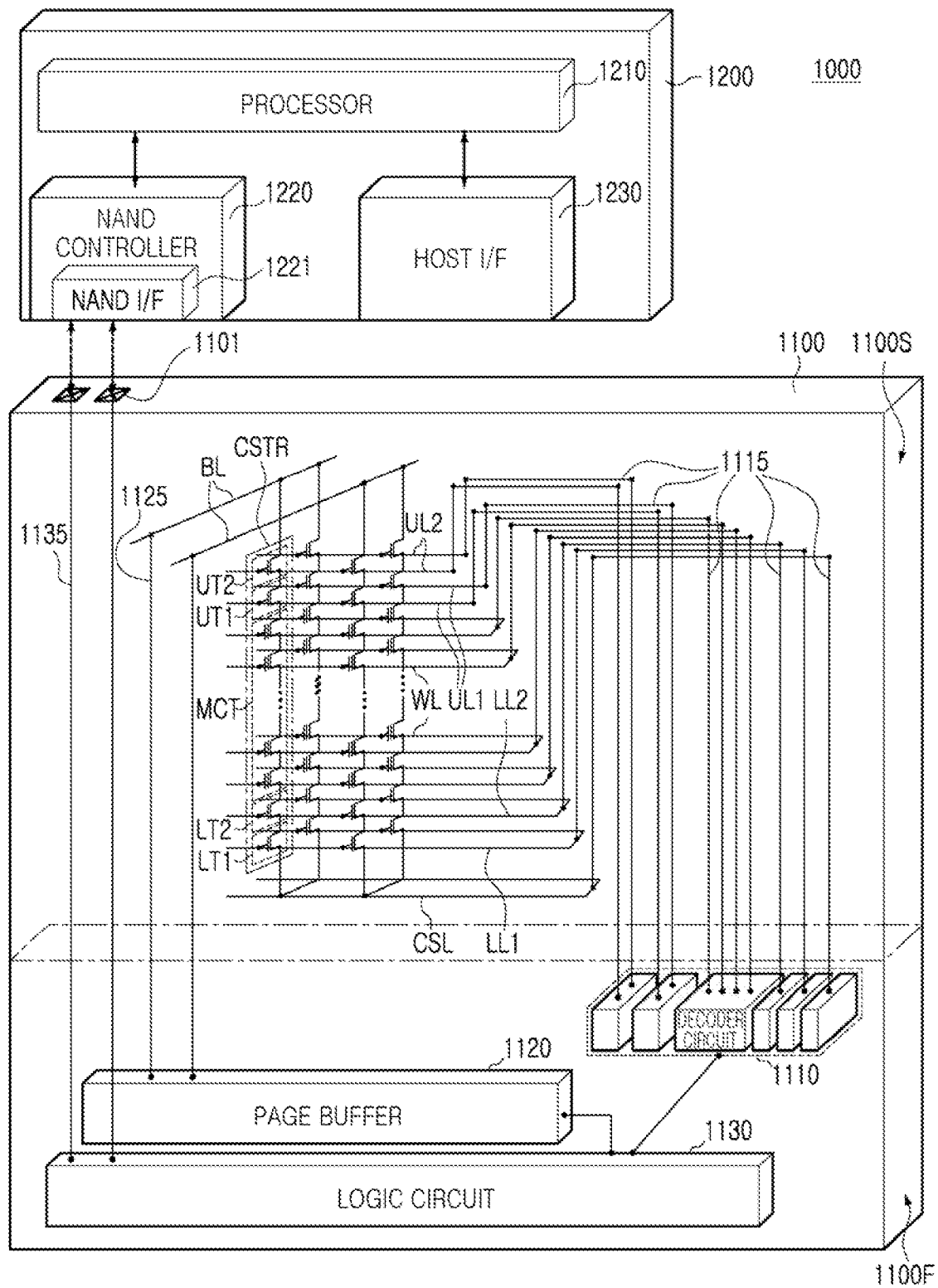
FIG. 39 is a diagram illustrating a data storage system including a semiconductor device according to an example embodiment.

FIG. 39 is a diagram of a data storage system including a semiconductor device according to an example embodiment.

Referring to FIG. 39, a data storage system 1000 according to an example embodiment may include a semiconductor device 1100, and a controller 1200 electrically connected to the semiconductor device 1100 and controlling the semiconductor device 1100. The data storage system 1000 may be implemented as a storage device including the semiconductor device 1100 or an electronic device including a storage device. For example, the data storage system 1000 may be implemented as a solid state drive (SSD) device, a universal serial bus (USB), a computing system, a medical device, or a communication device, including the semiconductor device 1100. The data storage system 1000 may be an electronic system for storing data.

The semiconductor device 1100 may be a semiconductor device according to one of the example embodiments described above with reference to FIGS. 1 to 31B.

The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130. For example, the first structure 1100F may include the peripheral circuit structure PS including the peripheral circuit described above. The peripheral circuit may be a transistor included in a peripheral circuit structure including the decoder circuit 1110, the page buffer 1120, and the logic circuit 1130.

The first peripheral circuit 8a (in FIG. 3) may include the decoder circuit 110, and the second peripheral circuit 8b (in FIG. 6B) described above may include the page buffer 1120.

The second structure 1100S may be a memory structure including a bit line BL, a common source line CSL, word lines WL, first and second gate upper lines UL1 and UL2, first and second gate lower lines LL1 and LL2, and memory cell strings CSTR disposed between the bit line BL and the common source line CSL.

The bit line BL may be the bit lines 80a (in FIGS. 3 and 6B) described above. The plate pattern 16 described above may include the common source line CSL. The first and second gate lower lines LL1 and LL2 may be the first and second lower gate electrodes 27L1 and 27L2 (in FIGS. 3 and 5A) described above. The first and second gate lower lines LL1 and LL2 may be the first and second lower gate electrodes 27L1 and 27L2 (in FIGS. 3 and 5A) described above. The intermediate gate electrodes 27M (FIGS. 3 and 5A) described above may be the word lines WL.

In the second structure 1100S, each of the memory cell strings CSTR may include lower transistors LT1 and LT2 adjacent to common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

The upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT. The gate upper lines UL1 and UL2 may be gate electrodes of the upper transistors UT1 and UT2, respectively.

The gate electrodes 27a described above may be included in the gate lower lines LL1 and LL2, the word lines WL, and the gate upper lines UL1 and UL2.

The lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a gate induce drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 via first connection wirings 1115 extending from the first structure 1100F to the second structure 1100S. The gate connection wirings 80b (in FIG. 3) and the first through contact plugs TC1 (in FIG. 3) described above may be part of the first connection wirings 1115.

The bit lines BL may be electrically connected to the page buffer 1120 via second connection wirings 1125 extending from the first structure 1100F to the second structure 1100S. The second through contact plugs TC2 (in FIG. 6B) may be included in the second connection wirings 1125.

In the first structure 1100F, the decoder circuit 1110 and the page buffer 1120 may execute a control operation on at least one selected memory cell transistor among the plurality of memory cell transistors MCT. The decoder circuit 1110 and the page buffer 1120 may be controlled by a logic circuit 1130.

The semiconductor device 1100 may further include an input/output pad 1101. The semiconductor device 1100 may communicate with the controller 1200 via the input/output pad 1101 electrically connected to the logic circuit 1130. The input/output pad 1101 may be electrically connected to the logic circuit 1130 via an input/output connection wiring 1135 extending from the first structure 1100F to the second structure 1100S. Thus, the controller 1200 may be electrically connected to the semiconductor device 1100 via the input/output pad 1101, and may control the semiconductor device 1100.

The controller 1200 may include a processor 1210, a NAND controller 1220, and a host interface 1230. The data storage system 1000 may include a plurality of the semiconductor devices 1100, and the controller 1200 may control the plurality of semiconductor devices 1100.

The processor 1210 may control overall operations of the data storage system 1000 including the controller 1200. The processor 1210 may operate according to a predetermined firmware, and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command is received from an external host through the host interface 1230, the processor 1210 may control the semiconductor device 1100 in response to the control command.

Figure 40:
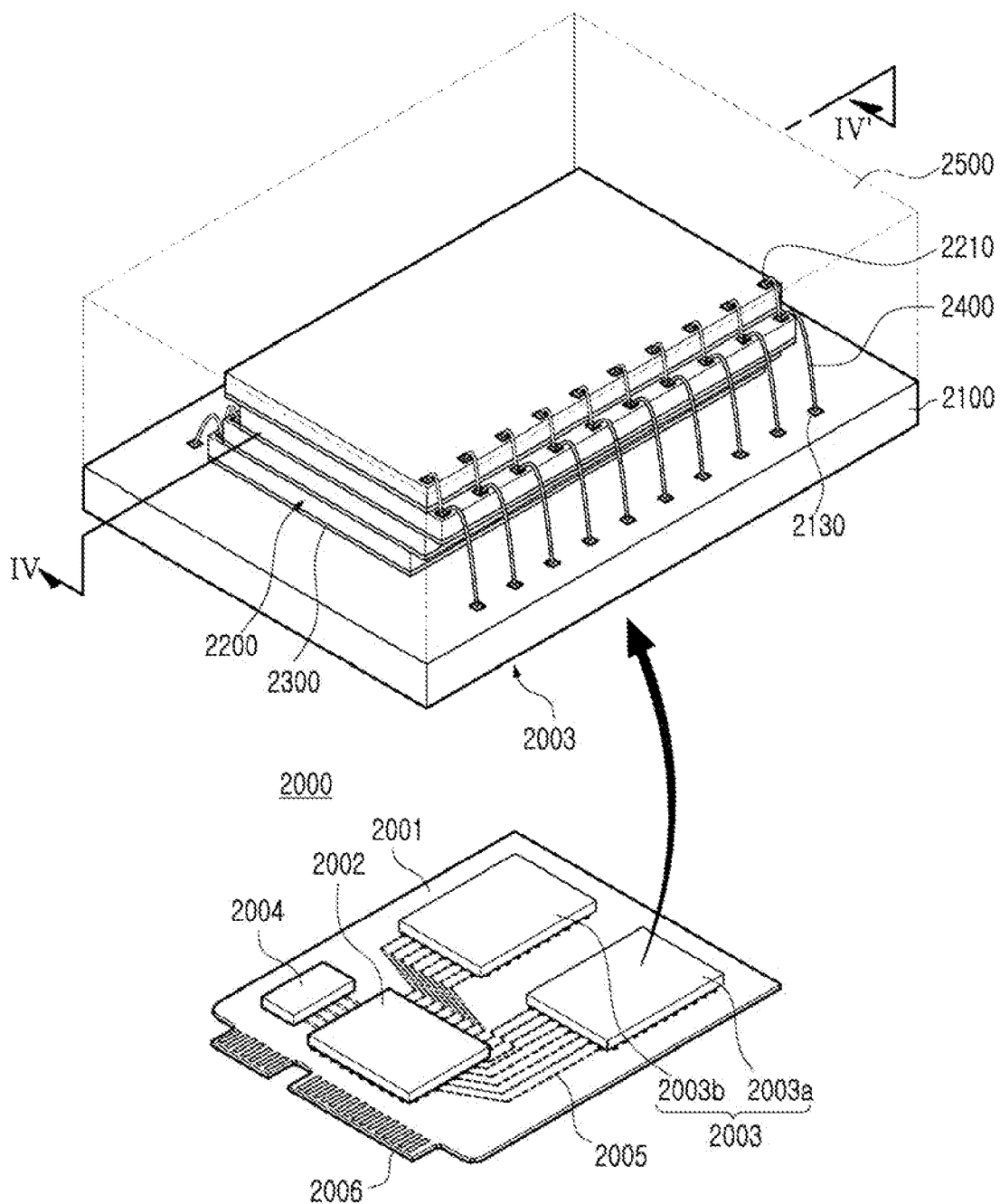
FIG. 40 is a perspective diagram illustrating a data storage system including a semiconductor device according to an example embodiment.

FIG. 40 is a perspective diagram of a data storage system including a semiconductor device according to an example embodiment.

Referring to FIG. 40, a data storage system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including pins coupled to an external host. The number of the pins and arrangement of the pins in the connector 2006 may vary according to a communication interface between the data storage system 2000 and the external host. The data storage system 2000 may communicate with an external host according to interfaces such as an M-Phy for universal serial bus (USB), peripheral component interconnect express (PCI-Express), serial advanced technology attachment (SATA), and universal flash storage (UFS). The data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data in or may read data from the semiconductor package 2003, and may improve an operating speed of the data storage system 2000.

The DRAM 2004 may be a buffer memory for mitigating a difference in speeds between the semiconductor package 2003, which is a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003

The semiconductor package 2003 may include first and second semiconductor packages 2003a and 2003b spaced apart from each other. Each of the first and second semiconductor packages 2003a and 2003b may be a semiconductor package including semiconductor chips 2200. Each of the semiconductor chips 2200 may include the semiconductor device described in one of the aforementioned example embodiments described with reference to FIGS. 1 to 31B.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210.

The connection structure 2400 may be a bonding wire electrically connecting the input/output pad 2210 to the package upper pads 2130. Thus, in each of the first and second semiconductor packages 2003a and 2003b, the semiconductor chips 2200 may be electrically connected to each other by a bonding wire method, and may be electrically connected to the package upper pads 2130 of the package substrate. In each of the first and second semiconductor packages 2003a and 2003b, the semiconductor chips 2200 may be electrically connected to each other by a connection structure including a through silicon via (TSV), instead of the connection structure 2400 of a bonding wire method.

The controller 2002 and the semiconductor chips 2200 may be included in a single package. For example, the controller 2002 and the semiconductor chips 2200 may be mounted on an interposer substrate different from the main board 2001, and the controller 2002 and the semiconductor chips 2200 may be connected to each other by a wiring formed on the interposer substrate.

Figure 41:
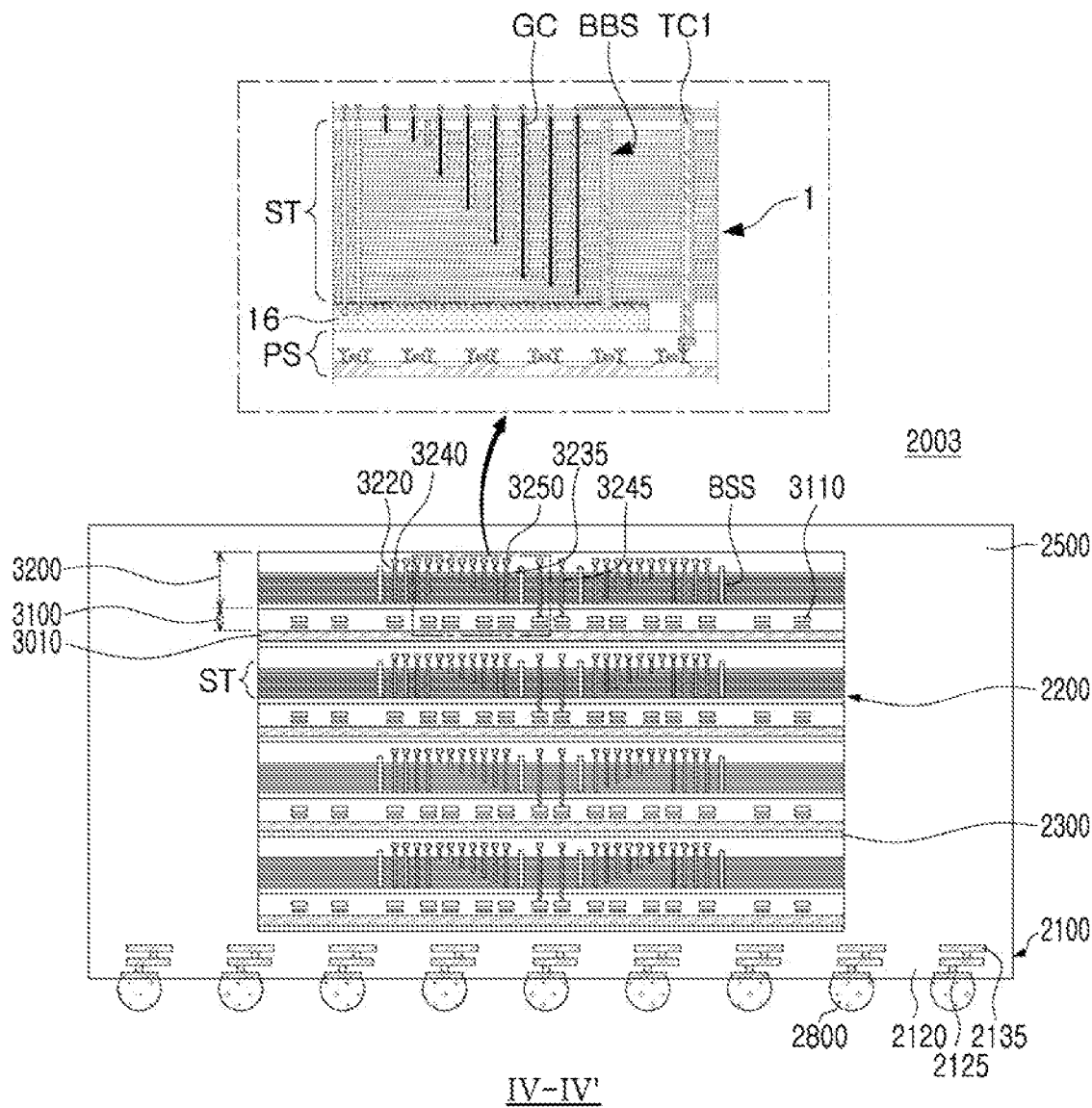
FIG. 41 is a cross-sectional diagram illustrating a semiconductor package according to an example embodiment.

FIG. 41 is a cross-sectional diagram of a semiconductor package according to an example embodiment. FIG. 41 illustrates an example embodiment of the semiconductor package 2003 in FIG. 40, and illustrates the semiconductor package 2003 taken along line IV-IV' in FIG. 40.

Referring to FIG. 41, in the semiconductor package 2003, the package substrate 2100 may be a printed circuit board. The package substrate 2100 may include a package substrate body 2120, package upper pads 2130 disposed on the upper surface of the package substrate body 2120, lower pads 2125 disposed on the lower surface of the package substrate body 2120 and exposed through the lower surface, and internal wirings 2135 electrically connecting the package upper pads 2130 to the lower pads 2125 in the package substrate body 2120. The package upper pads 2130 may be electrically connected to the connection structures 2400. The lower pads 2125 may be connected to the wiring patterns 2005 of the main board 2010 of the data storage system 2000 as illustrated in FIG. 40 through conductive connectors 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral wirings 3110. The second structure 3200 may include a common source line, a stack structure ST on the common source line, vertical memory structures 3220 and separation structures BSS penetrating through the stack structure ST, bit lines 3240 electrically connected to the vertical memory structures 3220, and gate connection wirings electrically connected to the word lines WL of the stack structure ST. The vertical memory structures 3220 may be the vertical memory structures VSc (in FIG. 3) described above. The plate pattern 16 described above may include the common source line. As described above, the separation structures BSS may have a shape of a closed loop. In a single memory mat MAT (in FIG. 1), the separation structures BSS may surround and define the plurality of memory blocks BLK (in FIG. 1).

In each of the semiconductor chips 2200, side surfaces of the stack structure ST may be in contact with the molding layer 2500.

The first structure 3100 may include the first structure 1100F in FIG. 39, and the second structure 3200 may include the second structure 1100S in FIG. 39. For example, in FIG. 41, an enlarged region indicated by reference numeral 1 may represent the cross-sectional structure of the example in FIG. 3. Thus, each of the semiconductor chips 2200 may include the semiconductor device 1 according to one of the example embodiments described above with reference to FIGS. 1 to 31B.

Each of the semiconductor chips 2200 may include a through wiring 3245 electrically connected to the peripheral wirings 3110 of the first structure 3100 and extending into the second structure 3200. The through wiring 3245 may penetrate the stack structure ST. The through wiring 3245 may include the first through contact structure TC1.

Each of the semiconductor chips 2200 may further include an input/output connection wiring 3265 electrically connected to the peripheral wirings 3110 of the first structure 3100 and extending into the second structure 3200, and an input/output pad 2210 electrically connected to the input/output connection wiring 3265.

As described above, embodiments may provide a semiconductor device including a block separation structure having a shape of a closed loop surrounding a memory block, and gate contact plugs electrically connected to gate electrodes of the memory block. Embodiments may provide a semiconductor device having improved integration density, and may provide a data storage system including the semiconductor device.

According to the aforementioned example embodiments, a method of forming gate contact plugs in contact with the gate electrodes without a process of forming additional gate pads of the gate electrodes, and forming a separation structure having a shape of closed loop and surrounding the entire side surface of each memory block, and a semiconductor device formed by the method may be provided. Thus, productivity of the semiconductor device may improve and integration density of the semiconductor device may increase, and a semiconductor device having improved reliability may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Thus, it will be understood by those of skill in the art that various changes in form and details may be made without departing from the spirit and scope of the present invention as set forth in the following claims.

What is claimed is:

1. A semiconductor device, comprising:
    a stack structure including a gate stack region and a dummy stack region, the gate stack region including interlayer insulating layers and gate electrodes alternately stacked, and the dummy stack region including dummy insulating layers and dummy horizontal layers alternately stacked;
    a separation structure penetrating through the stack structure, surrounding an entire external side surface of the gate stack region, and having a shape of a closed loop;
    a vertical memory structure penetrating through the gate stack region in a first region; and
    gate contact structures electrically connected to the gate electrodes in a second region adjacent to the first region, wherein:
    the gate electrodes include a first gate electrode and a second gate electrode disposed at a level higher than a level of the first gate electrode,
    each of the gate contact structures includes a gate contact plug and a first insulating spacer surrounding a side surface of the gate contact plug,
    the gate contact plugs include a first gate contact plug and a second gate contact plug,
    the first gate contact plug penetrates through the second gate electrode, and contacts the first gate electrode, and
    the second gate contact plug is at a higher level than the first gate electrode, and contacts the second gate electrode.

2. The semiconductor device of claim 1, further comprising a dummy structure, including:
    a hole penetrating through at least a portion of the dummy stack region;
    a liner covering a sidewall and a bottom of the hole;
    a second insulating spacer between the liner and the sidewall of the hole; and
    a gap-fill layer filling the hole, and disposed on the liner,
    wherein a width of the dummy structure is greater than a width of each of the gate contact structures.

3. The semiconductor device of claim 2, wherein the liner includes a same material as a material of the gate contact plugs.

4. The semiconductor device of claim 1, further comprising etch stop detection regions, wherein:
    the etch stop detection regions include dummy structures penetrating through the dummy stack region,
    each of the dummy structures includes:
        an etch stop detection hole penetrating through the dummy stack region;
        a liner covering a sidewall and a bottom of the etch stop detection hole; and
        a gap-fill layer filling the etch stop detection hole, and disposed on the liner, and
    at least one of the etch stop detection regions has a maximum width greater than a width of a first word line among the gate electrodes.

5. The semiconductor device of claim 1, wherein an entire external side surface of the first gate electrode and an entire external side surface of the second gate electrode are in contact with the separation structure.

6. The semiconductor device of claim 1, wherein:
    the gate electrodes include lower select gate electrodes disposed on the same plane, word lines vertically stacked and spaced apart from each other on the lower select gate electrodes, and upper select gate electrodes disposed on the same plane on the word lines,
    the word lines include the first and second gate electrodes,
    each of the word lines extends in a first direction perpendicular to a vertical direction,
    the lower select gate electrodes are spaced apart from each other in a second direction perpendicular to the first direction, and
    the upper select gate electrodes are spaced apart from each other in the second direction.

7. The semiconductor device of claim 6, wherein a total number of the upper select gate electrodes is greater than a total number of the lower select gate electrodes.

8. The semiconductor device of claim 6, wherein the gate electrodes further include a lower erase control gate electrode disposed below the lower select gate electrodes, and upper erase control gate electrodes on the upper select gate electrodes.

9. The semiconductor device of claim 1, further comprising:
a peripheral circuit structure; and
a plate pattern on the peripheral circuit structure, wherein:
the peripheral circuit structure includes:
a semiconductor substrate;
peripheral circuits and a peripheral circuit wiring on the semiconductor substrate; and
a lower insulating structure covering the peripheral circuits and the peripheral circuit wiring, and disposed on the semiconductor substrate,
the plate pattern includes at least one silicon layer, and
the gate stack region is disposed on the plate pattern.

10. The semiconductor device of claim 9, further comprising:
through contact structures penetrating through the dummy stack region, and disposed on an external side of the separation structure; and
gate connection wirings electrically connecting the through contact structures to the gate contact structures, and disposed on a level higher than a level of the stack structure.

11. The semiconductor device of claim 9, further comprising:
through contact structures surrounded by the separation structure and penetrating through the gate stack region; and
gate connection wirings electrically connecting the through contact structures to the gate contact structures, and disposed on a level higher than a level of the stack structure,
wherein each of the through contact structures includes a through contact plug and a second insulating spacer on a side surface of the through contact plug.

12. The semiconductor device of claim 1, wherein:
the first gate contact plug includes a first portion and a second portion disposed on the first portion, and
a central axis between both side surfaces of the first portion is misaligned with a central axis between both side surfaces of the second portion.

13. The semiconductor device of claim 1, further comprising:
a plate pattern; and
a peripheral circuit structure, wherein:
the peripheral circuit structure includes:
a semiconductor substrate;
peripheral circuits and peripheral circuit wiring disposed below the semiconductor substrate; and
an insulating structure covering the peripheral circuits and the peripheral circuit wiring, and below the semiconductor substrate, and
the stack structure is disposed between the plate pattern and the peripheral circuit structure.

14. The semiconductor device of claim 1, wherein:
the stack structure includes a lower stack structure and an upper stack structure disposed on the lower stack structure,
the lower stack structure includes lower interlayer insulating layers and lower gate electrodes alternately stacked,
the upper stack structure includes upper interlayer insulating layers and upper gate electrodes alternately stacked, and
the vertical memory structure includes a slope changing portion in which a slope of a side surface changes between an uppermost electrode among the lower gate electrodes and a lowermost electrode among the upper gate electrodes.

15. A semiconductor device, comprising:
memory mats, each of the memory mats including memory blocks;
a dummy stack region surrounding the memory mats; and
a block separation structure having a shape of a closed loop surrounding a side surface of each of the memory blocks, wherein:
each of the memory blocks has a memory cell array region and a gate connection region disposed on at least one side of the memory cell array region,
each of the memory blocks includes a gate stack region including gate electrodes stacked and spaced apart from each other in a vertical direction, vertical memory structures penetrating through the gate stack region in the memory cell array region, and gate contact structures in contact with the gate electrodes in the gate connection region,
the gate electrodes include a first word line and a second word line disposed at a level higher than a level of the first word line,
each of the gate contact structures includes a gate contact plug and a first insulating spacer surrounding a side surface of the gate contact plug,
the gate contact plugs include a first gate contact plug and a second gate contact plug,
the first gate contact plug penetrates through the second word line, and contacts the first word line, and
the second gate contact plug is at a higher level than the first word line, and contacts the second word line.

16. The semiconductor device of claim 15, further comprising dummy structures, each of the dummy structures including:
a hole penetrating through at least a portion of the dummy stack region;
a liner covering a sidewall and a bottom of the hole;
a second insulating spacer between the liner and the sidewall of the hole; and
a gap-fill layer filling the hole, and disposed on the liner,
wherein a width of at least one of the dummy structures is greater than a width of each of the gate contact structures.

17. The semiconductor device of claim 15, further comprising:
a peripheral circuit structure;
plate patterns;
bit lines;
gate connection wirings;
first through contact structures; and
second through contact structures, wherein:
the peripheral circuit structure includes:
a semiconductor substrate; and
a first peripheral circuit and a second peripheral circuit on the semiconductor substrate,
each of the memory mats further includes a bit line connection region disposed between the memory blocks,
the memory mats are disposed on the plate patterns, respectively,
the first through contact structures are electrically connected to the first peripheral circuit,
the second through contact structures are electrically connected to the second peripheral circuit, and penetrate through the bit line connection region, the gate connection wirings are electrically connected to the gate contact plugs and the first through contact structures, and are disposed on each of the memory mats, and the bit lines are electrically connected to the vertical memory structures, extend to cross the bit line connection region, are electrically connected to the second through contact structures, and are disposed on each of the memory mats.

18. The semiconductor device of claim 15, wherein:

the dummy stack region includes horizontal layers disposed on substantially the same level as a level of the gate electrodes, entire external side surfaces of the first and second word lines are in contact with the block separation structure, and each of the horizontal layers has a side surface in contact with the block separation structure.

19. A data storage system, comprising:

a semiconductor device including an input/output pattern; and a controller electrically connected to the semiconductor device through the input/output pattern, and configured to control the semiconductor device, wherein:

the semiconductor device includes:
  memory mats, each of the memory mats including memory blocks;
  a dummy stack region surrounding the memory mats; and
  a block separation structure having a shape of a closed loop surrounding a side surface of each of the memory blocks, each of the memory blocks has a memory cell array region and a gate connection region disposed on at least one side of the memory cell array region, each of the memory blocks includes a gate stack region including gate electrodes stacked and spaced apart from each other in a vertical direction, vertical memory structures penetrating through the gate stack region in the memory cell array region, and gate contact structures in contact with the gate electrodes in the gate connection region, the gate electrodes include a first word line and a second word line disposed at a level higher than a level of the first word line, each of the gate contact structures includes a gate contact plug and a first insulating spacer surrounding a side surface of the gate contact plug, the gate contact plugs include a first gate contact plug and a second gate contact plug, the first gate contact plug penetrates through the second word line, and contacts the first word line, and the second gate contact plug is at a higher level than the first word line, and contacts the second word line.

20. The data storage system of claim 19, further comprising etch stop detection regions, wherein:

the etch stop detection regions include dummy structures penetrating through the dummy stack region, each of the dummy structures includes:
  an etch stop detection hole penetrating through the dummy stack region;
  a liner covering a sidewall and a bottom of the etch stop detection hole; and
  a gap-fill layer filling the etch stop detection hole, and disposed on the liner, and at least one of the etch stop detection regions has a maximum width greater than a width of the first word line.

* * * * *